United States Patent
Fujimoto et al.

(10) Patent No.: US 6,613,620 B2
(45) Date of Patent: Sep. 2, 2003

(54) SEMICONDUCTOR DEVICE AND METHOD OF MANUFACTURING THE SAME

(75) Inventors: Etsuko Fujimoto, Kanagawa (JP); Satoshi Murakami, Kanagawa (JP); Shunpei Yamazaki, Tokyo (JP); Shingo Eguchi, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 09/916,329

(22) Filed: Jul. 30, 2001

(65) Prior Publication Data

US 2002/0028544 A1 Mar. 7, 2002

(30) Foreign Application Priority Data

Jul. 31, 2000 (JP) .......................... 2000-230401
Sep. 29, 2000 (JP) .......................... 2000-301389
Sep. 29, 2000 (JP) .......................... 2000-301390

(51) Int. Cl.$^7$ .......................... H01L 21/00; H01L 21/84
(52) U.S. Cl. .......................... 438/166; 438/170
(58) Field of Search .......................... 438/149, 151, 438/160, 166, 175, 486, 571, 635, 170, 173, 192

(56) References Cited

U.S. PATENT DOCUMENTS

| | | | |
|---|---|---|---|
| 6,031,290 A | | 2/2000 | Miyazaki et al. |
| 6,165,824 A | | 12/2000 | Takano et al. .............. 438/160 |
| 6,346,730 B1 | * | 2/2002 | Kitakado et al. |
| 2001/0025958 A1 | * | 10/2001 | Yamazaki et al. |
| 2002/0016028 A1 | | 2/2002 | Arao et al. |

FOREIGN PATENT DOCUMENTS

| | | |
|---|---|---|
| JP | 6-148685 | 5/1994 |
| JP | 7-235680 | 9/1995 |
| JP | 8-274336 | 10/1996 |
| JP | 10-247735 | 9/1998 |

\* cited by examiner

*Primary Examiner*—David Nelms
*Assistant Examiner*—Phuc T. Dang

(57) ABSTRACT

A semiconductor device with high reliability and operation performance is manufactured without increasing the number of manufacture steps. A gate electrode has a laminate structure. A TFT having a low concentration impurity region that overlaps the gate electrode or a TFT having a low concentration impurity region that does not overlap the gate electrode is chosen for a circuit in accordance with the function of the circuit.

68 Claims, 45 Drawing Sheets

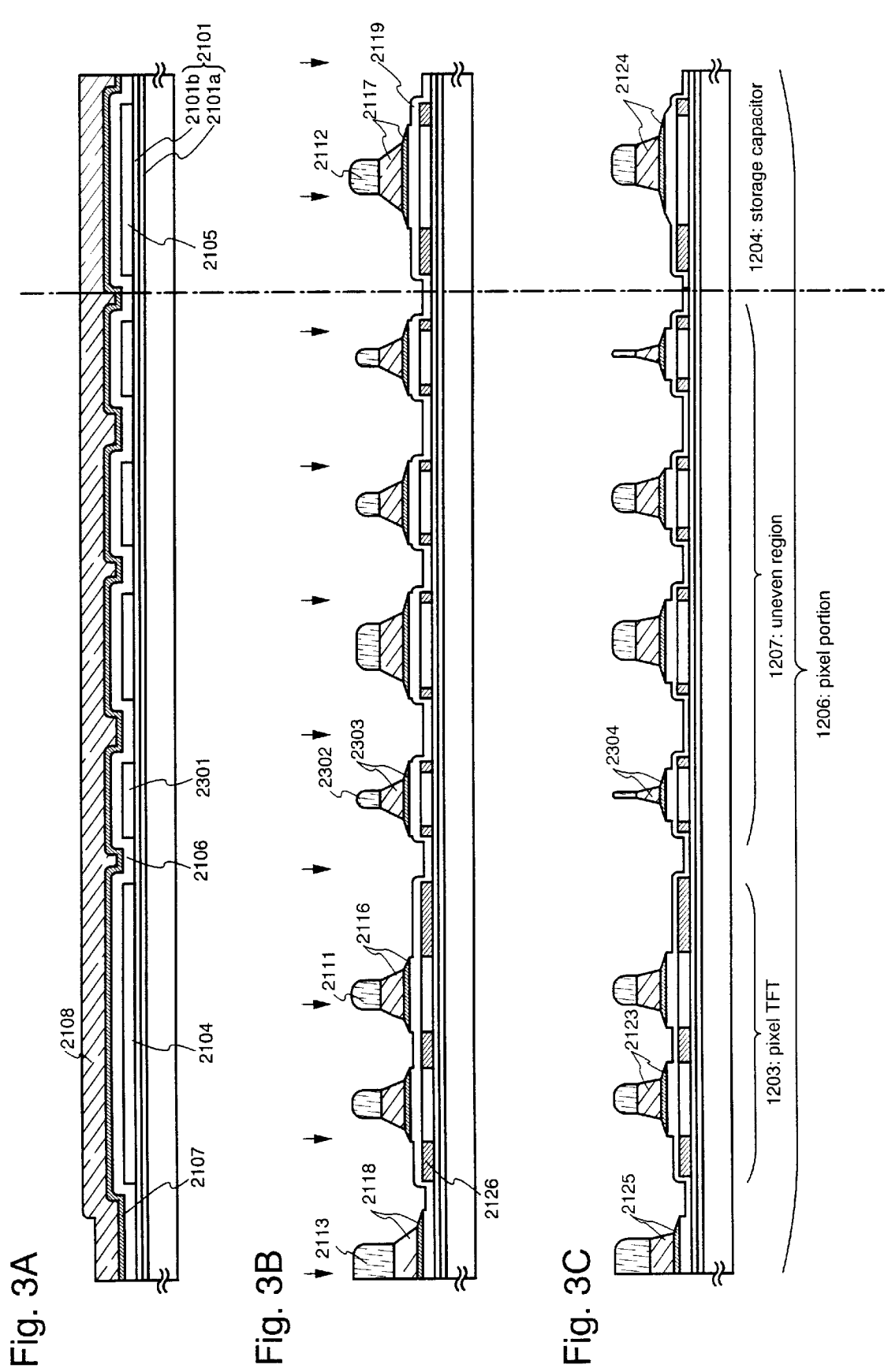

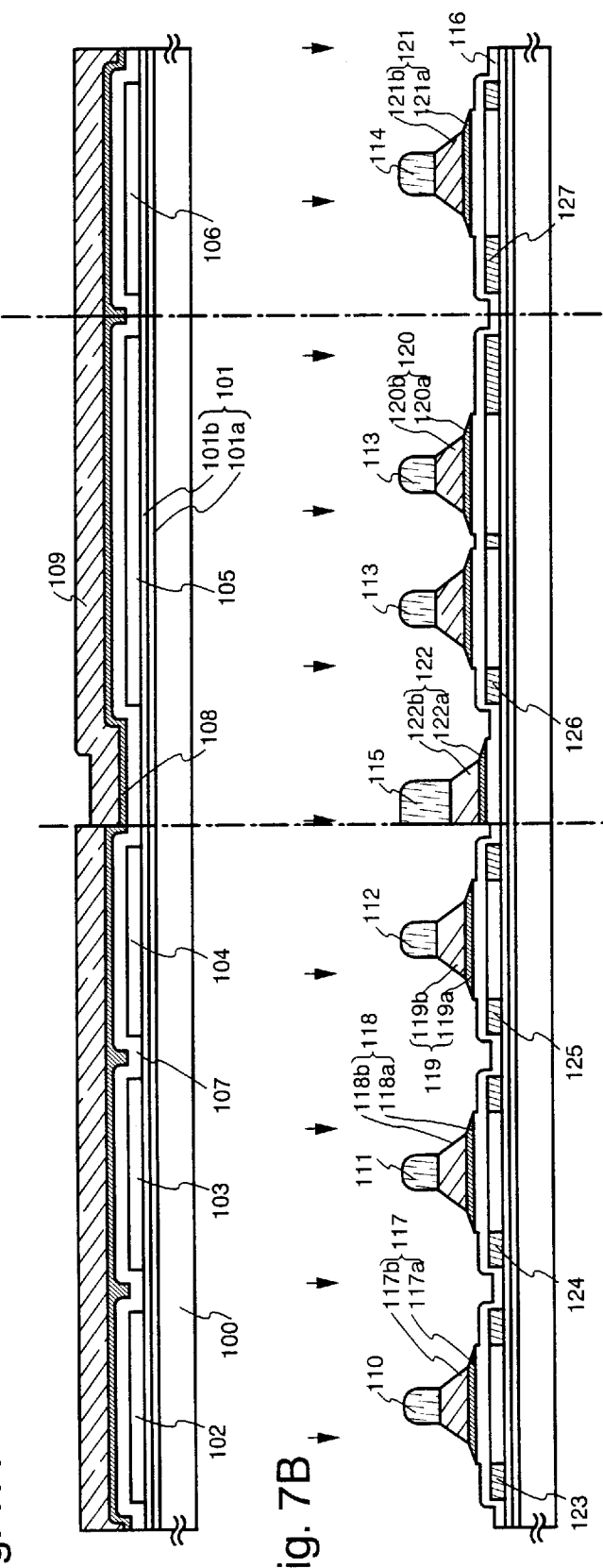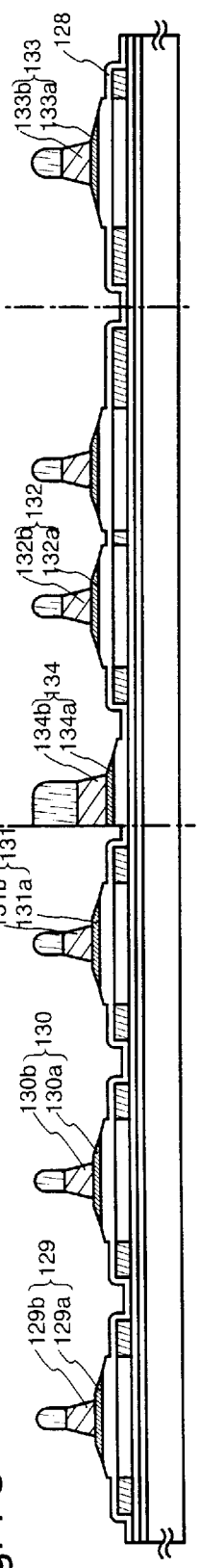
Fig. 7A
Fig. 7B
Fig. 7C

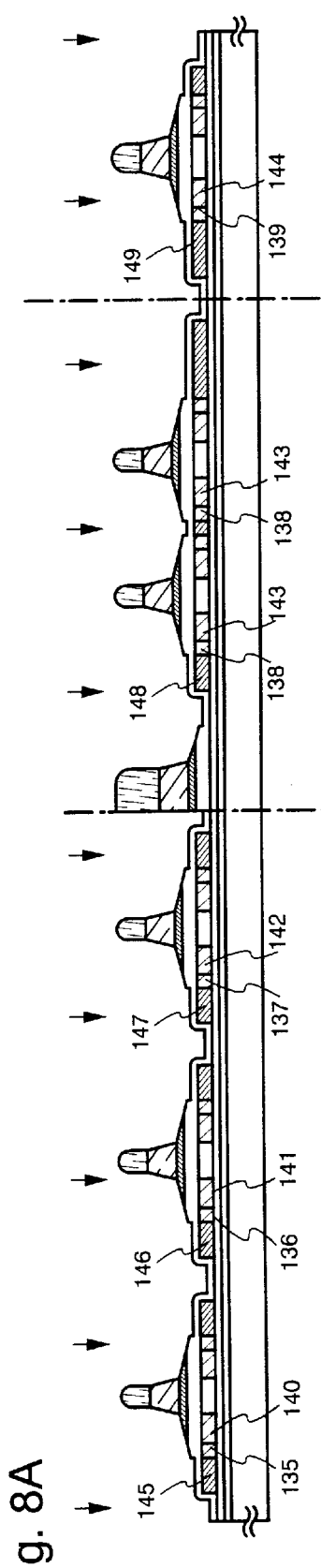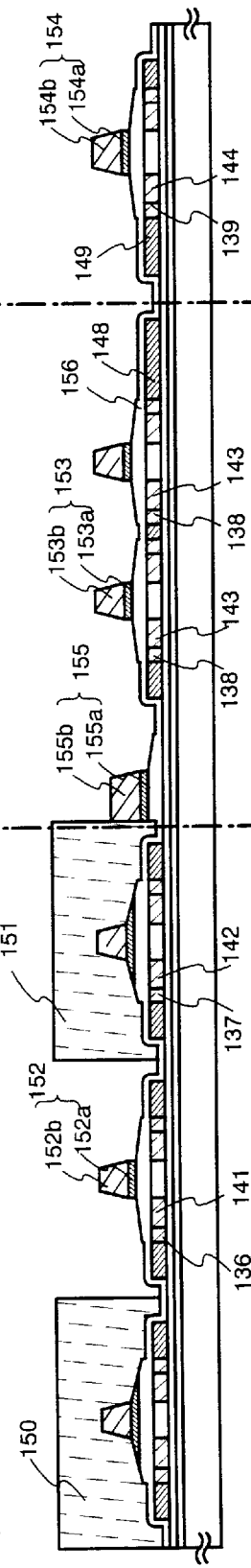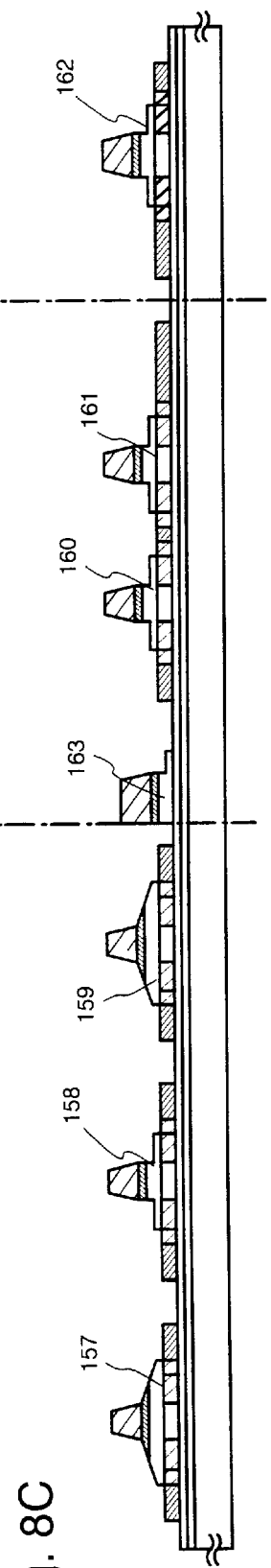

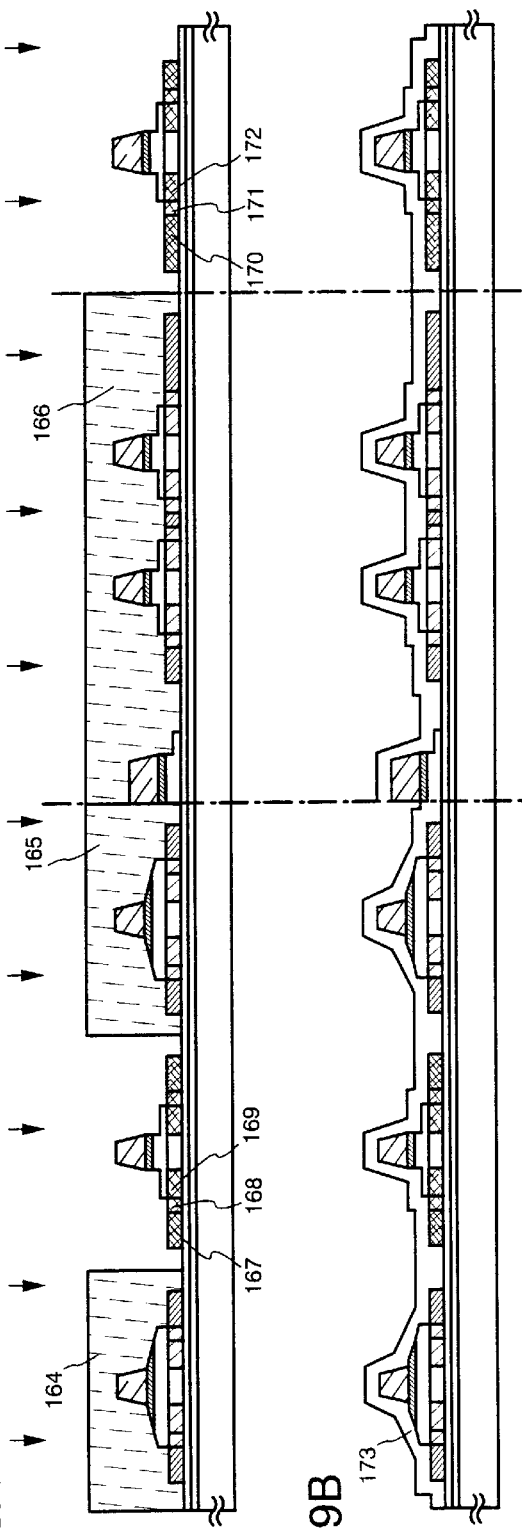
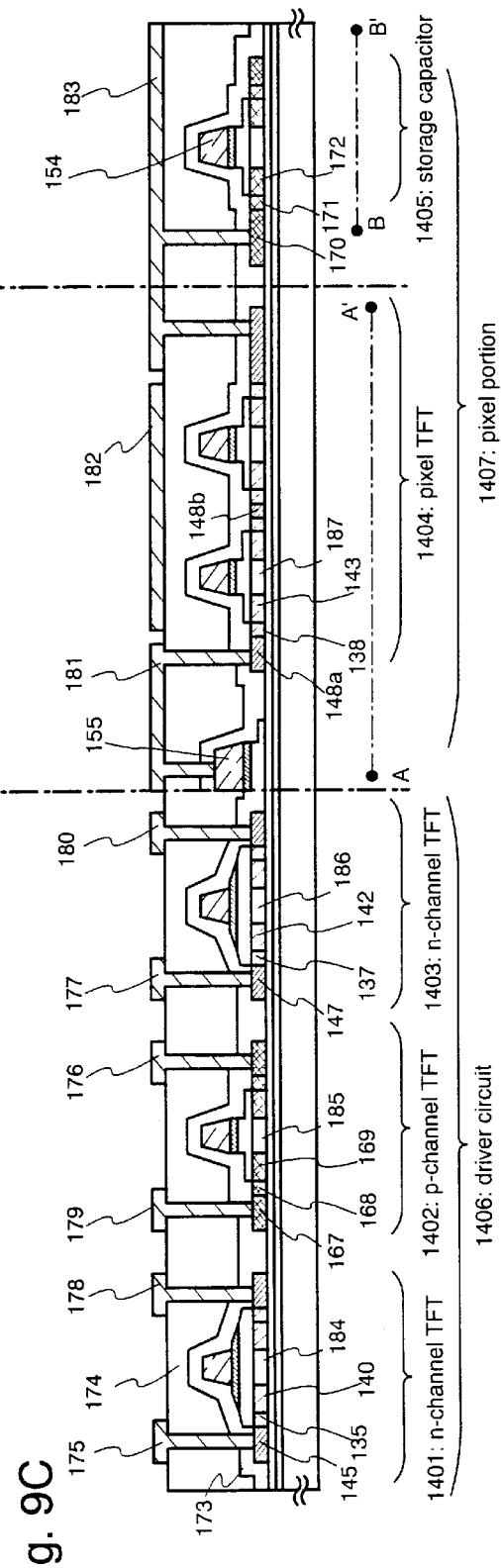

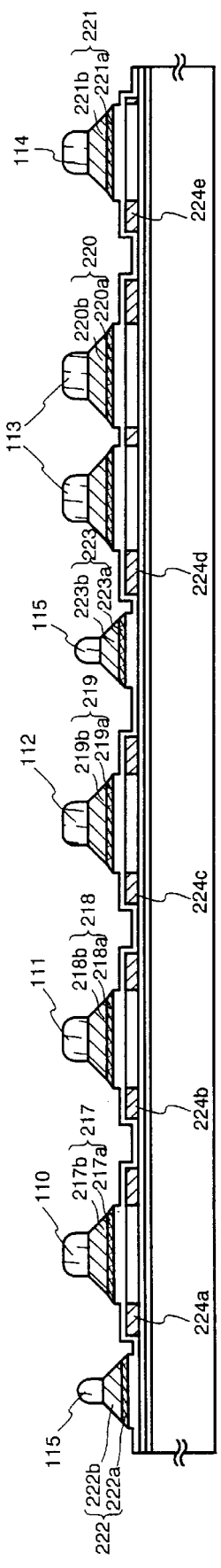
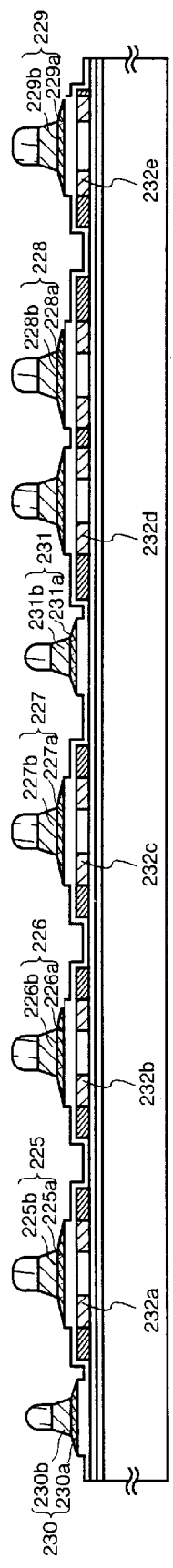
Fig. 12A
Fig. 12B

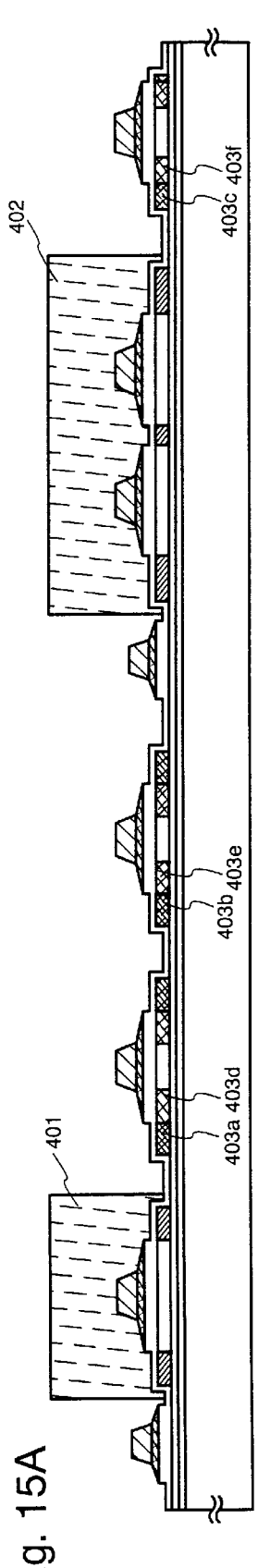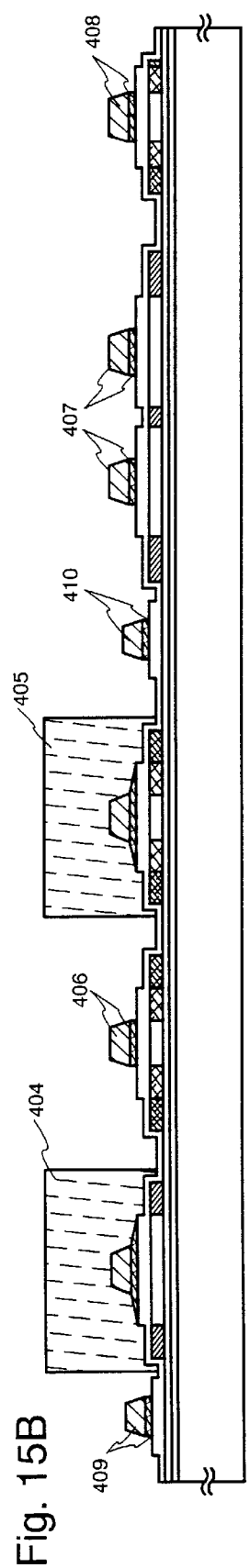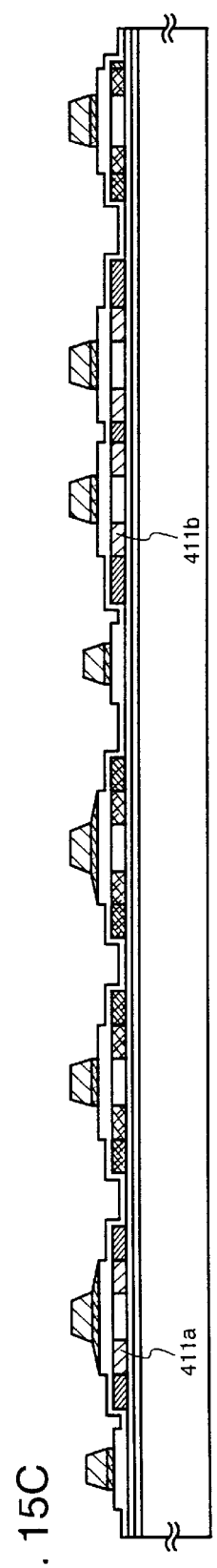

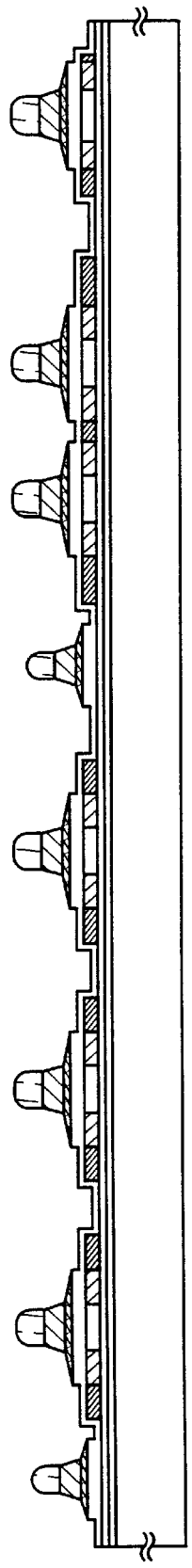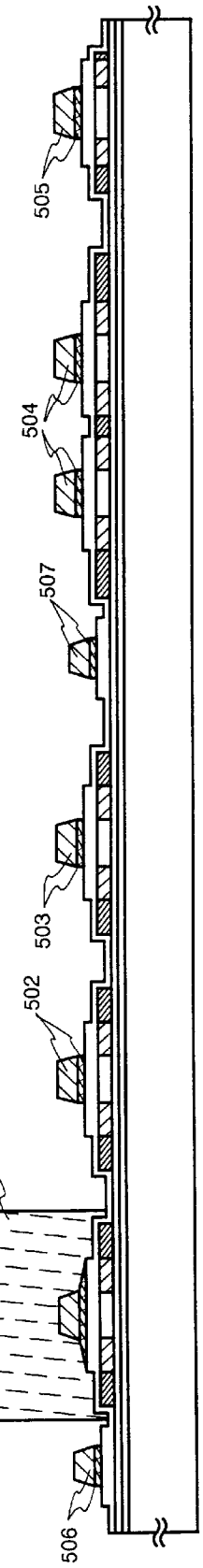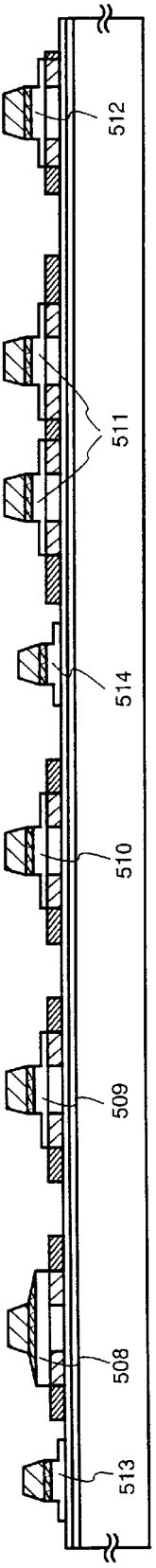
Fig. 16A
Fig. 16B
Fig. 16C

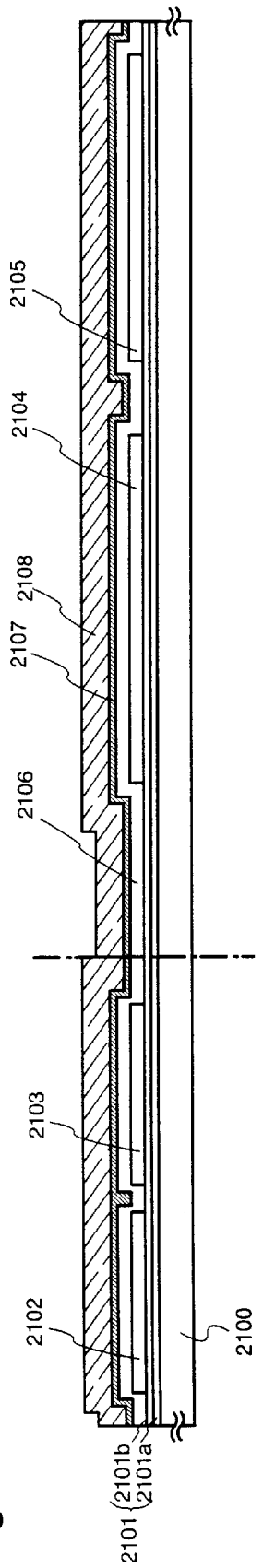
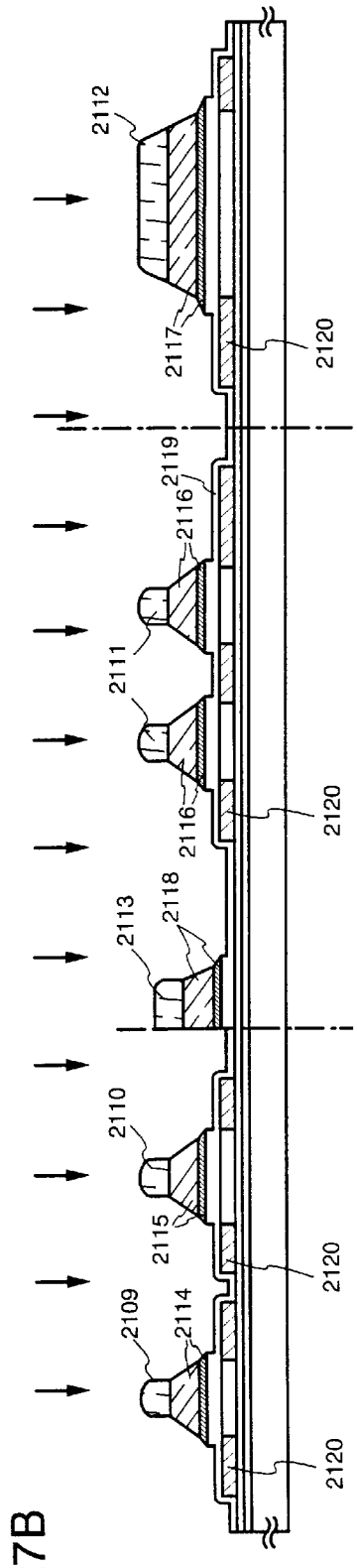
Fig. 27A
Fig. 27B

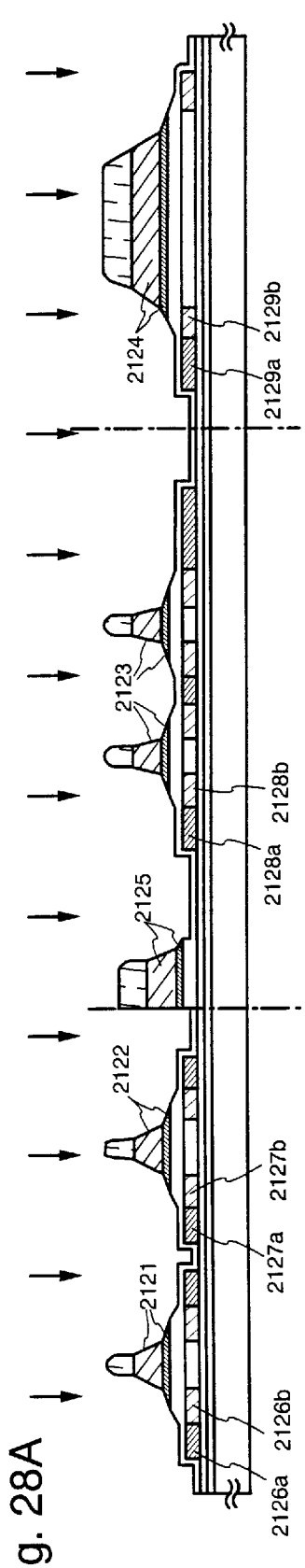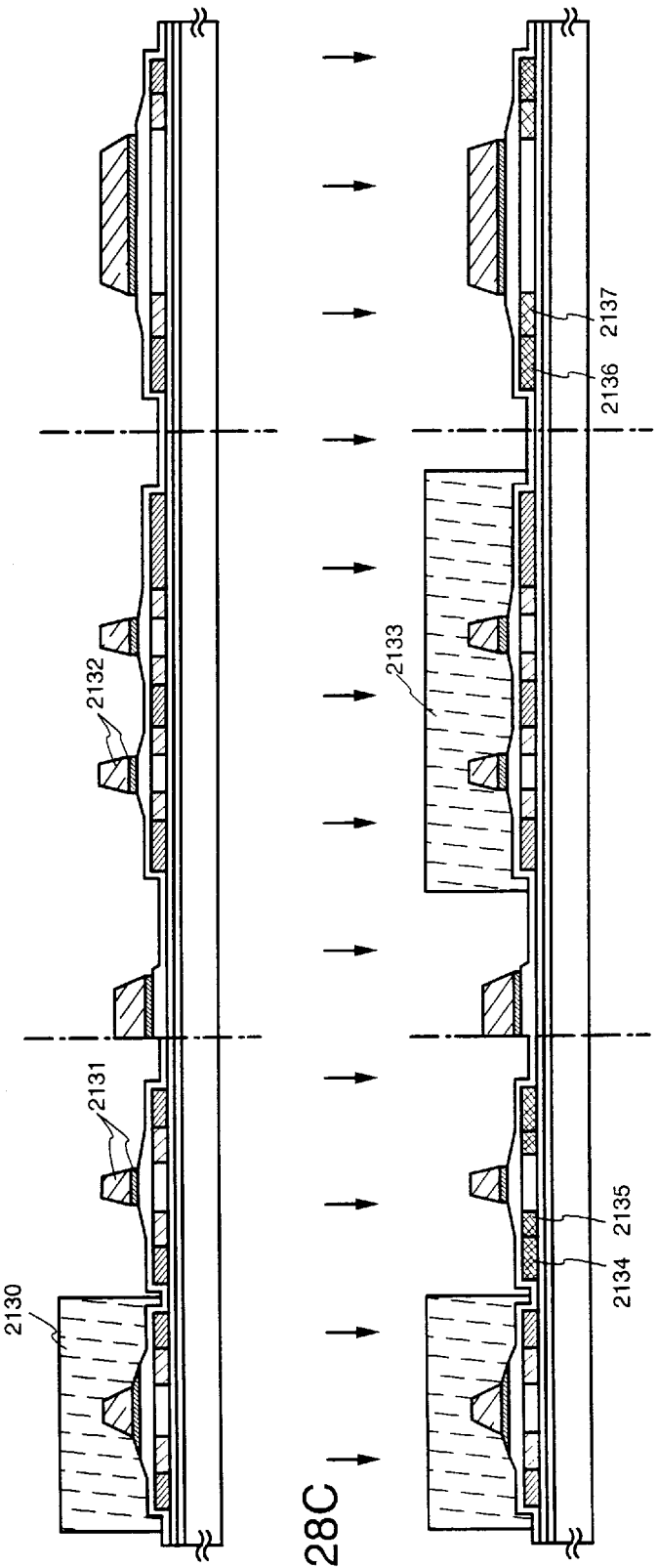
Fig. 28A  Fig. 28B  Fig. 28C 10 years guarantee voltage of driver circuit TFT characteristic shift of P-channel TFT due to transient stress characteristic shift of N-channel TFT due to transient stress 2210, FPC, 2151, 2100, 2211, sealing material, source side driver circuit, light shielding film, gate side driver circuit, color filters, 1206: pixel portion, light shielding film 2213, 2214, 2215, 2216, 2217, interlayer insulating film e — e'

SEMICONDUCTOR DEVICE AND METHOD OF MANUFACTURING THE SAME

BACKGROUND OF THE INVENTION

1. Field of the Invention

The present invention relates to a semiconductor device having a circuit comprising a thin film transistor (TFT) that uses a crystalline semiconductor film formed on a substrate (a liquid crystal display device, in particular), and to a method of manufacturing the semiconductor device. The semiconductor device manufactured in accordance with the present invention is specifically a liquid crystal display device represented by an active matrix liquid crystal display device in which a pixel portion and a driver circuit to be placed in the periphery of the pixel portion are formed on the same substrate. The invention also relates to electronic appliances that employ the display device as a display unit.

2. Description of the Related Art

TFTs with a crystalline semiconductor film (typically, a polysilicon film) on an insulating surface as a semiconductor element are used for various integrated circuits at present. The TFTs are used most often as switching elements of a display device. The TFTs having, as an active layer (a semiconductor layer including a channel formation region, a source region, and a drain region), a crystalline semiconductor film, which provides higher mobility than an amorphous semiconductor film, are high in driving performance, and hence used also as elements of a driver circuit. Accordingly, in an active matrix liquid crystal display device, for example, an image circuit for displaying an image and a driver circuit for controlling the image circuit are formed on a single substrate.

In an active matrix liquid crystal display device, integrated circuits such as a pixel circuit for displaying an image, a shift register circuit based on a CMOS circuit, a level shifter circuit, a buffer circuit, and a sampling circuit are all arranged on a single substrate while forming different functional blocks. A liquid crystal display device as above has excellent features including being thin, small-sized, light-weight, and low in power consumption. For that reason, the liquid crystal display device is now used in various scenes; to name a few, as a display unit of a personal computer for space saving and as a display unit of a portable information equipment for obtaining the latest information anytime, any place.

A pixel portion of the liquid crystal display device has a TFT functioning as a switching element (also called a pixel TFT) and a storage capacitor, and is driven by applying a voltage to a liquid crystal. The liquid crystal has to be driven with an alternate current, and a method called frame inversion driving is often employed. The TFT is required to have a characteristic of sufficiently low OFF current (Ioff: the value of drain current flowing when the TFT is in off-operation). However, OFF current is often high when the TFT is formed of a polysilicon film. A known solution for this problem is the LDD structure with a low concentration impurity region (lightly doped drain) (a structure in which an impurity region having a low concentration is provided between a channel formation region and a source region or a drain region doped with a high concentration of impurity element).

On the other hand, high driving voltage is applied to a buffer circuit and the circuit needs to have a withstand voltage high enough to prevent damage against high voltage. In order to enhance the current driving ability, the ON current value has to be sufficiently high (Ion: the value of drain current flowing when the TFT is in on-operation). Degradation of the ON current value due to hot carriers is effectively prevented by a known structure called the GOLD (gate-drain overlapped LDD) structure in which a gate electrode partially overlaps an LDD region (with a gate insulating film interposed therebetween).

In order to obtain a semiconductor device that meets the required performance, it is necessary to fabricate different TFTs for different circuits. However, increased number of masks are needed to form an LDD structure TFT and a GOLD structure TFT An increase in number of masks used leads to more manufacture steps, complication of the manufacture process, and reduction in yield.

SUMMARY OF THE INVENTION

The present invention has been made in view of the above, and an object of the present invention is therefore to provide a semiconductor device, typically, an active matrix liquid crystal display device, in which OFF current of a TFT in a pixel portion is reduced and the reliability of a TFT in a driver circuit is improved (i.e., degradation due to hot carriers is reduced) without increasing the number of masks.

A liquid crystal display device is low in light utilization efficiency, and front light or back light is often used during display in order to improve visibility. The use of front light or back light raises power consumption of its display portion, canceling low power consumption of the liquid crystal display device itself. Accordingly, another object of the present invention is to provide a display device of excellent visibility without increasing the number of manufacture steps.

According to the present invention, there is provided a semiconductor device having a TFT that is formed in a pixel portion and an n-channel TFT and a p-channel TFT that constitute a driver circuit provided in the periphery of the pixel portion, all of the TFTs being formed on the same substrate, characterized in that the n-channel TFT has a second concentration impurity region that partially overlaps a gate electrode, and that the p-channel TFT and the TFT formed in the pixel portion respectively have second concentration impurity regions that do not overlap gate electrodes.

According to the present invention, there is provided a semiconductor device having a TFT that is formed in a pixel portion and an n-channel TFT and a p-channel TFT, that constitute a driver circuit provided in the periphery of the pixel portion, all of the TFTs being formed on the same substrate, characterized in that the n-channel TFT has a gate electrode composed of a first conductive film and a second conductive film, the first conductive film contacting the top face of a gate insulating film, the second conductive film contacting the top face of the first conductive film, the first conductive film being longer than the second conductive film in the channel length direction, the first conductive film partially overlapping a second concentration impurity region, and characterized in that the p-channel TFT and the TFT formed in the pixel portion respectively have gate electrodes that do not overlap second concentration impurity regions, the gate electrodes being composed of the first conductive film that contacts the top face of the gate insulating film and the second conductive film that contacts the top face of the first conductive film, the first conductive film and the second conductive film having the same length in the channel length direction.

According to the present invention, there is provided a semiconductor device having a driver circuit that is composed of an n-channel TFT, a first p-channel TFT, and a second p-channel TFT, characterized in that: the n-channel TFT has a semiconductor layer, a gate insulating film formed on the semiconductor layer, and a gate electrode formed on the gate insulating film, the semiconductor layer including a channel formation region, a source region, a drain region, and a second concentration impurity region; the gate electrode is composed of a first conductive film and a second conductive film, the first conductive film contacting the top face of the gate insulating film, the second conductive film contacting the top face of the first conductive film; the second concentration impurity region overlaps the first conductive film with the gate insulating film interposed therebetween; the first p-channel TFT has a semiconductor layer, a gate insulating film formed on the semiconductor layer, and a gate electrode formed on the gate insulating film, the semiconductor layer including a channel formation region, a source region, a drain region, and a fifth concentration impurity region; the channel formation region and the gate electrode of the first p-channel TFT have substantially the same length in the channel length direction; the second p-channel TFT has a semiconductor layer, a gate insulating film formed on the semiconductor layer, and a gate electrode formed on the gate insulating film, the semiconductor layer including a channel formation region, a source region, a drain region, and a fifth concentration impurity region; the gate electrode of the second p-channel TFT is composed of a first conductive film and a second conductive film, the first conductive film contacting the top face of the gate insulating film, the second conductive film contacting the top face of the first conductive film; and the fifth concentration impurity region of the second p-channel TFT overlaps the first conductive film with the gate insulating film interposed therebetween.

According to the present invention, there is provided a semiconductor device having a driver circuit that is composed of an n-channel TFT, a first p-channel TFT, and a second p-channel TFT, characterized in that: the n-channel TFT has a semiconductor layer, a gate insulating film formed on the semiconductor layer, and a gate electrode formed on the gate insulating film, the semiconductor layer including a channel formation region, a source region, a drain region, and a second concentration impurity region; the gate electrode is composed of a first conductive film and a second conductive film, the first conductive film contacting the top face of the gate insulating film, the second conductive film contacting the top face of the first conductive film; the second concentration impurity region overlaps the first conductive film with the gate insulating film interposed therebetween; the first p-channel TFT has a semiconductor layer, a gate insulating film formed on the semiconductor layer, and a gate electrode formed on the gate insulating film, the semiconductor layer including a channel formation region, a source region, a drain region, a fifth concentration impurity region and an offset region; the second p-channel TFT has a semiconductor layer, a gate insulating film formed on the semiconductor layer, and a gate electrode formed on the gate insulating film, the semiconductor layer including a channel formation region, a source region, a drain region, and a fifth concentration impurity region; the gate electrode of the second p-channel TFT is composed of a first conductive film and a second conductive film, the first conductive film contacting the top face of the gate insulating film, the second conductive film contacting the top face of the first conductive film; and the fifth concentration impurity region of the second p-channel TFT overlaps the first conductive film with the gate insulating film interposed therebetween.

According to the present invention, there is provided a semiconductor device having a driver circuit and a pixel portion, the driver circuit being composed of an n-channel TFT, a first p-channel TFT, and a second p-channel TFT, the pixel portion including a TFT and a storage capacitor, characterized in that: the n-channel TFT has a semiconductor layer, a gate insulating film formed on the semiconductor layer, and a gate electrode formed on the gate insulating film, the semiconductor layer including a channel formation region, a source region, a drain region, and a second concentration impurity region; the gate electrode is composed of a first conductive film and a second conductive film, the first conductive film contacting the top face of the gate insulating film, the second conductive film contacting the top face of the first conductive film; the second concentration impurity region overlaps the first conductive film with the gate insulating film interposed therebetween; the first p-channel TFT has a semiconductor layer, a gate insulating film formed on the semiconductor layer, and a gate electrode formed on the gate insulating film, the semiconductor layer including a channel formation region, a source region, a drain region, a fifth concentration impurity region, and an offset region; the second p-channel TFT has a semiconductor layer, a gate insulating film formed on the semiconductor layer, and a gate electrode formed on the gate insulating film, the semiconductor layer including a channel formation region, a source region, a drain region, and a fifth concentration impurity region; the gate electrode of the second p-channel TFT is composed of a first conductive film and a second conductive film, the first conductive film contacting the top face of the gate insulating film, the second conductive film contacting the top face of the first conductive film; the fifth concentration impurity region of the second p-channel TFT overlaps the first conductive film with the gate insulating film interposed therebetween; and the TFT formed in the pixel portion has a semiconductor layer that includes a channel formation region, a source region, a drain region, a second impurity region, and an offset region.

Further, according to the present invention, there is provided a semiconductor device having a driver circuit that is composed of an n-channel TFT, a first p-channel TFT, and a second p-channel TFT, characterized in that: the n-channel TFT has a semiconductor layer, a gate insulating film formed on the semiconductor layer, and a gate electrode formed on the gate insulating film, the semiconductor layer including a channel formation region, a source region, a drain region, and a second concentration impurity region; the gate electrode is composed of a first conductive film and a second conductive film, the first conductive film contacting the top face of the gate insulating film, the second conductive film contacting the top face of the first conductive film; the second concentration impurity region has an $L_{ov}$ region and an $L_{off}$ region, and the $L_{ov}$ region overlaps the first conductive film with the gate insulating film interposed therebetween whereas the $L_{off}$ region does not overlap the first conductive film; and the first p-channel TFT and the second p-channel TFT respectively have semiconductor layers, each of the semiconductor layers including a channel formation region, a source region, a drain region, and a fifth concentration impurity region.

In the above present invention, the semiconductor device is characterized in that the gate electrodes of the n-channel TFT, the p-channel TFTs, and the TFT formed in the pixel portion are formed of an element selected from the group consisting of Ta, W, Ti, Mo, Al, and Cu, or formed of an alloy material or a compound material containing any element in the group above as its main ingredient.

In the above present invention, the semiconductor device is characterized in that a plurality of protrusions are formed in the pixel portion; the TFT formed in the pixel portion is electrically connected to a pixel electrode that is uneven; and the uneven portion of the pixel electrode has a radius of curvature of 0.1 to 0.4 µm, and the uneven portion of the pixel electrode is 0.3 to 3 µm tall.

BRIEF DESCRIPTION OF THE DRAWINGS

In the accompanying drawings:

FIGS. 3A to 3C are diagrams showing a process of manufacturing a semiconductor device according to the present invention;

FIGS. 7A to 7C are diagrams showing a process of manufacturing a semiconductor device according to the present invention;

FIGS. 8A to 8C are diagrams showing a process of manufacturing a semiconductor device according to the present invention;

FIGS. 9A to 9C are diagrams showing a process of manufacturing a semiconductor device according to the present invention;

FIGS. 12A and 12B are diagrams showing a process of manufacturing a semiconductor device according to the present invention;

FIGS. 15A to 15C are diagrams showing a process of manufacturing a semiconductor device according to the present invention;

FIGS. 16A to 16C are diagrams showing a process of manufacturing a semiconductor device according to the present invention;

FIGS. 27A and 27B are diagrams showing a process of manufacturing a semiconductor device according to the present invention;

FIGS. 28A to 28C are diagrams showing a process of manufacturing a semiconductor device according to the present invention;

DETAILED DESCRIPTION OF PREFERRED EMBODIMENTS

Embodiment Mode 1

Figure 1A:
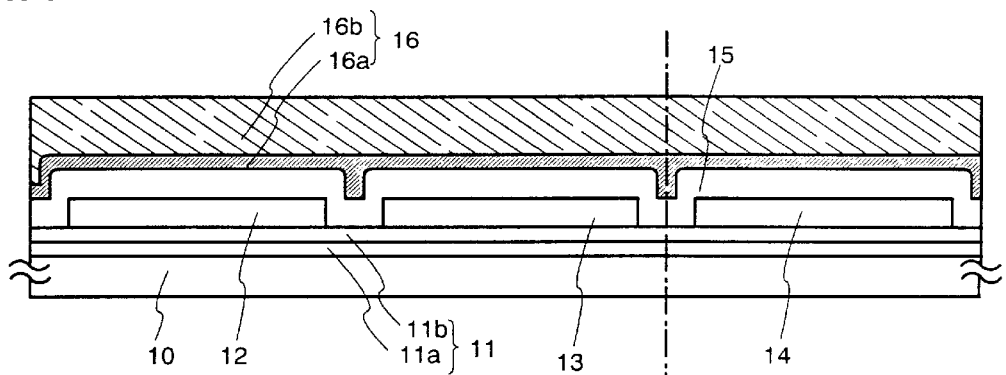
FIGS. 1A to 1C are diagrams showing an embodiment mode of the present invention.
Figure 1B:
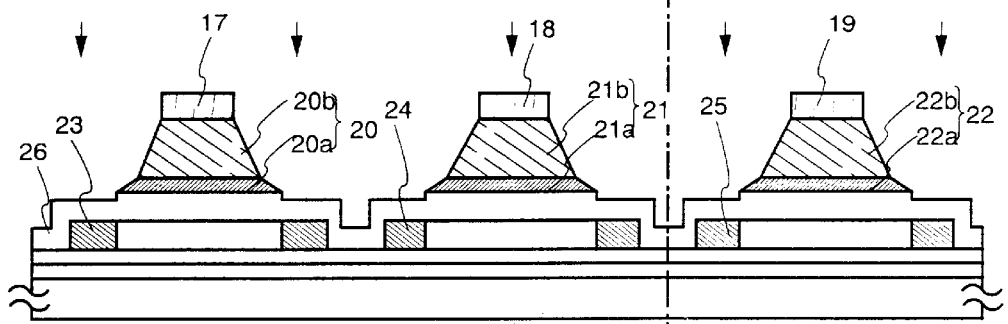

An embodiment mode of the present invention will be described with reference to FIGS. 1A to 2C.

On a substrate 10, a base insulating film 11 is formed from an insulating film such as a silicon oxide film, a silicon nitride film, and a silicon oxynitride film. The base insulating film 11 in this embodiment mode has a two-layer structure 11a and 11b. However, the base insulating film may have a single layer or three or more layers of the insulating films given in the above.

Next, an amorphous semiconductor film is formed on the base insulating film 11 to a thickness of 30 to 60 nm. No limitation is put on the material of the amorphous semiconductor film, but the film is preferably formed of silicon or a silicon germanium ($Si_xGe_{1-x}$; 0<x<1, typically x=0.001 to 0.05) alloy. The amorphous semiconductor film is then subjected to a known crystallization treatment (such as laser crystallization, thermal crystallization, or thermal crystallization using nickel or other catalysts) to form a crystalline semiconductor film. The obtained crystalline semiconductor film is patterned into a desired shape to form semiconductor layers 12 to 14.

After forming the semiconductor layers 12 to 14, the layers may be doped with an impurity element imparting p-type conductivity in order to control the threshold of an n-channel TFT. Known impurity elements that can give a semiconductor the p type conductivity are elements belonging to Group 13 in the periodic table, such as boron (B), aluminum (Al), and gallium (Ga).

A gate insulating film 15 is formed next to cover the island-like semiconductor layers 12 to 14. The gate insulating film 15 is formed by plasma CVD or sputtering from an insulating film containing silicon to have a thickness of 40 to 150 nm. Of course, the gate insulating film may be a single layer or a laminate of an insulating film containing silicon.

Subsequently formed on the gate insulating film 15 as a laminate are a first conductive film (TaN film) 16a with a thickness of 20 to 100 nm and a second conductive film (W film) 16b with a thickness of 100 to 400 nm. The conductive films may be formed of an element selected from the group consisting of Ta, W, Ti, Mo, Al, and Cu, or formed of an alloy material or a compound material containing any element in the group above as its main ingredient. Alternatively, a semiconductor film, typically a polycrystalline silicon film, doped with an impurity element such as phosphorus may be used.

Next, resist masks 17 to 19 are formed by photolithography and a first etching treatment is conducted by ICP (inductively coupled plasma) etching or other etching methods to form an electrode and a wiring line. The W films 20b to 22b are first etched under first etching conditions to taper the first conductive film around the edge, and then the W films 20b to 22b and the TaN films 20a to 22a are simultaneously etched under second etching conditions to form first shape conductive layers 20 to 22. Denoted by 26 is a part of the gate insulating film, and regions thereof that are not covered with the first shape conductive layers 20 to 22 are also etched and thinned.

Then a first doping treatment is conducted, without removing the resist masks, to dope the semiconductor layers with an impurity element imparting n-type conductivity. Ion doping or ion implantation is employed for the doping treatment. In the first doping treatment, the first shape conductive layers 20 to 22 serve as masks against the impurity element imparting n-type conductivity to form first concentration impurity regions 23 to 25 in a self-aligning manner.

Figure 1C:
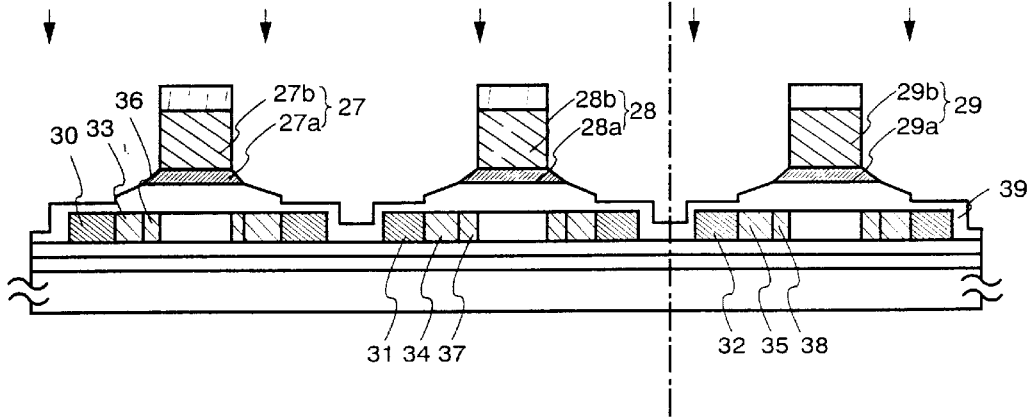

Still keeping the resist masks in place, a second etching treatment is conducted as shown in FIG. 1C. Second shape second conductive films 27b to 29b are formed by anisotropic etching. At this point, the first conductive layers and the gate insulating film are also etched slightly to form second shape first conductive films 27a to 29a. As a result, second shape conductive layers 27 to 29 (the first conductive films 27a to 29a and the second conductive films 27b to 29b) and a gate insulating film 39 are formed.

A second doping treatment is next conducted without removing the resist masks. In the second doping treatment, the layers are doped with an impurity element imparting n-type conductivity in a dose smaller than in the first doping treatment and at a high acceleration voltage. Thus formed are second concentration impurity regions 33 to 35 and 36 to 38 that are newly formed in the semiconductor layers inside the first concentration impurity regions formed in FIG. 1B. In the doping, the semiconductor layers under the second shape first conductive films 27a to 29a are also doped with the impurity element while using the second shape conductive layers 27 to 29 as masks.

Thus formed are third concentration impurity regions 36 to 38 and second concentration impurity regions 33 to 35. The third concentration impurity regions 36 to 38 overlap the second shape first conductive films 27a to 29a, respectively. The second concentration impurity regions are placed between the first concentration impurity regions and the third concentration impurity regions (33 is between 30 and 36, 34 is between 31 and 37, and 35 is between 32 and 38).

Figure 2A:
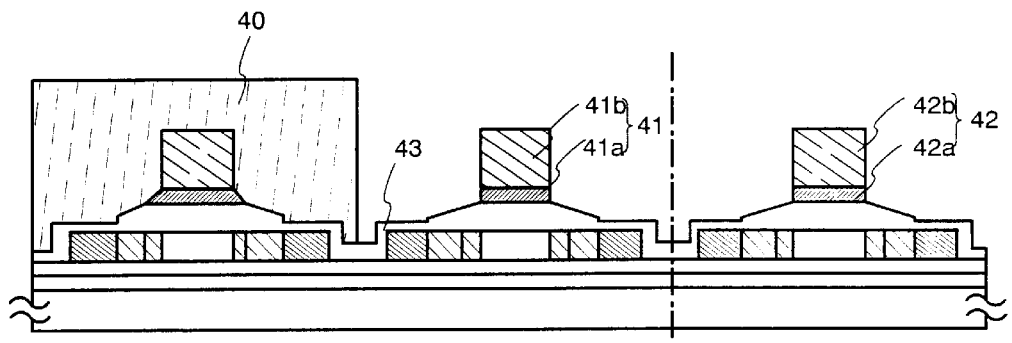
FIGS. 2A to 2C are diagrams showing the embodiment mode of the present invention.

Then the resist masks are removed. Thereafter, a mask 40 is newly formed from a resist so as to cover the n-channel TFT of a driver circuit portion. A third etching treatment is conducted as shown in FIG. 2A. The first conductive layers of a p-channel TFT and of the TFT in the pixel portion are etched to form third shape conductive layers 41 and 42. At this point, a gate insulating film 43 that is not covered with the mask 40 is slightly etched and thinned.

Figure 2B:
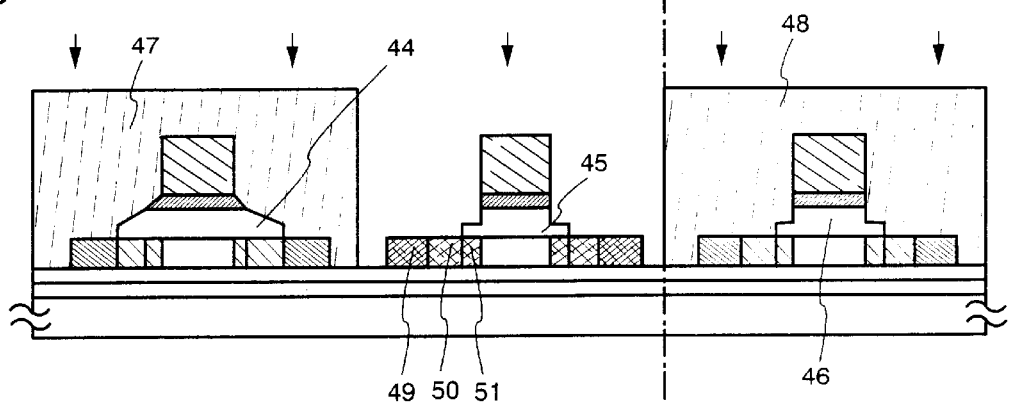

In order to avoid fluctuation caused by the uneven gate insulating film, the gate insulating film is etched after the resist mask is removed as shown in FIG. 2B. The conductive layers serve as masks to leave portions of the gate insulating film unetched, thereby forming gate insulating layers 44 to 46.

Next, resist masks 47 and 48 are newly formed to conduct a third doping treatment as shown in FIG. 2B. In the third doping treatment, the semiconductor layer to be an active layer of the p-channel TFT is doped with an impurity element imparting p-type conductivity while using the third shape conductive layer 41 (41a and 41b) as a mask against the impurity element. As a result, fourth concentration impurity regions 49 to 51 are formed in a self-aligning manner.

Figure 2C:
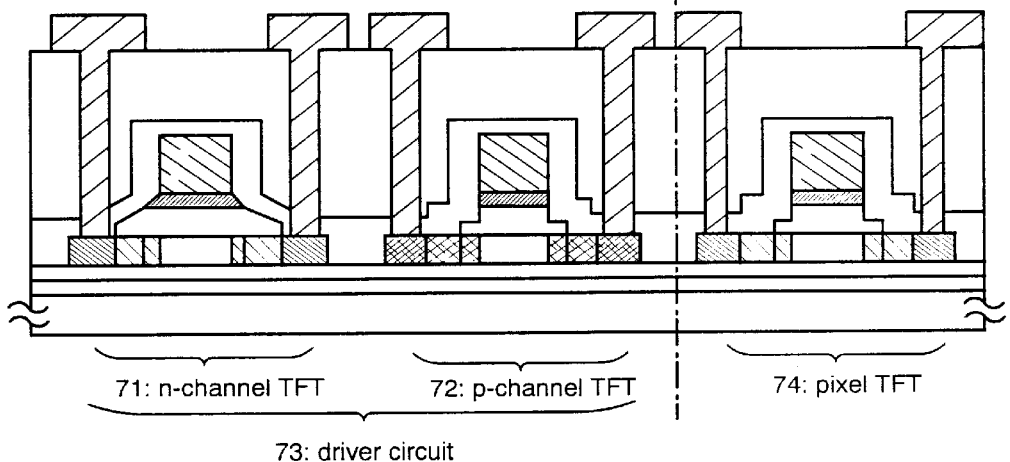

In this way, TFTs shown in FIG. 2C are manufactured. An n-channel TFT 71 of a driver circuit 73 includes: the third concentration impurity region 36 overlapping with the second shape conductive layer 27 for forming a gate electrode (the region 36 is called a GOLD region in this specification); the second concentration impurity region 33 formed outside the gate electrode (the region 33 is called an LDD region in this specification); and the first concentration impurity region functioning as a source region or a drain region. A reference symbol 72 denotes a p-channel TFT of the driver circuit 73. A pixel TFT 74 in the pixel portion has the third concentration impurity region 38 and the second concentration impurity region 35 formed outside the gate electrode (the regions 38 and 35 are both called LDD regions in this specification), and has the first concentration impurity region 32 functioning as a source region or a drain region.

Embodiment Mode 2

This embodiment mode describes a method of forming an uneven electrode with projections formed by the same process that is used to form a TFT in a pixel portion.

A substrate is prepared by forming an insulating film on a surface of a glass substrate, a quartz substrate, a silicon substrate, a metal substrate, or a stainless steel substrate. A plastic substrate may also be used as long as it has a heat resistance against the process temperature of embodiments. A base insulating film is formed on the substrate and a semiconductor layer is formed on the base insulating film.

The projections can have high reproducibility when formed using a photo mask. Therefore it is appropriate to form the projections in accordance with the process of manufacturing a pixel TFT 1203. An example of forming the projections by layering the semiconductor layer, a gate insulating film, and a conductive film similar to the manufacture of the pixel TFT 1203 is illustrated in FIGS. 3A to 5B.

The method of forming the projections is not particularly limited and a single layer of one of the above films, or a laminate combining the above films may be used. For example, the projections may be a laminate of the semiconductor layer and the insulating film, or a single layer of the conductive film. In other words, a plurality of projections can be formed without increasing the number of steps for manufacturing a semiconductor device.

The thus formed projections, as well as the pixel TFT formed by the same process and a TFT in a driver circuit, are covered with an interlayer insulating film. The curvature of the uneven portion of the pixel electrode can be adjusted by selecting the material of the insulating film. The radius of curvature of the uneven portion of the pixel electrode is set to 0.1 to 0.4 μm (preferably 0.2 to 2 μm). When the insulating film is an organic resin film, an appropriate organic resin film has a viscosity of 10 to 1000 cp (preferably 40 to 200 cp) (for instance, a polyimide film or an acrylic resin film), so that the surface of the film shows enough irregularities in accordance with the underlying uneven region.

Figure 6:
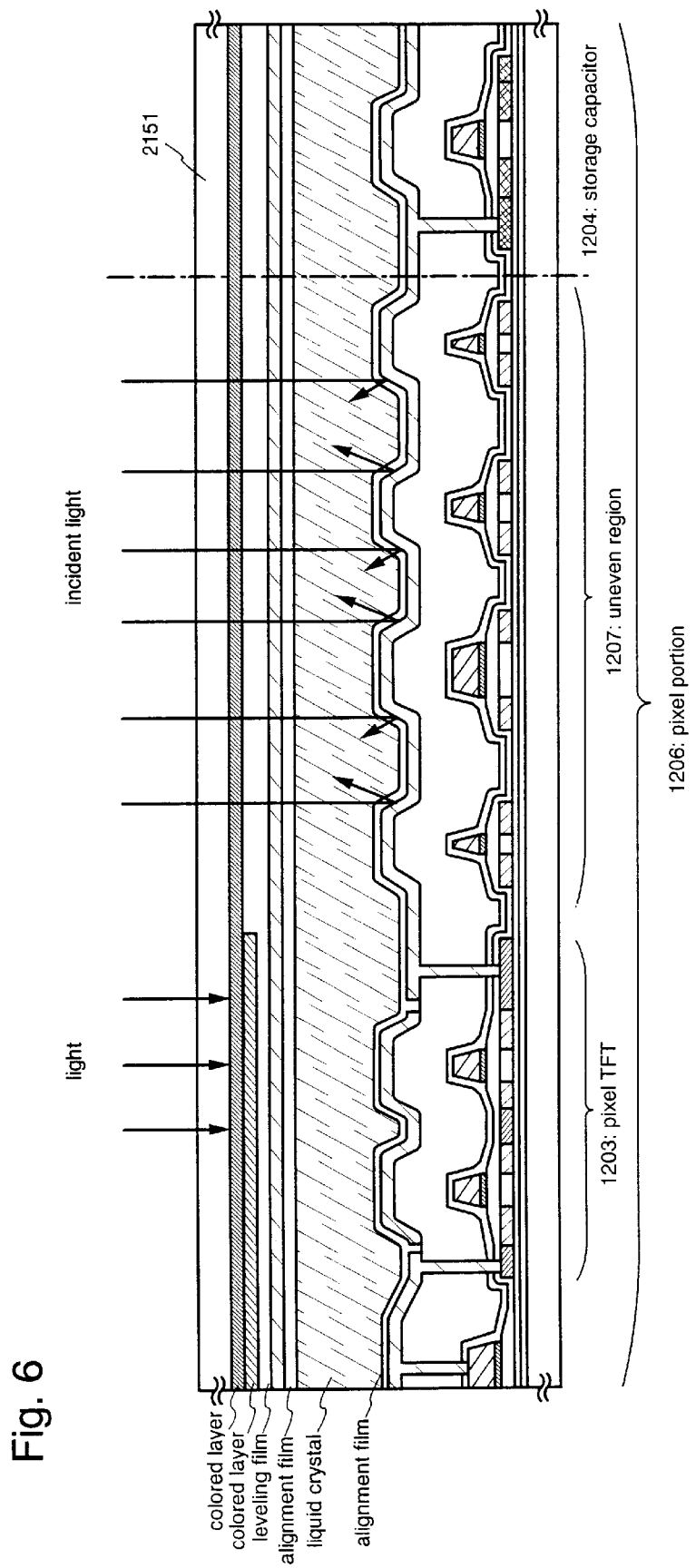
FIG. 6 is a diagram showing the structure of a semiconductor device according to the present invention.

After forming the uneven interlayer insulating film, the pixel electrode is formed thereon. The surface of the pixel electrode is also irregular due to the uneven insulating film. The uneven portion is 0.3 to 3 μm tall. With the uneven portion formed on the surface of the pixel electrode, light can effectively be scattered when incident light is reflected as shown in FIG. 6.

The projections shown in this embodiment mode are a laminate of the semiconductor layer, the gate insulating film, the first conductive film, and the second conductive film layered in accordance with the process of manufacturing the pixel TFT. However, the projections are not particularly limited and any layer or film given in the above can form a single layer or a laminate to serve as the projections. Thus the projections having a necessary height can be formed without increasing the number of manufacture steps. One projection is spaced apart from an adjacent projection by 0.1 μm or more, preferably 1 μm.

The projections desirably vary in size in order to scatter the reflected light better, though no particular limitation is set. The shape and arrangement of the projections may irregular or regular. Furthermore, the projections do not need to be in any particular place as long as they are in a region below the pixel electrode which corresponds to the display region of the pixel portion.

An appropriate size of the protrusion when viewed from the above is 100 to 400 $\mu m^2$, preferably, 25 to 100 $\mu m^2$.

In this way, the uneven pixel electrode can be formed without increasing the number of manufacture steps.

Embodiment 1

Embodiments of the present invention will be described with reference to FIGS. 7A to 11. Here, a detailed description will be given on a method of forming, simultaneously, on the same substrate, a TFT for a pixel portion and TFTs (an n-channel TFT, and a p-channel TFT) for a driver circuit that is provided in the periphery of the pixel portion.

A substrate 100 may be a glass substrate, a quartz substrate, a ceramic substrate, or the like. Alternatively, a silicon substrate, a metal substrate, or a stainless steel substrate may be used if the surface of the substrate is formed with an insulating film. A plastic substrate having a heat resistance against the process temperature of this embodiment may also be used.

As shown in FIG. 7A, a base insulating film 101 is formed on the substrate 100 from an insulating film such as a silicon oxide film, a silicon nitride film, and a silicon oxynitride film. The base insulating film 101 in this embodiment has a two-layer structure. However, it may be a single layer of the insulating films given in the above, or a laminate consisting of more than two layers of the above insulating films. The first layer 101*a* of the base insulating film 101 is a silicon oxynitride film 101*a* formed to a thickness of 50 to 100 nm using as reaction gas $SiH_4$, $NH_3$, and $N_2O$. The second layer 101*b* of the base insulating film 101 is a silicon oxynitride film 101*b* formed to a thickness of 100 to 150 nm using as reaction gas $SiH_4$, and $N_2O$. The film 101*b* is layered on the film 101*a*.

An amorphous semiconductor film is formed next on the base insulating film 101. The thickness of the amorphous semiconductor film is 30 to 60 nm. Though not limited, the material of the amorphous semiconductor film is preferably silicon or a silicon germanium ($Si_xGe_{1-x}$; 0<x<1, typically x=0.001 to 0.05) alloy. In this embodiment, the amorphous semiconductor film is formed by plasma CVD using $SiH_4$ gas.

The base insulating film and the amorphous semiconductor film can be formed by the same film formation method, and therefore the base insulating film and the amorphous semiconductor film may be formed successively.

Next, the amorphous semiconductor film is subjected to a known crystallization treatment (such as laser crystallization, thermal crystallization, or thermal crystallization using nickel or other catalysts) to form a crystalline semiconductor film. The obtained crystalline semiconductor film is patterned into a desired shape. In this embodiment, a solution containing nickel is retained to the top face of the amorphous silicon film. The film is then subjected to dehydrogenation (at 500° C. for an hour) followed by thermal crystallization (at 550° C. for four hours) and laser annealing treatment for improving crystallinity, whereby a crystalline silicon film is formed. The crystalline silicon film is patterned by photolithography to form semiconductor layers 102 to 106.

After forming the semiconductor layers 102 to 106, the layers may be doped with an impurity element imparting p-type conductivity in order to control the threshold (Vth) of an n-channel TFT. Known impurity elements that can give a semiconductor the p type conductivity are elements belonging to Group 13 in the periodic table, such as boron (B), aluminum (Al), and gallium (Ga). In this embodiment, boron (B) is used in the doping.

Besides, in the case where the crystalline semiconductor film is manufactured by the laser crystallization method, a pulse oscillation type or continuous emission type excimer laser, a YAG laser, or a $YVO_4$ laser may be used. In the case where those lasers are used, it is appropriate to use a method in which laser light radiated from a laser oscillator is condensed by an optical system into a linear beam, and is irradiated to the semiconductor film. The conditions of the crystallization may be properly selected by an operator.

A gate insulating film 107 is then formed for covering the island-like semiconductor layers 102 to 106. The gate insulating film 107 is formed of an insulating film containing silicon with a thickness of from 40 to 150 nm by a plasma CVD method or a sputtering method. Of course, a single layer or a lamination structure of an insulating film containing other silicon can be used for the gate insulating film.

When the silicon oxide film is used, it can be formed by a plasma CVD method in which TEOS (tetraethyl orthosilicate) and $O_2$ are mixed, with a reaction pressure of 40 Pa, a substrate temperature of from 300 to 400° C., and discharged at a high frequency (13.56 MHz) power density of 0.5 to 0.8 W/cm². The silicon oxide film thus manufactured can obtain good characteristics as the gate insulating film by subsequent thermal annealing at 400 to 500° C.

Then, on the gate insulating film 107, a first conductive film (TaN) 108 and a second conductive film (W) 109 are formed into lamination to have a film thickness of 20 to 100 nm and 100 to 400 nm, respectively. The conductive films forming a gate electrode may be formed of an element selected from the group consisting of Ta, W, Ti, Mo, Al, and Cu, or an alloy material or a compound material containing the above element as its main constituent. Further, a semiconductor film typified by a polycrystalline silicon film doped with an impurity element such as phosphorus may be used. Besides, any combination may be employed such as a combination in which the first conductive film is formed of tantalum (Ta) and the second conductive film is formed of W, a combination in which the first conductive film is formed of titanium nitride (TaN) and the second conductive film is formed of Al, or a combination in which the first conductive film is formed of tantalum nitride (TaN) and the second conductive film is formed of Cu.

Next, masks 110 to 115 made from resist are formed using a photolithography method, and a first etching process is performed in order to form electrodes and wirings. In this embodiment, an ICP (inductively coupled plasma) etching method is used, a gas mixture of $CF_4$, $Cl_2$ and $O_2$ is used as an etching gas, the gas flow rate is set to 25/25/10 sccm, and a plasma is generated by applying a 500 W RF (13.56 MHz) power to a coil shape electrode at 1 Pa, thereby performing etching. A 150 W RF (13.56 MHz) power is also applied to the substrate side (sample stage), effectively applying a negative self-bias voltage. The W film is etched with the first etching conditions, and a first shape conductive film including the taper portion at the end portion is formed.

Thereafter, the first etching conditions are changed into the second etching conditions without removing the masks 110 to 115 made of resist, a gas mixture of $CF_4$ and $Cl_2$ is used as an etching gas, the gas flow rate is set to 30/30 sccm, and a plasma is generated by applying a 500 W RF (13.56 MHz) power to a coil shape electrode at 1 Pa, thereby performing etching for about 30 seconds. A 20 W RF (13.56 MHz) power is also applied to the substrate side (sample stage), effectively applying a negative self-bias voltage. The W film and the TaN film are both etched on the same order with the second etching conditions in which $CF_4$ and $Cl_2$ are mixed. Note that, the etching time may be increased by approximately 10 to 20% in order to perform etching without any residue on the gate insulating film.

In the first etching process, a first shape conductive layer is formed to have a tapered shape at the end portion due to the effect of the bias voltage applied to the substrate side by adopting a suitable shape of the masks formed from resist. The angle of the tapered portions is set to 15 to 45°. Thus, first shape conductive layers 117 to 122 (first conductive layers 117a to 122a and second conductive layers 117b to 122b) are formed by the first etching process. Reference numeral 116 denotes a gate insulating film, and regions of the gate insulating film, which are not covered by the first shape conductive layers 117 to 122, are made thinner by approximately 20 to 50 nm by etching.

Then, a first doping process is performed to add an impurity element for imparting n-type conductivity to the semiconductor layer without removing the mask made of resist (FIG. 7B). Doping may be carried out by an ion doping method or an ion implantation method. The condition of the ion doping method is that a dosage is $1.5 \times 10^{15}$/cm², and an acceleration voltage is 60 to 100 keV As the impurity element for imparting n-type conductivity, an element belonging to group 15 of the periodic table, typically phosphorus (P) or arsenic (As) is used. In this case, the conductive layers 117 to 121 become masks to the impurity element imparting n-type conductivity, and the first concentration impurity regions 123 to 127 are formed in a self-aligning manner. The impurity element imparting n-type conductivity in the concentration range of $1 \times 10^{20}$ to $1 \times 10^{21}$ atoms/cm³ is added to the first concentration impurity regions 123 to 127.

Thereafter, as shown in FIG. 7C, the second etching process is performed without removing the masks made of resist. Here, a gas mixture of $CF_4$, $Cl_2$ and O2 is used as an etching gas, the gas flow rate is set to 20/20/20 (sccm), and a plasma is generated by applying a 500 W RF (13.56 MHz) power to a coil shape electrode at 1 Pa, thereby performing etching. A 20 W RF (13.56 MHz) power is also applied to the substrate side (sample stage), effectively applying a self-bias voltage which is lower than that of the first etching process. According to the third etching condition, W film is etched. Thus, according to the third etching condition, W film is etched in a different direction to form the conductive films 129 to 134.

Etching reactions in etching the W film and the TaN film with a mixture gas of $CF_4$ and $Cl_2$ can be inferred from the kind of radicals or ions generated and the vapor pressure of a reaction product. Comparing the vapor pressure among fluorides and chlorides of W and TaN, the vapor pressure of $WF_6$, which is a fluoride of W, is extremely high while the rest of them, namely, $WCl_5$, $TaF_5$, and $TaCl_5$, have about the same level of vapor pressure. Therefore the W film and the TaN film are etched similarly with a mixture gas of $CF_4$ and $Cl_2$. If the mixture gas is added with an appropriate amount of $O_2$, $CF_4$ and $O_2$ reacts to change into CO and F and a large amount of F radicals or F ions are generated. As a result, the W film whose fluoride has high vapor pressure is etched at an increased etching rate. On the other hand, the etching rate of the TaN film does not increase much when F is increased. The surface of the TaN film is slightly oxidized by addition of $O_2$ to the mixture gas because TaN is more easily oxidized than W. The oxide of TaN does not react with fluorine or chlorine, thereby further lowering the etching rate of the TaN film. Accordingly, the etching rate of the W film can be differentiated from the etching rate of the TaN film so that the W film is etched faster than the TaN film.

Next, a second doping treatment is conducted as shown in FIG. 8A without removing the resist masks. In the second doping treatment, the layers are doped with an impurity element imparting n-type conductivity in a dose smaller than in the first doping treatment and at a high acceleration voltage. The acceleration voltage is set to 70 to 120 keV, 90 keV, in this embodiment. The dose is set to $1.5 \times 10^{14}$ atoms/cm$^2$. New impurity regions are thus formed in the semiconductor layers inside the first concentration impurity regions formed in FIG. 8B. In the doping, the semiconductor layers under the second shape first conductive layers 129a to 133a are also doped with the impurity element while using the second shape conductive layers 129 to 133 as masks.

Thus formed are third concentration impurity regions 140 to 144 and second concentration impurity regions 135 to 139. The third concentration impurity regions 140 to 144 overlap the second shape first conductive layers 129a to 133a, respectively. The second concentration impurity regions are placed between the first concentration impurity regions and the third concentration impurity regions (135 is between 145 and 140, 136 is between 146 and 141, 137 is between 147 and 142, 138 is between 148a and 143, and 139 is between 149 and 144).

Then the resist masks are removed. Thereafter, masks 150 and 151 are newly formed from a resist to conduct a third etching treatment as shown in FIG. 8B. $SF_6$ and $Cl_2$ are used as the etching gas, the gas flow rate ratio of them is set to 50/10 SCCM, and an RF (13.56 MHz) power of 500 W is applied to a coiled electrode at a pressure of 1.3 Pa to generate plasma for 30 second etching. The substrate side (sample stage) receives an RF (13.56 MHz) power of 10 W to apply a substantially negative self-bias voltage. In this way, the TaN film is etched in a future p-channel TFT and in a future pixel portion TFT under the above third etching conditions. Third shape conductive layers 152 to 155 are formed as a result.

In this specification, a 'future p-channel TFT' refers to a TFT in the middle of fabrication which is to serve as a p-channel TFT after the fabrication is completed. Similarly, a 'future n-channel TFT' refers to an unfinished TFT that is to function as an n-channel TFT after its completion.

The resist masks are removed and the gate insulating film is then etched as shown in FIG. 8C. $CHF_3$ is used as the etching gas, the gas flow rate thereof is set to 35 SCCM, and an RF power of 800 W is applied to generate plasma for the etching. Here, the second shape conductive layers 129 and 131 and the third shape conductive layers 152 to 155 serve as masks to cut off portions of the gate insulating film for each TFT (157–162).

Next, as shown in FIG. 9A, the masks 164 to 166 are formed from resist and a third doping process is performed. In accordance with the third doping process, forth concentration impurity regions 167 to 172 are formed, in which the impurity element imparting conductivity opposite to the above conductivity is added to the semiconductor layer that becomes an active layer of the p-channel TFT. The third shape conductive layers 152 and 154 are used as masks to the impurity element, and the impurity element that imparts the p-type conductivity is added, to thereby form the forth concentration impurity regions in a self-aligning manner. In this embodiment, the fourth concentration impurity regions 167 to 172 are formed by an ion doping method using diborane ($B_2H_6$). In the third doping process, the semiconductor layer forming the n-channel TFT is covered with the masks 164 and 166 formed from resist. Although phosphorus is added to the forth concentration impurity regions 167 and 172 at different concentrations in accordance with the first and second doping processes, the doping process is performed such that the concentration of the impurity element imparting p-type conductivity is higher in any of the impurity regions. Thus, the impurity regions function as the source region and the drain region of the p-channel TFT so that no problem occurs.

In accordance with these processes, the impurity regions are formed on the respective semiconductor layers. In this embodiment, all the impurity regions are formed in a self-aligning manner, with the conductive layer as a mask. The third shape conductive layers 129, 130, 152, and 153 which overlap the semiconductor layers function as gate electrodes. Besides, the conductive layer 155 functions as source wiring and the conductive layer 154 functions as the capacitor wiring which is one of storage capacity.

Subsequently, the masks 164 and 166 consisting of resist are removed, and a first interlayer insulating film 173 covering the whole surface is formed. This first interlayer insulating film 173 is formed of an insulating film containing silicon with a thickness of 100 to 200 nm by a plasma CVD method or a sputtering method. In this embodiment, a silicon oxynitride film with a film thickness of 150 nm is formed by a plasma CVD method. Of course, the first interlayer insulating film 173 is not particularly limited to the silicon oxynitride film, and other insulating films containing silicon may be formed into a single layer or a lamination structure.

Then, as shown in FIG. 9B, a step of activating the impurity elements added in the respective semiconductor layers is performed. This step is carried out by thermal annealing using an annealing furnace. The thermal annealing may be performed in a nitrogen atmosphere having an oxygen concentration of 100 ppm or less, preferably 0.1 ppm or less and at 400 to 700° C., typically 500 to 550° C. Note that, in addition to the thermal annealing method, a laser annealing method, or a rapid thermal annealing method (RTA method) can be applied thereto.

Note that, in this embodiment, at the same time as the above activation process, nickel used as the catalyst for crystallization is gettered to the regions (145 to 149, 167, 170) containing phosphorus at a high concentration. As a result, mainly nickel concentration of the semiconductor layer which becomes a channel formation region is lowered. The TFT having a channel formation region thus formed is decreased in off current value, and has high electric field mobility because of good crystallinity, thereby attaining satisfactory characteristics.

Next, a second interlayer insulating film 174 made of an organic insulating material is formed on the first interlayer insulating film 173. Then, patterning is performed for forming a contact hole reaching the source wiring 155 and contact holes reaching the respective impurity regions 145, 147, 148a 167 and 170.

Then, in a driver circuit 406, wirings 175 to 180 electrically connected to the first concentration impurity region and the fourth concentration impurity region, respectively are formed. Note that, these wirings are formed by patterning a lamination film of a Ti film with a film thickness of 50 to 250 nm and an alloy film (alloy film of Al and Ti) with a film thickness of 300 to 500 nm.

Besides, in the pixel portion 1407, a pixel electrode 183, a gate wiring 182, and a connecting electrode 181 are formed (FIG. 9C). The source wiring 155 is electrically connected with the pixel TFT 1404 by the connecting electrode 181. Further, the gate wiring 182 is electrically connected with a third shape conductive layer 153 (a gate electrode of the pixel TFT). Furthermore, the pixel electrode 183 is electrically connected with the drain region of the pixel TFT and with the semiconductor layer functioning as one of electrodes forming a storage capacity. Preferably, as the pixel electrode 183, the film composed of Al or Ag as its main constituent, or a lamination film of the films, which is superior in reflection.

In the manner as described above, the driver circuit 1406 including an n-channel TFT 1401, a p-channel TFT 1402, and an n-channel TFT 1403, and the pixel portion 1407 including the pixel TFT 1404 and a storage capacitor 1405 can be formed on the same substrate. In this specification, such a substrate is called an active matrix substrate for convenience.

The n-channel TFT 1401 of the driver circuit 1406 includes a channel formation region 184, the third concentration impurity region 140 (GOLD region) overlapping with the third shape conductive layer 129 forming the gate electrode, the second concentration impurity region 135 (LDD region) formed outside the gate electrode, and the first concentration impurity region 145 functioning as a source region or a drain region. The p-channel TFT 1402 includes a channel formation region 185, forth concentration impurity regions 168 and 169, which are formed outside the gate electrode, and a forth concentration impurity region 167 functioning as a source region or a drain region. The n-channel TFT 1403 includes a channel formation region 186, the third concentration impurity region 142 (GOLD region) overlapping the third shape conductive layer 131 forming the gate electrode, the second concentration impurity region 137 (LDD region) formed outside the gate electrode, and the first concentration impurity region 147 functioning as a source region or a drain region.

The pixel TFT 1404 of the pixel portion includes a channel formation region 187, the third concentration impurity region 143 (LDD region) formed outside the gate electrode, the second concentration impurity region 138 (LDD region), and the first concentration impurity region 148a functioning as a source region or a drain region. Besides, impurity elements imparting p-type conductivity are added at the same concentration as the forth concentration impurity region to the respective semiconductor layers 170 to 172 functioning as one of electrodes of the storage capacitor 1405. The storage capacitor 1405 is formed by the capacitor wiring 154 and the semiconductor layers 170 to 172 with the insulating film (the same film as the gate insulting film) as a dielectric.

In this embodiment, an optimal structure is chosen for the respective TFTs constituting the circuits in accordance with circuit specifications required for the pixel portion and the driver circuit, so that the operation performance and the reliability of the semiconductor device are improved. Specifically, the LDD structure or the GOLD structure is chosen for an n-channel TFT according to the circuit specification. Thus a TFT structure giving priority to high-speed operation or hot carrier countermeasure and a TFT structure giving priority to low OFF current operation can be formed on the same substrate.

For instance, in the case of an active matrix liquid crystal display device, the n-channel TFTs 1401 and 1403 are suitable for driver circuits for which high-speed operation is more important, such as a shift register, a frequency dividing circuit, a signal dividing circuit, a level shifter, and a buffer. In other words, a TFT obtains a structure that places stress on hot carrier countermeasures by having a GOLD region.

The pixel TFT 1404 is an n-channel TFT having a structure that gives priority to low OFF current operation. This TFT is therefore applicable to a sampling circuit other than the pixel portion. The TFT has no GOLD region that can increase the OFF current value but has an LDD region and an offset region to obtain low OFF current operation. In addition, it has been confirmed that the first concentration impurity region 148b is very effective in reducing the OFF current value.

Figure 10:
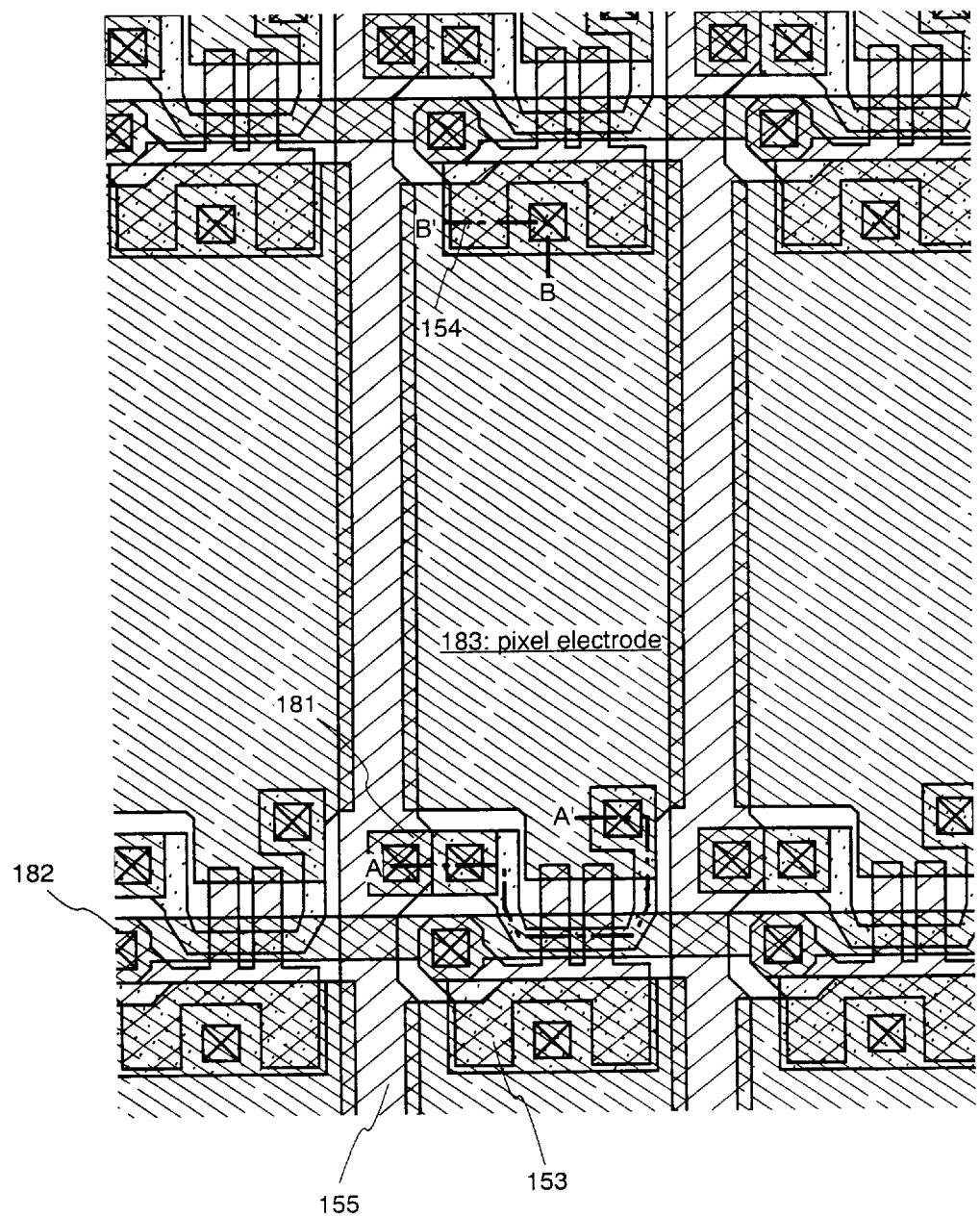
FIG. 10 is a diagram showing the top view of a semiconductor device according to the present invention.

FIG. 10 shows the top view of a pixel portion on an active matrix substrate fabricated in accordance with this embodiment. In FIG. 10, components corresponding to those in FIGS. 7A to 9C are denoted by the same reference symbols. The sectional view taken along the dot-dashed line A–A' in FIG. 10 corresponds to the one taken along the dot-dashed line A–A' in FIG. 9. The sectional view taken along the dot-dashed line B–B' in FIG. 10 corresponds to the one taken along the dot-dashed line B–B' in FIG. 9.

As illustrated in the drawings, the active matrix substrate having the pixel structure of this embodiment is characterized in that, the gate electrode 153 of the pixel TFT and the gate line 182 are formed in different layers so that the semiconductor layer is shielded from light by the gate line 182.

According to the pixel structure of this embodiment, the pixel electrodes are arranged so that edges of the pixel electrodes overlap the source wiring line in order to shield gaps between the pixel electrodes against light without using a black matrix.

The surfaces of the pixel electrodes according to this embodiment are desirably made uneven by a known method, e.g., the sand blast method or etching, in order to increase the white light level by preventing regular reflection and scattering the reflected light.

The pixel structure described above makes it possible to arrange pixel electrodes having a larger area to improve the aperture ratio.

The manufacture process shown in this embodiment requires only six photo masks to fabricate an active matrix substrate (namely, a semiconductor layer pattern ask, a first wiring line pattern mask (including the gate electrode 153 of the pixel TFT, he capacitor wiring line 154, and the source line 155), a pattern mask for forming conductive layers of the p-channel TFT and of the pixel portion TFT, a pattern mask for forming the source region and the drain region of the p-channel TFT, a pattern mask for forming contact holes, and a second wiring pattern mask (including the pixel electrode 183, the connector electrode 181, and the gate line 182)). Therefore this embodiment can contribute to cutting the process and the manufacture cost and improving the yield.

Figure 11:
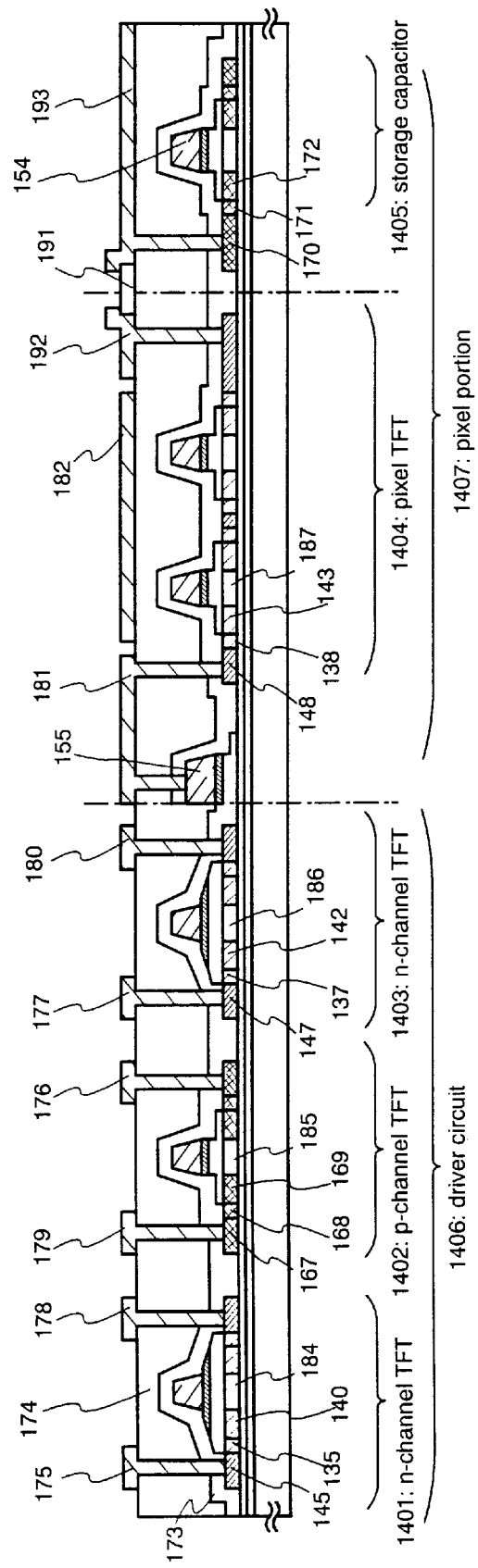
FIG. 11 is a diagram showing a sectional view of a semiconductor device according to the present invention.

FIG. 11 shows a sectional view of an active matrix substrate suitable for a transmissive liquid crystal display device. The manufacture process of this substrate is the same as the substrate for the above reflective liquid crystal display device up through the step of forming a second interlayer insulating film. On the second interlayer insulating film, a transparent conductive film is formed and then patterned to form a transparent conductive layer 191. The transparent conductive film may be formed of a compound of indium oxide and tin oxide, or a compound of indium oxide and zinc oxide.

In the driver circuit 1406, wiring lines 175 to 180 electrically connected to the first concentration impurity regions or the fourth concentration impurity regions are formed. The wiring lines are formed by patterning a laminate of a Ti film with a thickness of 50 to 250 nm and an alloy film (of Al and Ti) with a thickness of 300 to 500 nm. On the other hand, a pixel electrode 191, a gate line 182, and connector electrodes 192 and 193 are formed in the pixel portion 1407. The connector electrodes 192 and 193 are formed so as to overlap the pixel electrode 191. In this way, the active matrix substrate suitable for the transmissive liquid crystal display can be manufactured when one more mask is used.

TFTs according to this embodiment have displayed excellent characteristics. Of those, the pixel TFT is picked to show its TFT characteristic (the V-I characteristic), which is graphed in FIG. 37. The gate leak is also shown in the graph and it is sufficiently low. The pixel TFT structure of the present invention is particularly capable of lowering OFF current, and also rates well in terms of mobility. OFF current is a drain current flowing when a TFT is in an OFF state.

Figure 37:
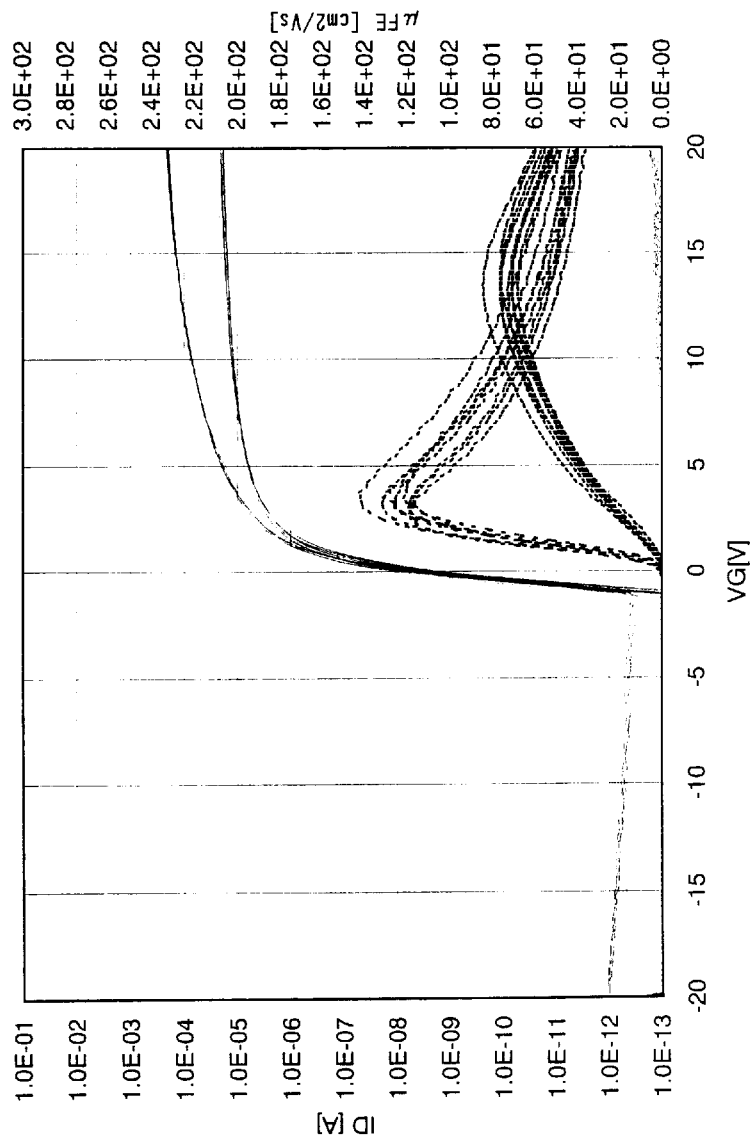
FIG. 37 is a graph showing the Id-Vg curve of a TFT manufactured in accordance with the present invention.
Figure 38:
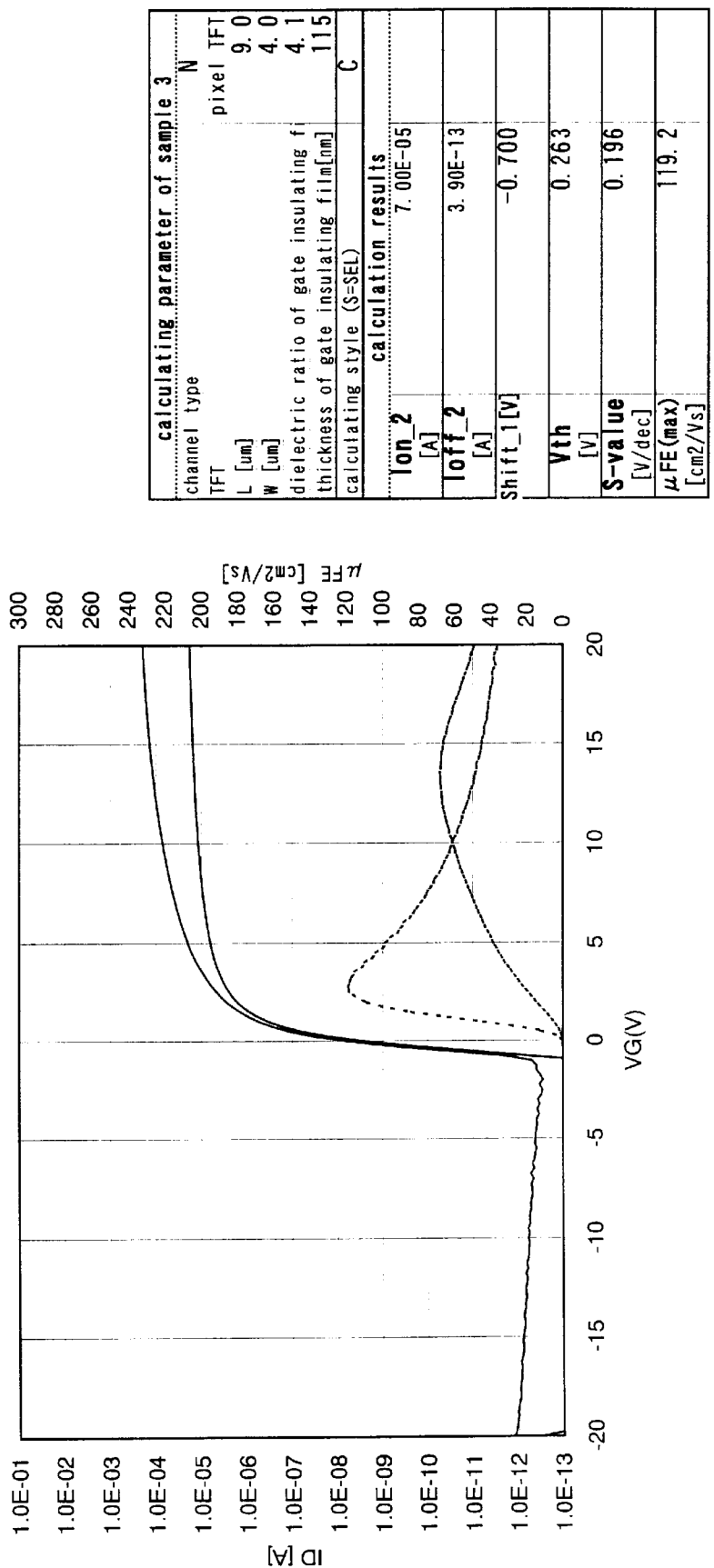
FIG. 38 is a graph showing the Id-Vg curve of a TFT manufactured in accordance with the present invention.

While FIG. 37 is a V-I characteristic graph of Samples 1 through 8, FIG. 38 shows the TFT characteristic of Sample 3.

Having the structure of the present invention, Sample 3 shows as small threshold (Vth) as 0.263 V, which is desirable (Vth is the voltage at the rising point in the V-I characteristic graph). The smaller the difference becomes, the more the short channel effect is contained. Sample 3 has a mobility of 119.2 cm$^2$/Vs, meaning it is also excellent in mobility ($\mu_{FE}$) that is a parameter indicating easiness for carriers to move. The S value (subthreshold coefficient), which is the reciprocal of the maximum inclination in the rising part of the I-V curve, is 0.196 V/decade in Sample 3. When VD=5V, OFF current ($I_{OFF2}$) is 0.39 pA, whereas ON current ($I_{ON2}$) is 70 µA. ON current is a drain current flowing when a TFT is in an ON state. Shift-1 denotes the voltage at the rising of the I-V curve.

As described above, employing the present invention results in a semiconductor device having excellent characteristics.

Embodiment 2

Figure 39:
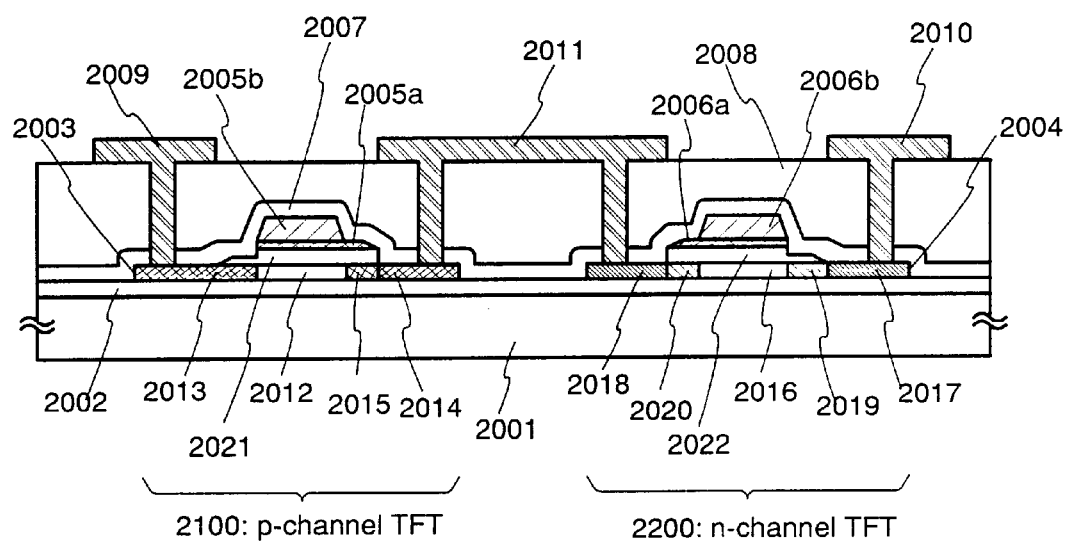
FIG. 39 is a diagram showing a sectional view of an inverter circuit.

FIG. 39 shows a p-channel TFT 2100 and an n-channel TFT 2200 of an inverter circuit manufactured in accordance with the present invention. These TFTs are formed on a base insulating film 2002 that is formed on a substrate 2001.

The p-channel TFT 2100 has a semiconductor layer 2003, a gate insulating film 2021, and a gate electrode that is composed of a first conductive layer 2005a and a second conductive layer 2005b. The semiconductor layer 2003 includes a channel formation region 2012, a source region 2013 connected with a source electrode 2009, a drain region 2014 connected with a drain electrode 2018, and an LDD region 2015 sandwiched between the drain region and the channel formation region. Reference symbols 2007 and 2008 denote first and second interlayer insulating films, respectively.

In the gate electrode, the end of the first conductive film 2005a and the end of the second conductive film 2005b almost coincide with each other on the source region side whereas the end of the first conductive film 2005a on the drain region side is extended outward. This structure is obtained by forming a resist mask in the third etching treatment shown in FIG. 8B so as to cover only one side of the gate electrode.

Thereafter, the semiconductor layer 2003 in the p-channel TFT is doped with a p type impurity element by ion doping or the like to form an impurity region in the semiconductor layer. The LDD region 2015 can be formed by using the first conductive film 2005a as a mask. In ion doping, it is possible to form the LDD region as well as the source region and the drain region in a single doping treatment by controlling the acceleration voltage. Instead, the doping treatment may be conducted twice while optimizing the acceleration voltage, so that formation of the LDD region is separated from formation of the source region and the drain region.

On the other hand, the n-channel TFT 2200 has a semiconductor layer 2004, a gate insulating film 2022, and a gate electrode that is composed of a first conductive film 2006a and a second conductive film 2006b. The semiconductor layer 2004 includes a channel formation region 2016, a source region 2017 connected with a source electrode 2010, a drain region 2018, and LDD regions 2019 and 2020.

Similar to the p-channel TFT, the end of the first conductive film 2006a and the end of the second conductive film 2006b in the gate electrode of the n-channel TFT 2200 almost coincide with each other on the source region side whereas the end of the first conductive film 2006a on the drain region side is extended outward. The LDD region 2019 on the source region side is an LDD region that does not overlap with the gate electrode, whereas the LDD region 2020 on the drain region side overlaps the gate electrode.

The LDD regions overlapping the gate electrodes are formed on the drain side in the p-channel TFT and the n-channel TFT as described above. This eases the electric field intensity near a drain and prevents degradation of a TFT due to hot carriers. The preventive effect is needed also in a p-channel TFT especially when the channel length is in submicron level.

However, an LDD region overlapping a gate electrode increases a parasitic capacitance applied to the gate electrode and hence is not always be provided on the source side where there is no need to ease electric field.

According to the present invention, it is possible to form the LDD region only on the drain side as shown in FIG. 39. Furthermore, the invention can readily be applied to the case of employing a minute design rule, because the source region, the drain region, and the LDD region are all formed in a self-aligning manner.

The TFT structure according to this embodiment can most effectively be applied to a TFT in which the position of a drain region is determined in advance as in an inverter circuit. The TFT structure of this embodiment can be combined freely with the manufacture process of Embodiment 1 by merely changing the resist mask pattern.

Embodiment 3

In the p-channel TFT and the n-channel TFT of the inverter circuit shown in Embodiment 2, degradation due to hot carriers is not noticeable when the driving voltage is 10 V or lower. Then the LDD region overlapping a gate electrode may not necessarily be formed. In this case, the p-channel TFT has the same structure as the p-channel TFT 402 shown in FIG. 11 while the n-channel TFT has the same structure as the n-channel TFT 404 shown in FIG. 11 and takes a single gate structure.

Embodiment 4

If the channel length is set to 0.6 µm or less in the active matrix substrate described in Embodiment 1, it is desirable to form the LDD region overlapping a gate electrode also in the p-channel TFT. In this case, the LDD region is formed in the same way as the LDD region of the n-channel TFT 1401 is formed to obtain the same structure, but is doped with a p type impurity element. The LDD region is provided only on the drain side as shown in Embodiment 2, if the direction of a source and a drain is already determined as in shift register circuits and buffer circuits.

Embodiment 5

This embodiment gives a description of a case of manufacturing TFTs in a different step other than Embodiment 1 with reference to FIGS. 12A and 12B. Embodiment 5 is merely different from Embodiment 1 in some steps and the rest is the same. Therefore the same reference symbols are used in the identical steps. The impurity elements used in doping are also the same.

First, the first etching treatment and the first doping treatment are conducted in accordance with the manufacture process shown in Embodiment 1 to reach the state illustrated in FIG. 7B.

Thereafter, etching is made under the second etching conditions without removing the resist masks 110 to 115. According to the second etching conditions, $CF_4$ and $Cl_2$ are used as the etching gas, the gas flow rate ratio of them is set to 30/30 SCCM, and an RF (13.56 MHz) power of 500 W is applied to a coiled electrode at a pressure of 1 Pa to generate plasma for 30 second etching. The substrate side (sample stage) also receives an RF (13.56 MHz) power of 20 W to apply a substantially negative self-bias voltage. The conductive film (A), i.e., the TaN film, and the conductive film (B), i.e., the W film are etched to the same extent under the second etching conditions using a mixture of $CF_4$ and $Cl_2$. As a result, a first shape gate electrode and wiring lines 217 to 223 are formed. The gate electrode is composed of first shape first conductive films 217*a* to 223*a* and first shape second conductive films 217*b* to 223*b*.

A second doping treatment is conducted without removing the resist masks 110 to 115. The semiconductor layers 102 to 106 are doped with an impurity element imparting n-type conductivity (hereinafter referred to as n type impurity element). The doping treatment is achieved by ion doping or ion implantation. The n type impurity element to be used is an element belonging to Group 15 in the periodic table, typically, phosphorus (P) or arsenic (As). In this treatment, the first shape gate electrode and capacitance wiring lines 217 to 221 serve as masks to form first concentration impurity regions 224*a* to 224*e* in a self-aligning manner (FIG. 12A).

Still keeping the resist masks 110 to 115 in place, a third etching treatment is conducted. $CF_4$, $Cl_2$, and $O_2$ are used as the etching gas, the gas flow rate ratio of them is set to 20/20/20 SCCM, and an RF (13.56 MHz) power of 500 W is applied to a coiled electrode at a pressure of 1.0 Pa to generate plasma for the etching. The substrate side (sample stage) receives an RF (13.56 MHz) power of 20 W for 80 second etching treatment. As a result, a second shape gate electrode and wiring lines 225 to 231 are formed. The gate electrode is composed of second shape first conductive films 225*a* to 231*a* and second shape second conductive films 225*b* to 231*b*.

Then a third doping treatment is conducted without removing the resist masks 110 to 115. In the third doping treatment, the semiconductor layers under the second shape first conductive films (TaN films) are also doped with an n type impurity element while using the second shape conductive layer and capacitance wiring lines 225 to 229 as masks. Formed as a result of this treatment between the first concentration impurity regions and the channel formation regions are second concentration impurity regions 232*a* to 232*e* each containing the n type impurity element in a concentration of $1 \times 10^{18}$ to $1 \times 10^{19}$ atoms/cm$^3$. The first concentration impurity regions 224*a* to 224*e* each contain the n type impurity element in a concentration of $1 \times 10^{20}$ to $1 \times 10^{21}$ atoms/cm$^3$ (FIG. 12B).

Figure 13A:
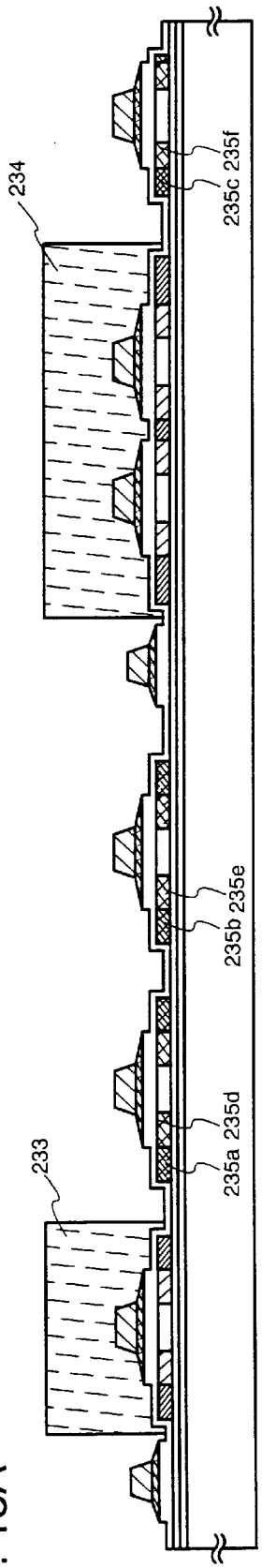
FIGS. 13A and 13B are diagrams showing a process of manufacturing a semiconductor device according to the present invention.

Next, the resist masks 110 to 115 are removed and masks 233 to 234 for covering a future n-channel TFT and a future pixel TFT are formed from a resist to conduct a fourth doping treatment. The semiconductor layers are doped with a p type impurity element in a future first p-channel TFT and in a future second p-channel TFT while using the second shape conductive layers 226 and 227 and the capacitance wiring line 229 as masks. Fourth concentration impurity regions 235*a* to 235*c* and fifth concentration impurity regions 235*d* to 235*f* are thus formed in a self-aligning manner. In this embodiment, p type impurity regions are formed by ion doping using diborane ($B_2H_6$). The fourth concentration impurity regions ($P^{+}$ $^{235}a$ to 235*c* each contain the p type impurity element in a concentration of $2 \times 10^{20}$ to $1 \times 10^{21}$ atoms/cm$^3$. The fifth concentration impurity regions 235*d* to 235*f* each contain the p type impurity element in a concentration of $2 \times 10^{17}$ to $1 \times 10^{19}$ atoms/cm$^3$. Although the semiconductor layers of the p-channel TFTs have previously been doped with the n type impurity element, the layers do not have a problem to function as source regions and drain regions of the future p-channel TFTs if they are doped with the p type impurity element in the fourth doping treatment in a concentration higher than the concentration of the n type impurity element (FIG. 13A).

Figure 13B:
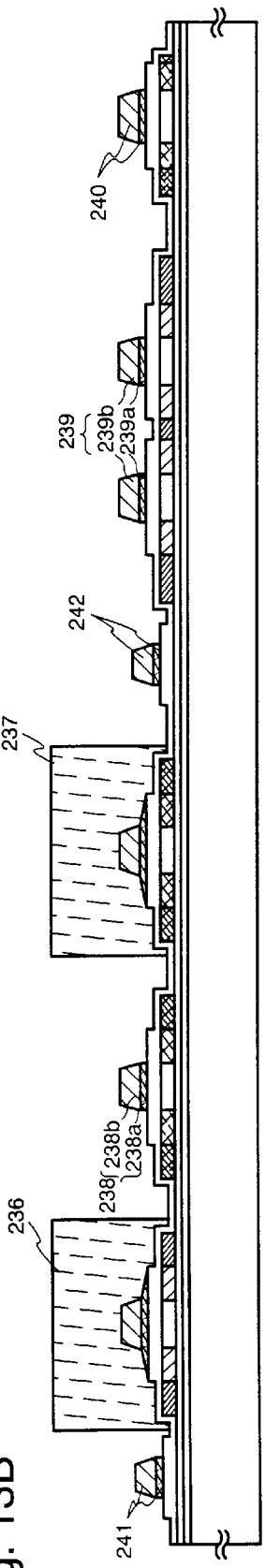

Resist masks 236 and 237 are then used to cover the n-channel TFT and the first p-channel TFT of the driver circuit to conduct a fourth etching treatment. $Cl_2$ is used as the etching gas, the gas flow rate thereof is set to 80 SCCM, and an RF power of 350 W is applied to a coiled electrode at a pressure of 1.2 Pa to generate plasma for 30 second etching. The substrate (sample stage) side receives an RF (13.56 MHz) power of 50 W to apply a substantially negative self-bias voltage. Thus formed in the second p-channel TFT of the driver circuit and in the pixel TFT of the pixel portion third shape conductive layers (composed of third shape first conductive films 238*a* and 239*a* and third shape second conductive films 238*b* and 239*b*) 238 and 239, a capacitance wiring line 240, and wiring lines 241 and 242 (FIG. 13B). Through the above treatment, the exposed portions of the gate insulating film on which the third shape conductive layers are not formed have obtained a thickness of about 30 nm in the pixel portion and a thickness of about 40 nm in the driver circuit.

The impurity regions are formed in the respective semiconductor layers through the above steps. For the subsequent steps to complete the active matrix substrate, see the step of forming an inorganic interlayer insulating film and the following steps thereof disclosed in Embodiment 1.

This embodiment can readily be carried out by manufacturing a TFT in accordance with the manufacture process disclosed in Embodiment 1. Although this embodiment describes only the structure of the pixel TFT and the control circuit, other circuits can also be formed on the same substrate when following the manufacture process of Embodiment 1. Examples of the other circuits include a signal dividing circuit, a frequency dividing circuit, a D/A converter circuit, an operation amplifier circuit, a y correction circuit, and a signal processing circuit (also called a logic circuit) such as a memory circuit and a microprocessor circuit.

Embodiment 6

Figure 14A:
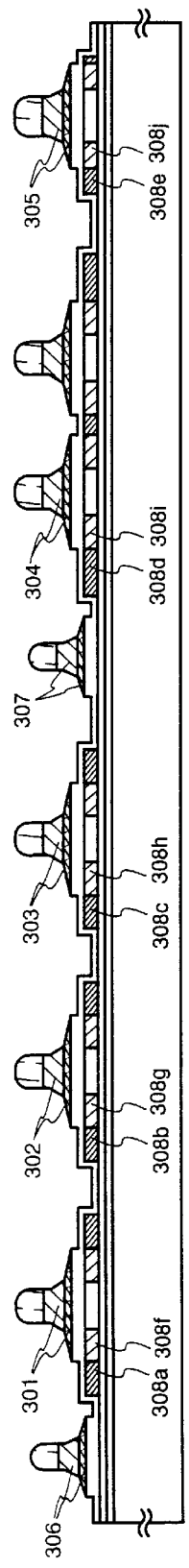
FIGS. 14A to 14C are diagrams showing a process of manufacturing a semiconductor device according to the present invention.
Figure 14B:
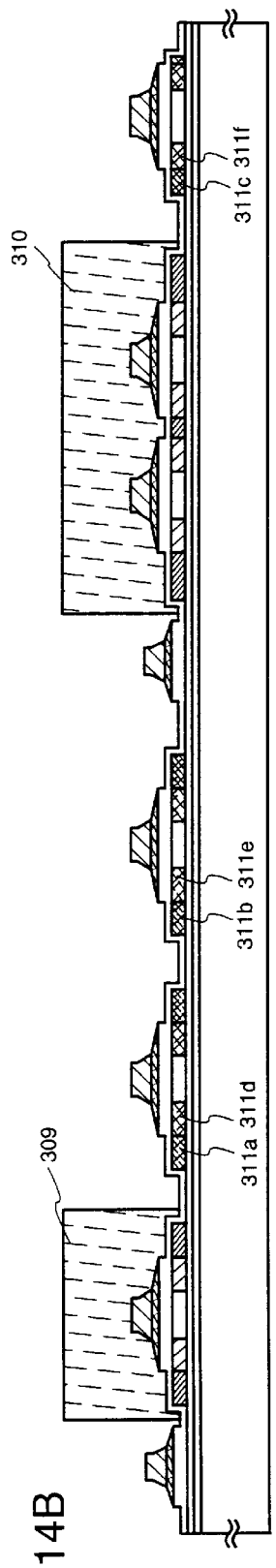
Figure 14C:
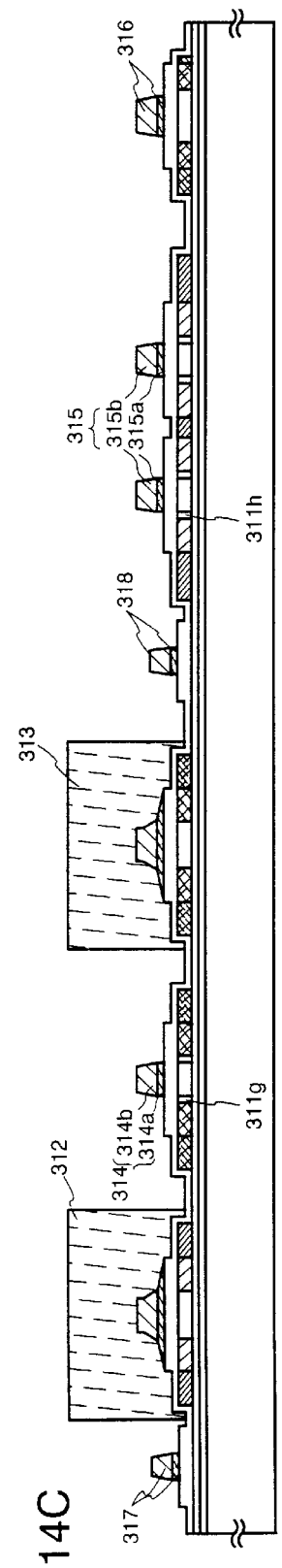

This embodiment gives a description of a case of manufacturing TFTs in a different step other than Embodiment 1 with reference to FIGS. 14A to 14C. Embodiment 6 is merely different from Embodiment 1 in some steps and the rest is the same. Therefore the same reference symbols are used in the identical steps. The impurity elements used in doping are also the same.

First, the first etching treatment and the first doping treatment are conducted in accordance with the manufacture process shown in Embodiment 1 to reach the state illustrated in FIG. 7B. Thereafter, a second etching treatment is conducted. $CF_4$, $Cl_2$ and $O_2$ are used as the etching gas, the gas flow rate ratio of them is set to 20/20/20 SCCM, and an RF (13.56 MHz) power of 500 W is applied to a coiled electrode at a pressure of 1.0 Pa to generate plasma for 60 second etching. The substrate (sample stage) side also receives an RF (13.56 MHz) power of 20 W to apply a substantially negative self-bias voltage. As a result of the second etching treatment, second shape conductive layers 301 to 304 and wiring lines 305 to 307 are formed.

Next, the semiconductor layers are doped with an n type impurity element through the second shape first conductive films in a self-aligning manner while using the second shape second conductive films as masks. Formed as a result of this treatment between the channel formation regions and first concentration impurity regions 308a to 308e are second concentration impurity regions 308f to 308j each containing the n type impurity element in a concentration of $1 \times 10^{18}$ to $1 \times 10^{19}$ atoms/cm$^3$. At this point, the first concentration impurity regions 308a to 308e each contain the n type impurity element in a concentration of $1 \times 10^{20}$ to $1 \times 10^{21}$ atoms/cm$^3$.

Then the resist masks 110 to 115 are removed. Thereafter, masks 309 and 310 for covering the n-channel TFT and the pixel TFT are newly formed from a resist to conduct a third doping treatment. Through the third doping treatment, the semiconductor layers in the p-channel TFTs are doped with a p type impurity element in a self-aligning manner while using the second shape conductive layers as masks. Fourth concentration impurity regions 311a to 311c and fifth concentration impurity regions 311d to 311f are thus formed (FIG. 14B).

The resist masks 309 and 310 are removed, and masks 312 and 313 are newly formed from a resist to cover the n-channel TFT and the second p-channel TFT. $Cl_2$ is used as the etching gas, the gas flow rate thereof is set to 80 SCCM, and an RF (13.56 MHz) power of 500 W is applied to a coiled electrode at a pressure of 1.2 Pa to generate plasma for 40 second etching. The substrate (sample stage) side receives an RF (13.56 MHz) power of 10 W to apply a substantially negative self-bias voltage. Thus formed in the first p-channel TFT and in the pixel TFT are third shape conductive layers (composed of third shape first conductive films 314a and 315a and third shape second conductive films 314b and 315b) 314 and 315, and wiring lines 316 to 318 (FIG. 14C).

Through the third etching treatment, offset regions 311g and 311h are formed in the semiconductor layers of the first p-channel TFT and of the pixel TFT, respectively. An offset region in this specification refers to a semiconductor layer having the same composition as a channel formation region (meaning, the region contains the same impurity element as the channel formation region), and the region does not overlap a gate electrode. The offset regions 311g and 311h function as simple resistors and are very effective in reducing the OFF current value.

For the subsequent steps to complete the active matrix substrate, see the step of forming an inorganic interlayer insulating film and the following steps thereof disclosed in Embodiment 1.

This embodiment can readily be carried out by manufacturing a TFT in accordance with the manufacture process disclosed in Embodiment 1. Although this embodiment describes only the structure of the pixel TFT and the control circuit, other circuits can also be formed on the same substrate when following the manufacture process of Embodiment 1. Examples of the other circuits include a signal dividing circuit, a frequency dividing circuit, a D/A converter circuit, an operation amplifier circuit, a y correction circuit, and a signal processing circuit (also called a logic circuit) such as a memory circuit and a microprocessor circuit.

Embodiment 7

This embodiment gives a description of a case of manufacturing TFTs in a different step other than Embodiment 1 with reference to FIGS. 15A to 15C. Embodiment 7 is merely different from Embodiment 1 in some steps and the rest is the same. Therefore the same reference symbols are used in the identical steps.

First, the first etching treatment and the first doping treatment are conducted in accordance with the manufacture process shown in Embodiment 1 to reach the state illustrated in FIG. 7B. Thereafter, a second etching treatment is conducted. In the second etching treatment, $CF_4$, $Cl_2$ and $O_2$ are used as the etching gas, the gas flow rate ratio of them is set to 20/20/20 SCCM, and an RF (13.56 MHz) power of 500 W is applied to a coiled electrode at a pressure of 1.0 Pa to generate plasma for 80 second etching. The substrate (sample stage) side receives an RF (13.56 MHz) power of 20 W to apply a substantially negative self-bias voltage. Thus second shape conductive layers and wiring lines are formed.

Next, the n-channel TFT and the pixel TFT are covered with resist masks 401 and 402, respectively, to conduct a second doping treatment. Through the second doping treatment, the semiconductor layers in the p-channel TFTs are doped with a p type impurity element. The semiconductor layers are doped with the p type impurity element through the second shape first conductive films in a self-aligning manner while using the second shape second conductive films as masks. As a result, fourth concentration impurity regions 403a to 403c and fifth concentration impurity regions 403d to 403f are formed (FIG. 15A).

The n-channel TFT and the second p-channel TFT are then covered with resist masks 404 and 405, respectively, to conduct a third etching treatment. $Cl_2$ is used as the etching gas, the gas flow rate thereof is set to 80 SCCM, and an RF (13.56 MHz) power of 500 W is applied to a coiled electrode at a pressure of 1.2 Pa to generate plasma for 40 second etching. The substrate (sample stage) side receives an RF (13.56 MHz) power of 20 W to apply a substantially negative self-bias voltage. Thus third shape conductive layers 406 and 407 and wiring lines 408 to 410 are formed (FIG. 15B).

Next, the resist masks 404 and 405 are removed to conduct a third doping treatment. In the third doping treatment, the semiconductor layers are doped with an n type impurity element to form impurity regions 411a and 411b. The semiconductor layers in the p-channel TFTs do not have a problem to function as source regions and drain regions of the p-channel TFTs because the regions have already been doped with the p type impurity element in a concentration higher than the concentration of the n type impurity element (FIG. 15C).

After finishing the steps described above, the active matrix substrate is completed in accordance with the step of forming an inorganic interlayer insulating film and the following steps thereof disclosed in Embodiment 1.

This embodiment can readily be carried out by manufacturing a TFT in accordance with the manufacture process disclosed in Embodiment 1. Although this embodiment describes only the structure of the pixel TFT and the control circuit, other circuits can also be formed on the same substrate when following the manufacture process of Embodiment 1. Examples of the other circuits include a signal dividing circuit, a frequency dividing circuit, a D/A converter circuit, an operation amplifier circuit, a γ correction circuit, and a signal processing circuit (also called a logic circuit) such as a memory circuit and a microprocessor circuit.

Embodiment 8

This embodiment gives a description of a case of manufacturing TFTs in a different step other than Embodiment 1 with reference to FIGS. 16A to 16C. Embodiment 8 is merely different from Embodiment 1 in some steps and the rest is the same. Therefore the same reference symbols are used in the identical steps.

First, the second etching treatment and the second doping treatment are conducted in accordance with the manufacture process shown in Embodiment 1 to reach the state illustrated in FIG. 7C.

Next, a mask 501 is formed from a resist to cover the n-channel TFT and a third etching treatment is conducted. In the third etching treatment, $Cl_2$ is used as the etching gas, the gas flow rate thereof is set to 80 SCCM, and an RF (13.56 MHz) power of 350 W is applied to a coiled electrode at a pressure of 1.2 Pa to generate plasma for 40 second etching. The substrate (sample stage) side receives an RF (13.56 MHz) power of 50 W to apply a substantially negative self-bias voltage. Thus third shape conductive layers and wiring lines 502 to 507 are formed (FIG. 16B).

After the resist mask is removed, the gate insulating film is etched. $CHF_3$ is used as the etching gas, the gas flow rate thereof is set to 35 SCCM, and an RF (13.56 MHz) power of 800 W is applied to generate plasma for the etching. The substrate (sample stage) side receives an RF (13.56 MHz) power of 20 W to apply a substantially negative self-bias voltage. Here, the second shape gate electrode serves as a mask for the n-channel TFT whereas the third shape conductive layers and the capacitance wiring lines serve as masks for the other TFTs, and portions of the gate insulating film are cut off for each TFT to form gate insulating films 508 to 514 (FIG. 16C).

Figure 17:
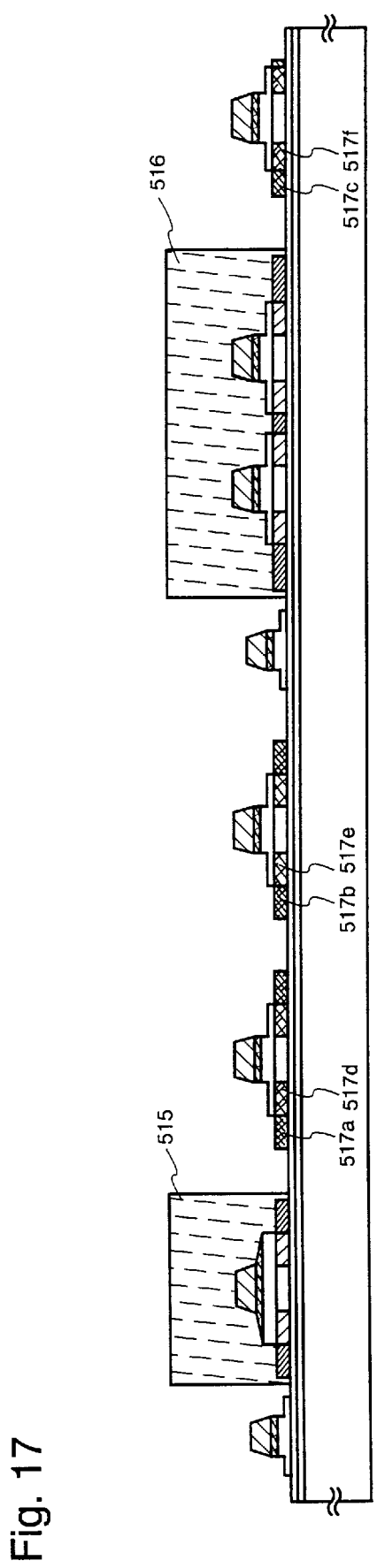
FIG. 17 is a diagram showing a process of manufacturing a semiconductor device according to the present invention.

Then masks 515 and 516 are newly formed from a resist to conduct a third doping treatment. Through the third doping treatment, the semiconductor layers in the p-channel TFTs are doped with a p type impurity element while using the third shape gate electrode and capacitance wiring lines as masks. Fourth concentration impurity regions 517a to 517c and fifth concentration impurity regions 517d to 517f are thus formed in a self-aligning manner (FIG. 17).

After finishing the steps described above, the active matrix substrate is completed in accordance with the step of forming an inorganic interlayer insulating film and the following steps thereof disclosed in Embodiment 1.

This embodiment can readily be carried out by manufacturing a TFT in accordance with the manufacture process disclosed in Embodiment 1. Although this embodiment describes only the structure of the pixel TFT and the control circuit, other circuits can also be formed on the same substrate when following the manufacture process of Embodiment 1. Examples of the other circuits include a signal dividing circuit, a frequency dividing circuit, a D/A converter circuit, an operation amplifier circuit, a γ correction circuit, and a signal processing circuit (also called a logic circuit) such as a memory circuit and a microprocessor circuit.

Embodiment 9

Figure 18A:
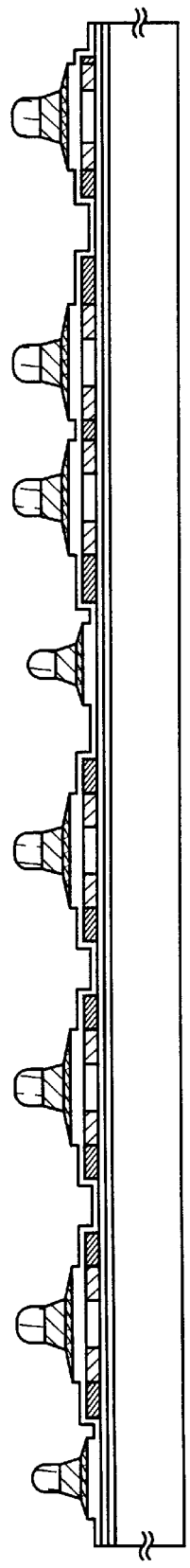
FIGS. 18A to 18C are diagrams showing a process of manufacturing a semiconductor device according to the present invention.
Figure 18B:
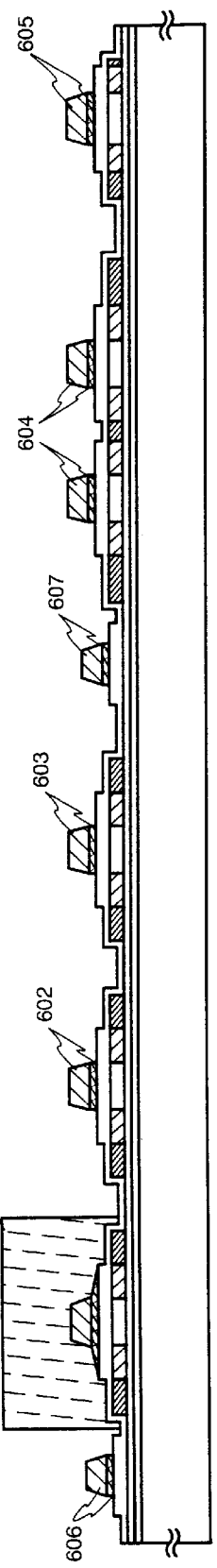
Figure 18C:
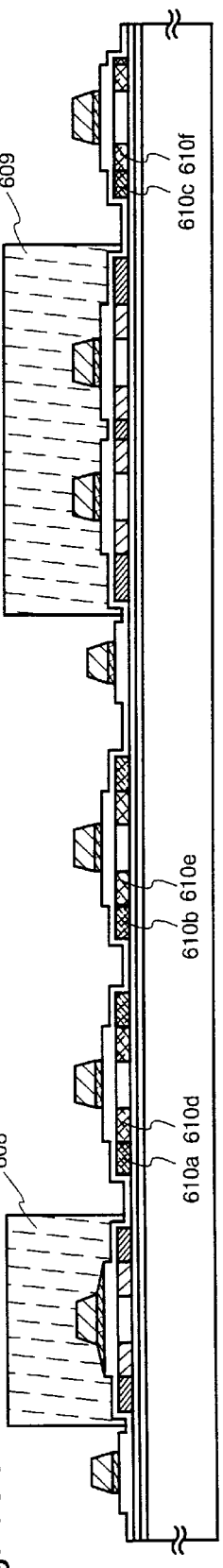

This embodiment gives a description of a case of manufacturing TFTs in a different step other than Embodiment 1 with reference to FIGS. 18A to 18C. Embodiment 9 is merely different from Embodiment 1 in some steps and the rest is the same. Therefore the same reference symbols are used in the identical steps.

First, the second etching treatment and the second doping treatment are conducted in accordance with the manufacture process shown in Embodiment 1 to reach the state of FIG. 7C where the second shape conductive layers and wiring lines are formed.

Next, the n-channel TFT is covered with a resist mask 601 to conduct a third etching treatment. $Cl_2$ is used as the etching gas, the gas flow rate thereof is set to 80 SCCM, and an RF (13.56 MHz) power of 350 W is applied to a coiled electrode at a pressure of 1.2 Pa to generate plasma for 40 second etching. The substrate (sample stage) side receives an RF (13.56 MHz) power of 50 W to apply a substantially negative self-bias voltage. Thus third shape conductive layers and wiring lines 602 to 607 are formed (FIG. 18B).

The resist mask 601 is then removed and masks 608 and 609 are newly formed from a resist to cover the n-channel TFT and the pixel TFT, respectively. A third doping treatment is conducted and the semiconductor layers are doped with a p type impurity element to form fourth concentration p type impurity regions 610a to 610c and fifth concentration impurity regions 610d to 610f (FIG. 18C).

After finishing the steps described above, the active matrix substrate is completed in accordance with the step of forming an inorganic interlayer insulating film and the following steps thereof disclosed in Embodiment 1.

This embodiment can readily be carried out by manufacturing a TFTs in accordance with the manufacture process disclosed in Embodiment 1. Although this embodiment describes only the structure of the pixel TFT and the control circuit, other circuits can also be formed on the same substrate when following the manufacture process of Embodiment 1. Examples of the other circuits include a signal dividing circuit, a frequency dividing circuit, a D/A converter circuit, an operation amplifier circuit, a y correction circuit, and a signal processing circuit (also called a logic circuit) such as a memory circuit and a microprocessor circuit.

Embodiment 10

Figure 19A:
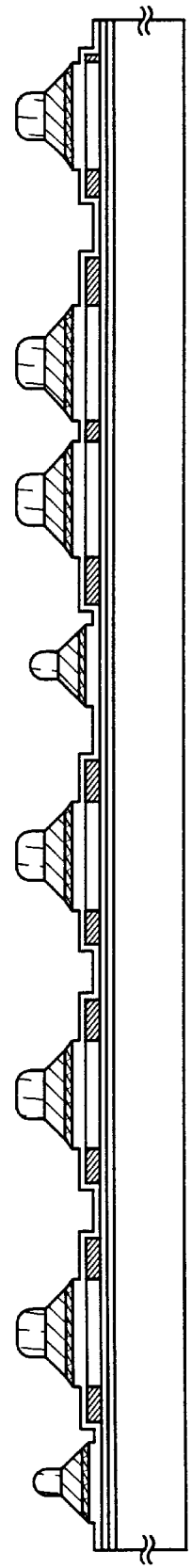
FIGS. 19A to 19C are diagrams showing a process of manufacturing a semiconductor device according to the present invention.
Figure 19B:
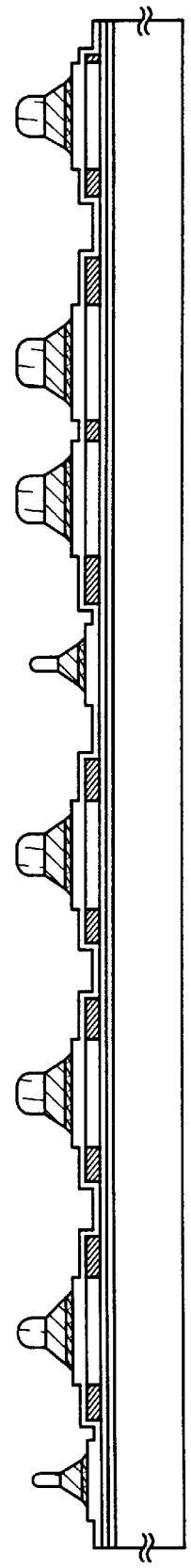
Figure 19C:
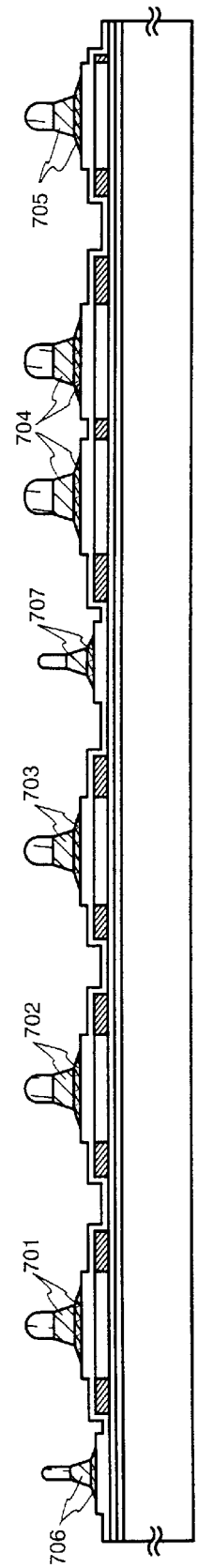

This embodiment gives a description of a case of manufacturing TFTs in a different step other than Embodiment 1 with reference to FIGS. 19A to 19C. Embodiment 10 is merely different from Embodiment 1 in some steps and the rest is the same. Therefore the same reference symbols are used in the identical steps.

First, the first etching treatment and the first doping treatment are conducted in accordance with the manufacture process shown in Embodiment 1 to reach the state illustrated in FIG. 7B. A second etching treatment is conducted next.

First etching conditions for the second etching treatment are as follows: $CF_4$ and $Cl_2$ are used as the etching gas, the gas flow rate ratio of them is set to 30/30 SCCM, and an RF (13.56 MHz) power of 500 W is applied to a coiled electrode at a pressure of 1.0 Pa to generate plasma for 30 second etching. The substrate (sample stage) side receives an RF (13.56 MHz) power of 20 W to apply a substantially negative self-bias voltage (FIG. 19B). The treatment is then followed by etching under second etching conditions: $CF_4$, $Cl_2$ and $O_2$ are used as the etching gas, the gas flow rate ratio of them is set to 20/20/20/ SCCM, ax and an RF (13.56 MHz) power of 500 W is applied to a coiled electrode at a pressure of 1.0 Pa to generate plasma for 60 second etching. The substrate (sample stage) side receives an RF (13.56 MHz) power of 20 W to apply a substantially negative self-bias voltage. Thus second shape conductive layers and wiring lines 701 to 707 are formed (FIG. 19C).

Figure 20A:
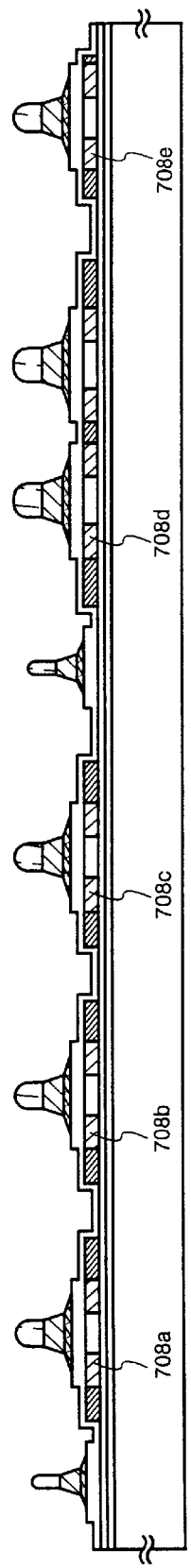
FIGS. 20A to 20C are diagrams showing a process of manufacturing a semiconductor device according to the present invention.

A second doping treatment is conducted next. The semiconductor layers are doped with an n type impurity element while using the second shape gate electrode and capacitance wiring lines as masks. As a result, second concentration impurity regions 708a to 708e each containing the n type impurity element in a concentration of $1\times10^{18}$ to $1\times10^{19}$ atoms/cm$^3$ are formed in a self-aligning manner. At this point, the first concentration impurity regions each contain the n type impurity element in a concentration of $1\times10^{20}$ to $1\times10^{21}$ atoms/cm$^3$ (FIG. 20A).

In this embodiment, the second etching treatment is divided into two stages to etch the conductive films. The etching treatment under the first conditions removes the edges of the first conductive films. This results in formation of $L_{ov}$ regions in which the gate electrode overlaps the second concentration impurity regions with the gate insulating film interposed therebetween and $L_{off}$ regions 719 in which the gate electrode does not overlap the second concentration impurity regions.

Figure 20B:
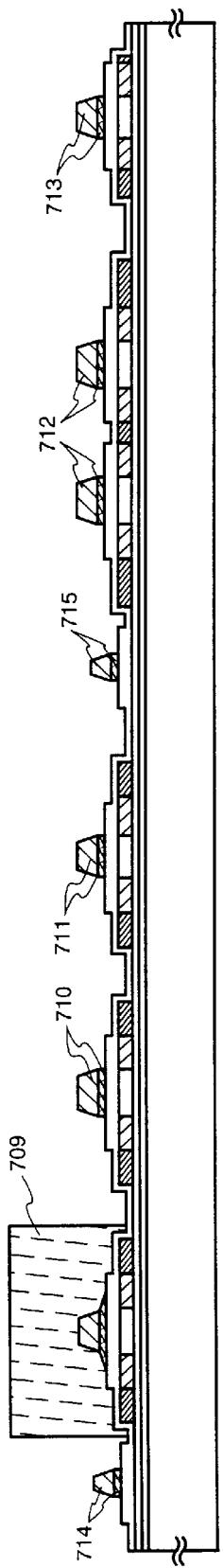

Next, a mask 709 is formed from a resist and covers the n-channel TFT to conduct a third etching treatment. In the third etching treatment, $Cl_2$ is used as the etching gas, the gas flow rate thereof is set to 80 SCCM, and an RF (13.56 MHz) power of 350 W is applied to a coiled electrode at a pressure of 1.2 Pa to generate plasma for 40 second etching. The substrate (sample stage) side receives an RF (13.56 MHz) power of 50 W to apply a substantially negative self-bias voltage. Thus third shape conductive layers and wiring lines 710 to 715 are formed (FIG. 20B).

Figure 20C:
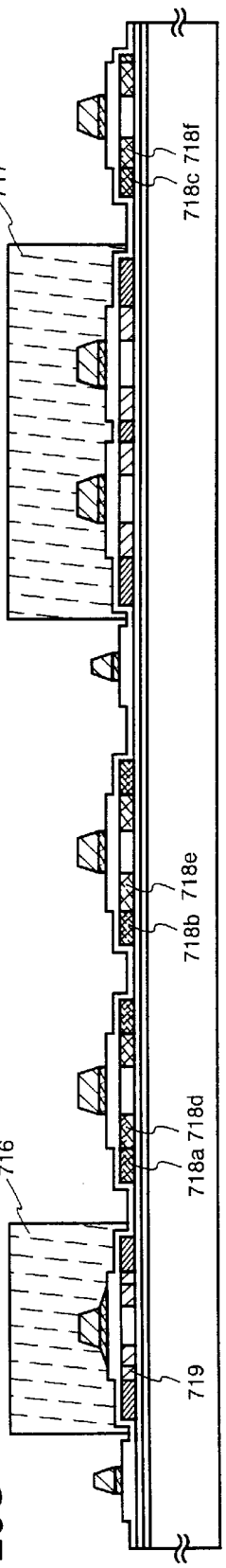

Masks 716 and 717 are newly formed from a resist to cover the n-channel TFT and the pixel TFT, respectively, in preparation for a third doping treatment. Through the third doping treatment, the semiconductor layers in the p-channel TFTs are doped with a p type impurity element while using the third shape conductive layers and the capacitance wiring lines as masks. Fourth concentration impurity regions 718a to 718c and fifth concentration impurity regions 718d to 718f are thus formed in a self-aligning manner (FIG. 20C).

After finishing the steps described above, the active matrix substrate is completed in accordance with the step of forming an inorganic interlayer insulating film and the following steps thereof disclosed in Embodiment 1.

This embodiment can readily be carried out by manufacturing a TFT in accordance with the manufacture process disclosed in Embodiment 1. Although this embodiment describes only the structure of the pixel TFT and the control circuit, other circuits can also be formed on the same substrate when following the manufacture process of Embodiment 1. Examples of the other circuits include a signal dividing circuit, a frequency dividing circuit, a D/A converter circuit, an operation amplifier circuit, a y correction circuit, and a signal processing circuit (also called a logic circuit) such as a memory circuit and a microprocessor circuit.

Embodiment 11

Figure 21A:
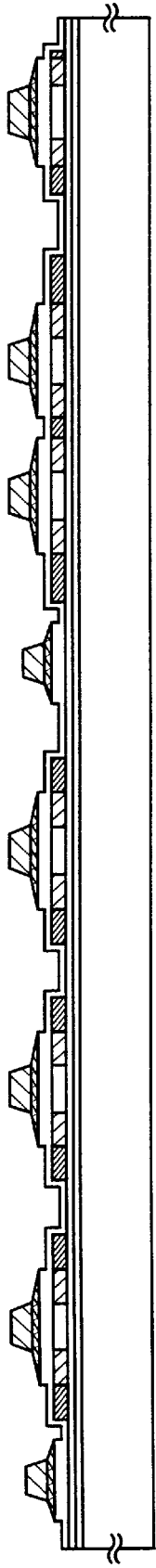
FIGS. 21A to 21C are diagrams showing a process of manufacturing a semiconductor device according to the present invention.
Figure 21B:
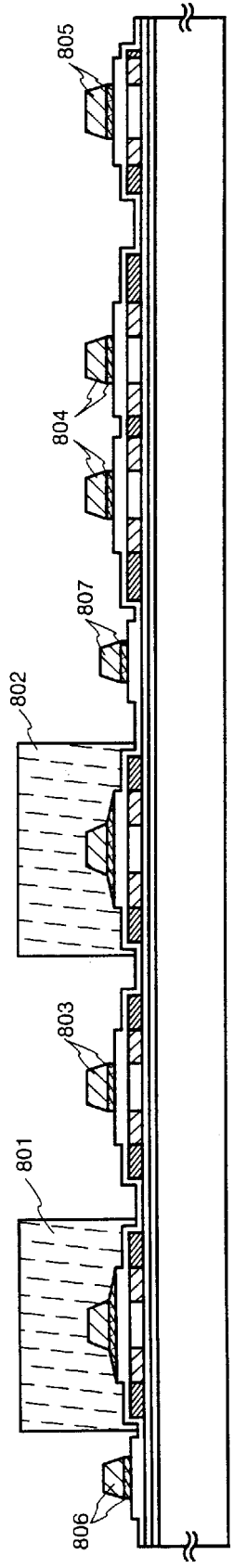
Figure 21C:
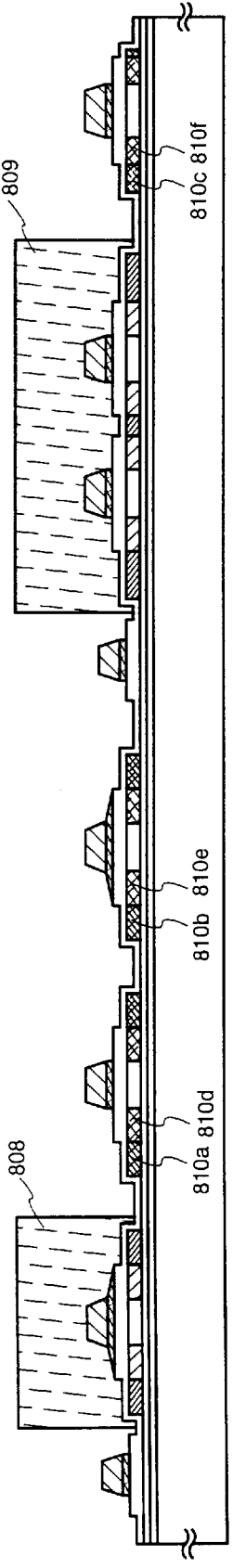

This embodiment gives a description of a case of manufacturing TFTs in a different step other than Embodiment 1 with reference to FIGS. 21A to 21C. Embodiment 11 is merely different from Embodiment 1 in some steps and the rest is the same. Therefore the same reference symbols are used in the identical steps.

First, the second etching treatment and the second doping treatment are conducted in accordance with the manufacture process shown in Embodiment 1 to reach the state of FIG. 7C where the second shape conductive layers and the wiring lines are formed.

Next, resist masks 801 and 802 are formed to cover the future n-channel TFT and the future second p-channel TFT, respectively, and a third etching treatment is conducted. In the third etching treatment, $Cl_2$ is used as the etching gas, the gas flow rate thereof is set to 80 SCCM, and an RF (13.56 MHz) power of 350 W is applied to a coiled electrode at a pressure of 1.2 Pa to generate plasma for 40 second etching. The substrate (sample stage) side receives an RF (13.56 MHz) power of 50 W to apply a substantially negative self-bias voltage. Thus third shape conductive layers and wiring lines 803 to 807 are formed (FIG. 21B).

After the resist masks 801 and 802 are removed, masks 808 and 809 are newly formed from a resist to cover the n-channel TFT and the pixel TFT, respectively. A third doping treatment is conducted. Through the third doping treatment, the semiconductor layers in the p-channel TFTs are doped with a p type impurity element while using the third shape conductive layers and the capacitance wiring lines as masks. Fourth concentration impurity regions 810a to 810c and fifth concentration impurity regions 810d to 810f are thus formed in a self-aligning manner (FIG. 21C).

After finishing the steps described above, the active matrix substrate is completed in accordance with the step of forming an inorganic interlayer insulating film and the following steps thereof disclosed in Embodiment 1.

Embodiment 12

This embodiment shows results of measuring characteristics of TFTs manufactured in accordance with manufacture methods disclosed in this specification.

Figure 40:
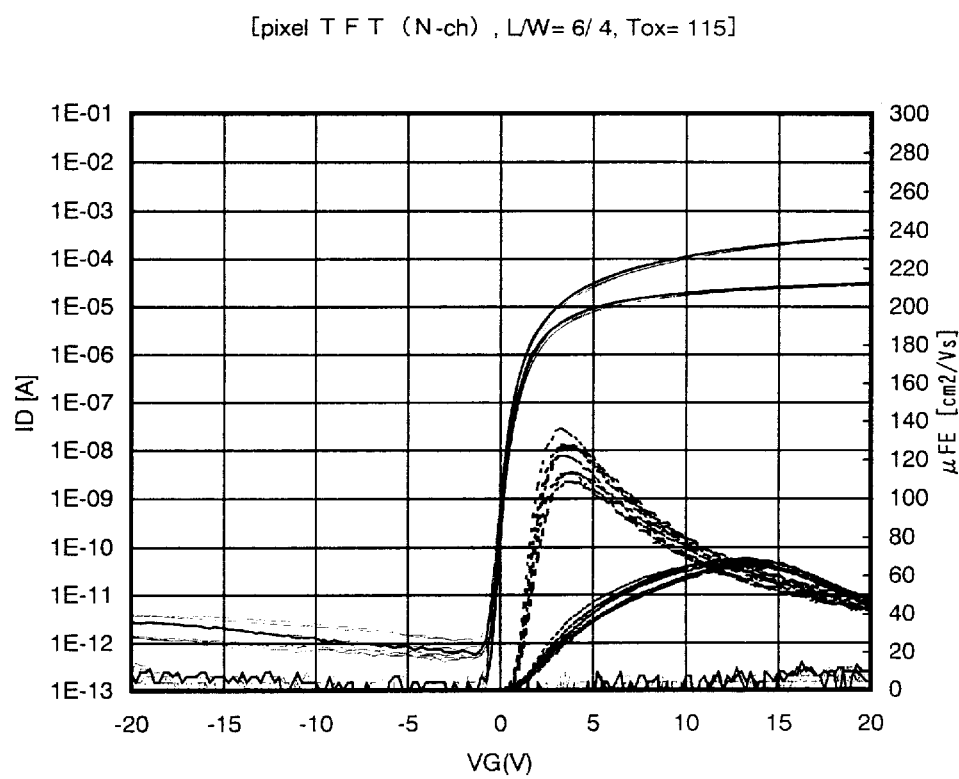
FIG. 40 is a graph showing the Id-Vg curve of a TFT manufactured in accordance with the present invention.

First, FIG. 40 shows a graph representing a relation between the drain current (Id) and the gate voltage (Vg) (hereinafter referred to as Id-Vg curve) of a pixel TFT (n-channel TFT) manufactured in accordance with the manufacture method described in Embodiment 5. The measurement has been made by setting the source voltage (Vs) to 0 V and the drain voltage (Vd) to 1 V or 14 V. The measured value of the channel length (L) is 6 µm and the measured value of the channel width (W) is 4 µm.

OFF current (Ioft) is 0.5 pA when Vd is 14 V.

Figure 41A:
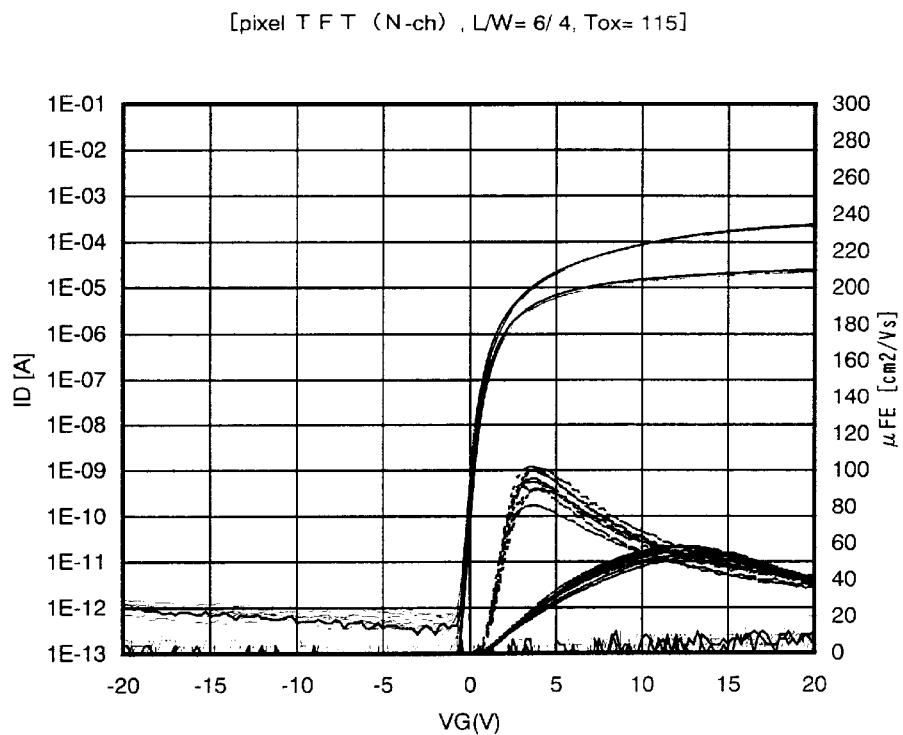
FIGS. 41A and 41B are graphs showing the Id-Vg curve of TFTs manufactured in accordance with the present invention.
Figure 41B:
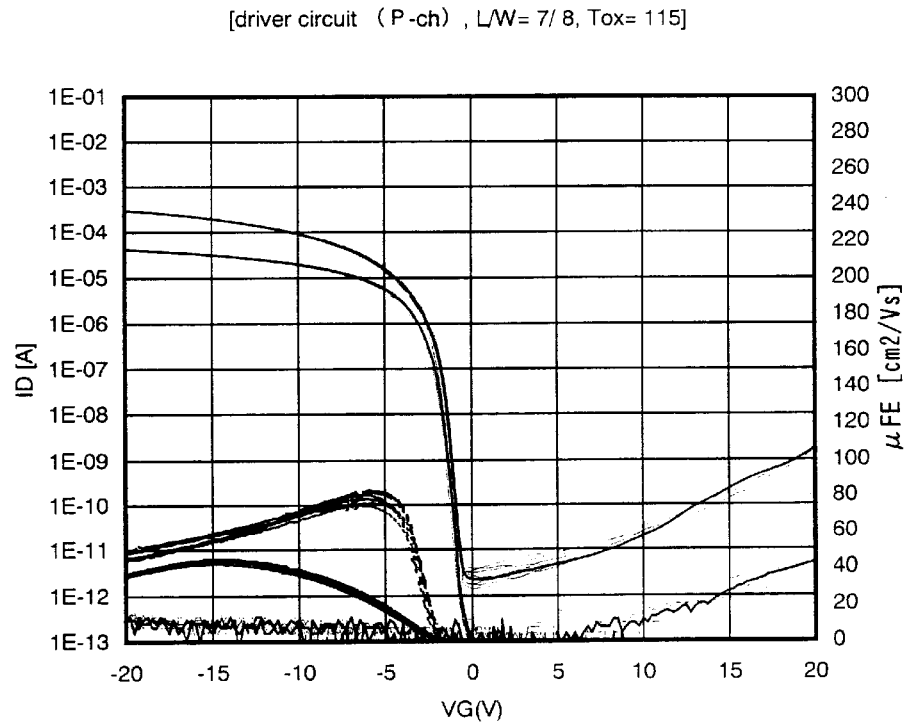

Next, FIGS. 41A and 41B respectively show Id-Vg curves of a pixel TFT and a first p-channel TFT of a driver circuit that are obtained through the manufacture method described in Embodiment 8.

The measurement has been made by setting the source voltage (Vs) to 0 V and the drain voltage (Vd) to 1 V or 14 V. The measured value of the channel length (L) is 6 µm and the measured value of the channel width (W) is 4 µm in the pixel TFT. The measured value of the channel length (L) is 7 µm and the measured value of the channel width (W) is 8 µm in the first p-channel TFT.

When Vd is 14 V, OFF current (Ioff) of the pixel TFT is 0.3 pA whereas OFF current (Ioff) of the first p-channel TFT is 2 pA. Comparing them to a p-channel TFT that has no offset region, the pixel TFT and the first p-channel TFT can control sharp rise of Ioff when Vg is high.

An n-channel TFT, a p-channel TFT, and a pixel TFT manufactured in accordance with another embodiment of the invention have also displayed excellent characteristics. The n-channel TFT has an Ioff of 10 to 30 pA, a field effect mobility of 130 to 180 cm$^2$/Vs, and an S value of 0.19 to 0.26 V/dec. The p-channel TFT has an Ioff of 2 to 10 pA, a field effect mobility of 70 to 110 cm$^2$/Vs, and an S value of 0.19 to 0.25 V/dec. The pixel TFT has an Ioff of 2 to 10 pA, a field effect mobility of 70 to 150 cm$^2$/Vs, and an S value of 0.16 to 0.24 V/dec.

Figure 42:
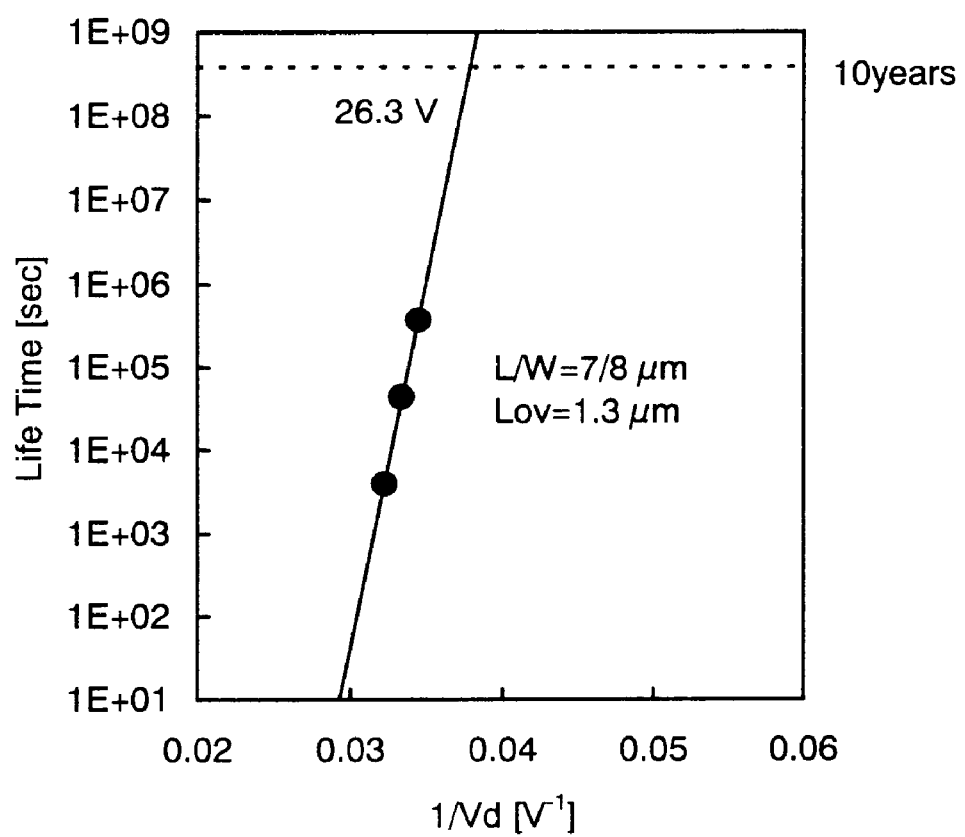
FIG. 42 is a graph showing results of measuring the reliability of a TFT manufactured in accordance with the present invention.

Now, results of measurement on reliability will be shown. The reliability is estimated by checking the ten-year guarantee voltage. The ten-year guarantee voltage is obtained by inferring a stress voltage having a lifetime of ten years from a linear relation provided by plotting the reciprocal of a stress voltage into a semi-logarithmic graph. The lifetime here is defined as a time a TFT takes to change its maximum mobility value ($\mu FE_{(max)}$) by 10%. TFTs (driver circuit) manufactured in accordance with the manufacture method of Embodiment Mode 1 have been measured. The ten-year guarantee voltage of the TFTs is 20 V or higher as shown in FIG. 42, displaying high reliability.

Figure 43:
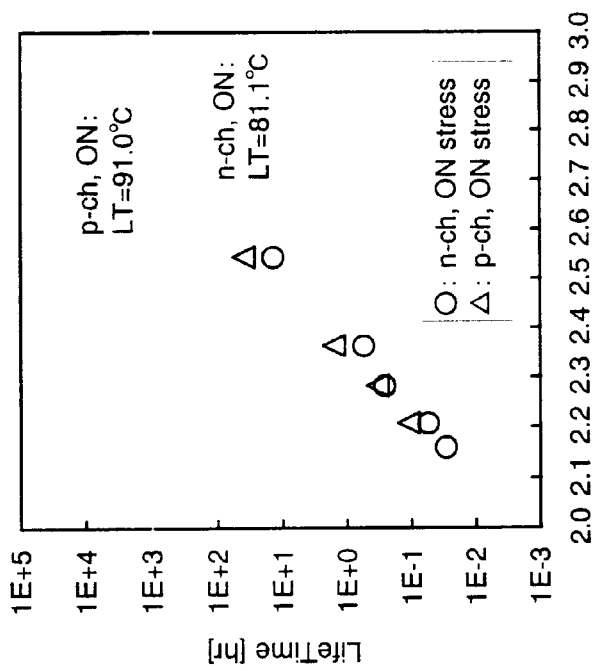
FIG. 43 is a graph showing results of measuring the reliability of a TFT manufactured in accordance with the present invention.

The thousand-hour life temperature by ON stress is checked next. The temperature at which the characteristic changes by 0.1 V in thousand hours (life temperature) is inferred by plotting the time the TFT characteristic (Shift #1) takes to change by 0.1 V when Vg is +20 V (−20 V in the p-channel TFT) and Vd is 0 V against 1000/T (T: absolute temperature (K)). As shown in FIG. 43, the thousand-hour life temperature is 80° C. or higher in both the n-channel TFT and p-channel TFT.

Figure 44:
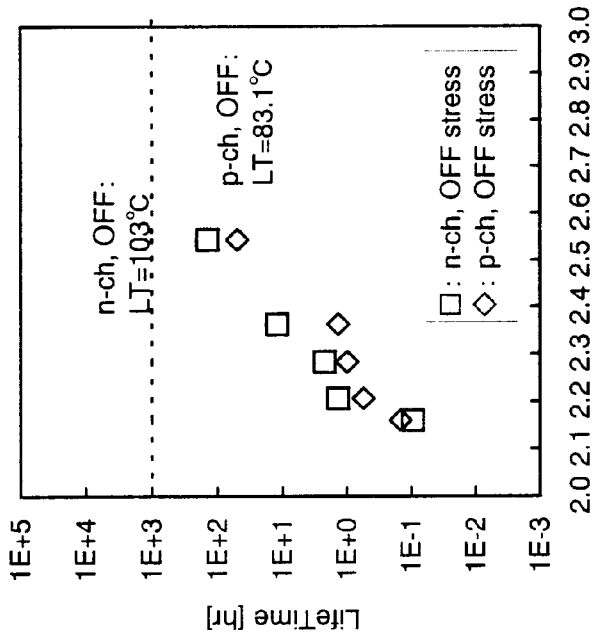
FIG. 44 is a graph showing results of measuring the reliability of a TFT manufactured in accordance with the present invention.

The thousand-hour life temperature by OFF stress is checked next. The temperature at which the characteristic changes by 0.1 V in thousand hours (life temperature) is inferred by plotting the time the TFT characteristic (Shift #1) takes to change by 0.1 V when Vg is 0 V and Vd is +20 V (−20 V in the p-channel TFT) against 1000/T (T: absolute temperature (K)). As shown in FIG. 44, the thousand-hour life temperature is 80° C. or higher in both the n-channel TFT and p-channel TFT.

The characteristic shift of the n-channel TFT and the characteristic shift of the p-channel TFT due to transient stress are checked next. The ON characteristic shift is observed after twenty hours (at room temperature) when Vd is +20 V (−20 V in the p-channel TFT) and Vg is 2 to 6 V (−6 to −2 V in the p-channel TFT). (The transient stress is a stress applied when the drain voltage is set to a certain value and the gate voltage is set to a certain value.)

Figure 45B:
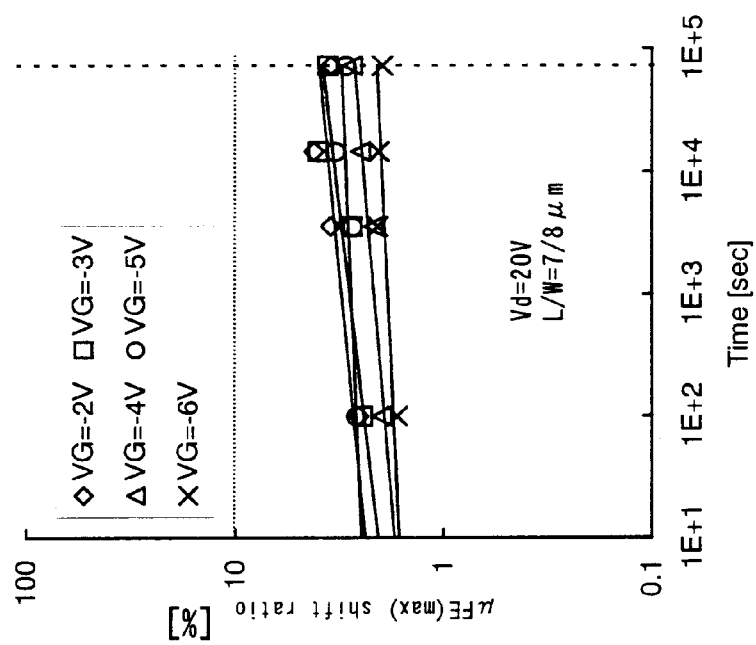
FIGS. 45A and 45B are graphs showing results of measuring the reliability of TFTs manufactured in accordance with the present invention.
Figure 45A:
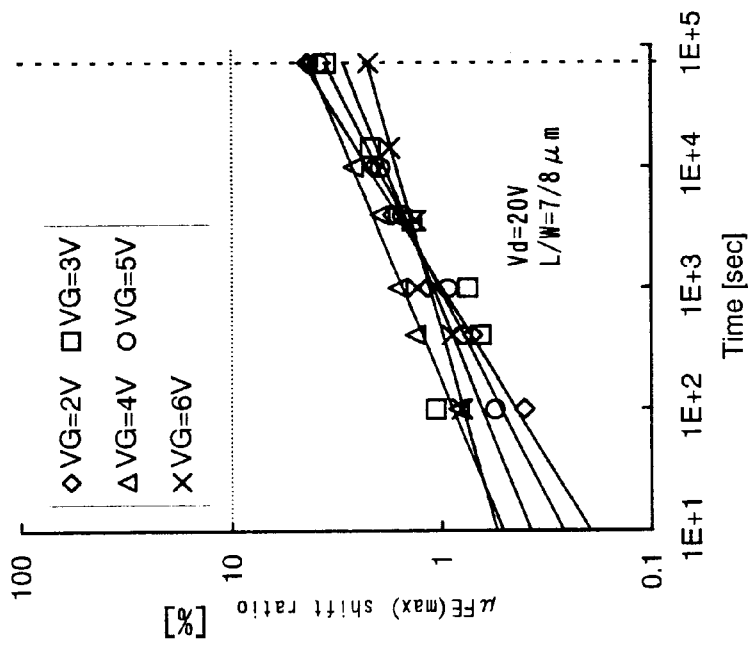

FIGS. 45A and 45B confirm that the change in maximum ratio of the field effect mobility in twenty hours is limited to 10% or less in both the n-channel TFT and p-channel TFT.

These results prove that a manufacture method of the present invention can provide highly reliable TFTs having required performances and can give those excellent TFTs their respective optimal structures without increasing the manufacture steps.

Embodiment 13

Figure 22:
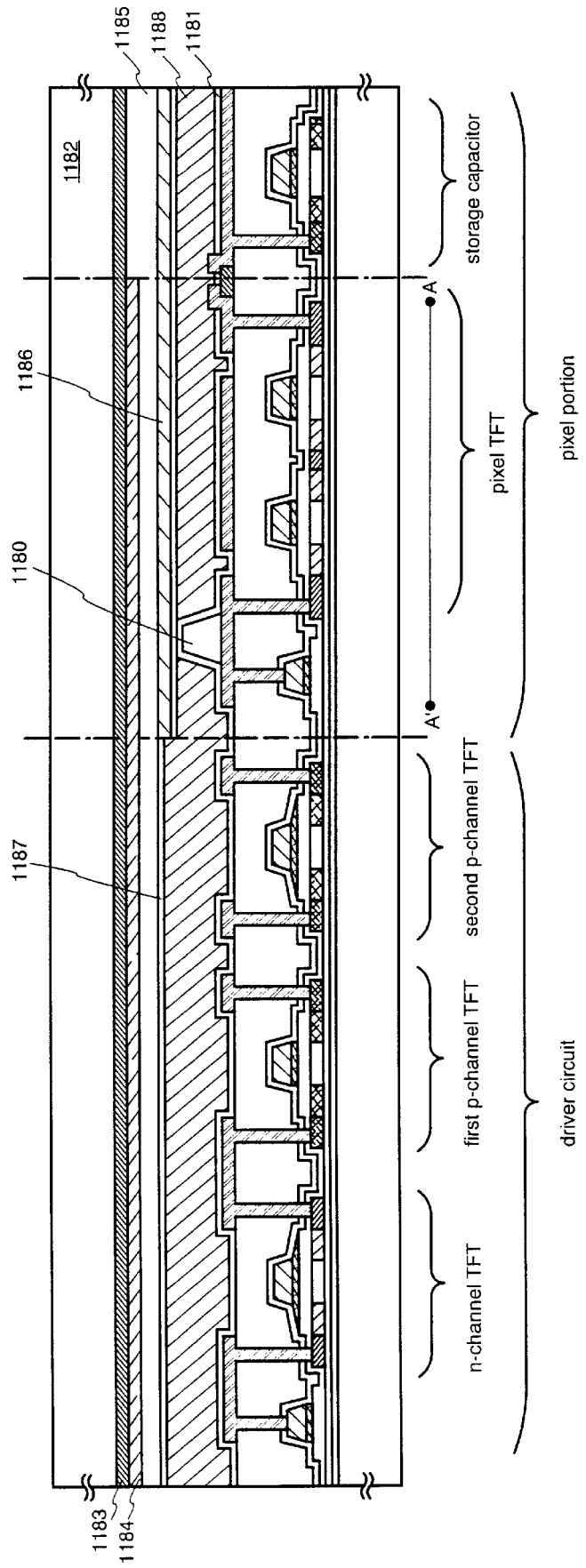
FIG. 22 is a diagram showing a sectional view of a semiconductor device according to the present invention.

The description given in this embodiment with reference to FIG. 22 is of a process of manufacturing an active matrix liquid crystal display device from an active matrix substrate that is fabricated in accordance with the process of one of Embodiments 1 and 5 through 11.

An active matrix substrate as shown in FIG. 9C is first prepared using the process of one of Embodiments 1 through 8. An alignment film 1181 is formed on the active matrix substrate and subjected to rubbing treatment. In this embodiment, an organic resin film such as an acrylic resin film is patterned before forming the alignment film 1181 in order to form in a desired position a columnar spacer 1180 for maintaining a distance between two substrates. Instead of the columnar spacer, spherical spacers may be sprayed onto the entire surface of the substrate.

An opposing substrate 1182 is prepared next. Colored layers 1183 and 1184 and a leveling film 1185 are formed on the opposing substrate 1182. The red colored layer 1183 partially overlaps the blue colored layer 1184 to form a second light shielding portion. Though not shown in FIG. 22, the red colored layer partially overlaps a green colored layer to form a first light shielding portion.

Then an opposing electrode 1186 is formed in the pixel portion. An alignment film 1187 is formed on the entire surface of the opposing substrate 1182 and subjected to rubbing treatment.

The active matrix substrate on which the pixel portion and the driver circuit are formed is bonded to the opposing substrate with a sealing member. The sealing member has a filler mixed therein. The filler, together with the columnar spacer, keeps the distance between the two substrates uniform when the substrates are bonded to each other. Thereafter, a liquid crystal material 1188 is injected between the substrates and the device is completely sealed by an end-sealing material (not shown). The liquid crystal material 1188 may be a known liquid crystal material. Thus an active matrix liquid crystal display device shown in FIG. 22 is completed.

The number of manufacture steps can be reduced by forming a first light shielding portion or a second light shielding portion from colored layers to shield gaps between pixels from light as in this embodiment instead of forming a black mask.

Embodiment 14

Figure 23:
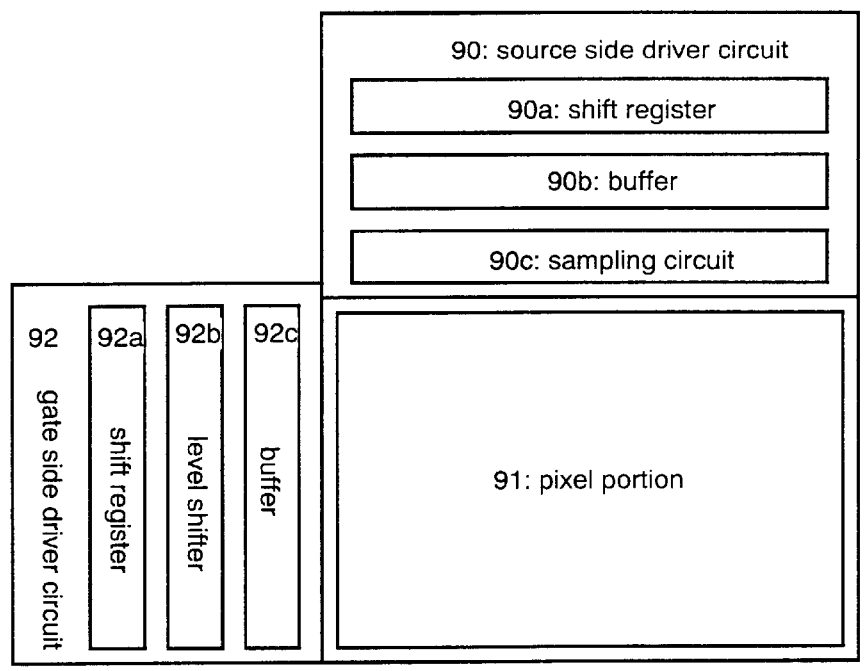
FIG. 23 is a circuit block diagram of an active matrix liquid crystal display device.

FIG. 23 shows a block diagram of a semiconductor device manufactured in accordance with the present invention. This embodiment describes a semiconductor device having a source side driver circuit 90, a pixel portion 91, and a gate side driver circuit 92. The term driver circuit herein collectively refers to a source side driver circuit and a gate side driver circuit.

The source side driver circuit 90 is provided with a shift register 90a, a buffer 90b, and a sampling circuit (transfer gate) 90c. The gate side driver circuit 92 is provided with a shift register 92a, a level shifter 92b, and a buffer 92c. If necessary, a level shifter circuit may be provided between the sampling circuit and the shift register.

In this embodiment, the pixel portion 91 is composed of a plurality of pixels, and each of the plural pixels has TFT elements.

Though not shown in the drawing, another gate side driver circuit may be provided in across the pixel portion 91 from the gate side driver circuit 92.

Figure 24:
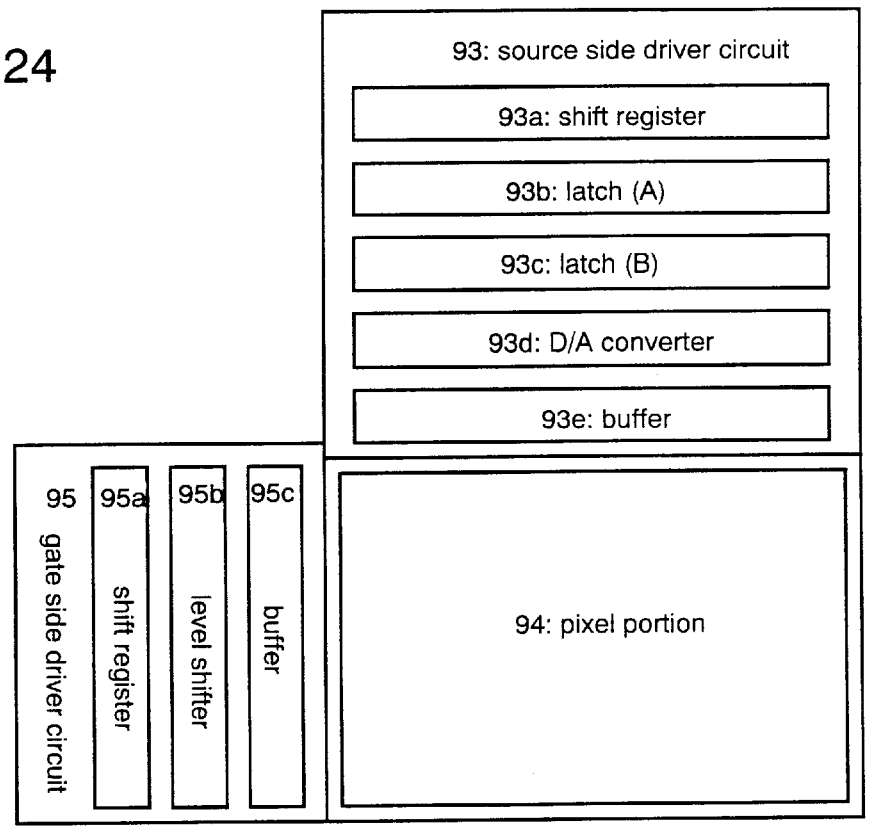
FIG. 24 is a circuit block diagram of an active matrix liquid crystal display device.

When the device is digitally driven, the sampling circuit is replaced by a latch (A) 93b and a latch (B) 93c as shown in FIG. 24. A source side driver circuit 93 is provided with a shift register 93a, the latch (A) 93b, the latch (B) 93c, a D/A converter 93d, and a buffer 93e. A gate side driver circuit 95 is provided with a shift register 95a, a level shifter 95b, and a buffer 95c. If necessary, a level shifter circuit may be provided between the latch (B) 93c and the D/A converter 93d. A reference symbol 94 denotes a pixel portion.

The above structure is obtained by employing the manufacture process of any of Embodiments 1 through 8. Although this embodiment describes only the structure of the pixel portion and the driver circuit, a memory circuit and a microprocessor circuit can also be formed when following the manufacture process of the present invention.

Embodiment 15

This embodiment gives a description with reference to FIGS. 25A to 25D on a process of forming a semiconductor film to serve as an active layer of a TFT. The crystallization means in this embodiment is a technique described in Embodiment Mode 1 of Japanese Patent Application Laid-open No. Hei 7-130652.

First, a base insulating film 1402 with a thickness of 200 nm is formed on a substrate (glass substrate, in this embodiment) 1401 from a silicon oxynitride film. An amorphous semiconductor film (amorphous silicon film, in this embodiment) 1403 with a thickness of 200 nm is formed thereon. The base insulating film and the amorphous semiconductor film may be formed successively without exposing them to the air.

Figure 25A:
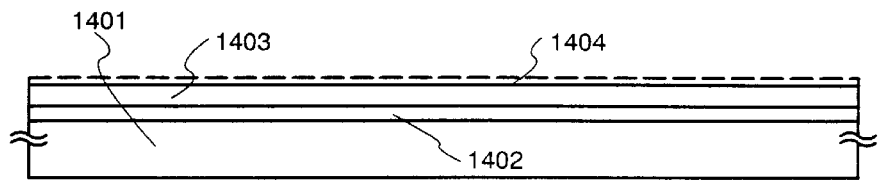
FIGS. 25A to 25D are diagrams showing an exemplary method of crystallizing a semiconductor film.

Next, an aqueous solution containing 10 ppm of catalytic element by weight (in this embodiment, the catalytic element is nickel and the aqueous solution is nickel acetate aqueous solution) is applied by spin coating to form a catalytic element containing layer 1404 over the entire surface of the amorphous semiconductor film 1403. Examples of the catalytic element that can be used here other than nickel (Ni) include iron (Fe), palladium (Pd), tin (Sn), lead (Pb), cobalt (Co), platinum (Pt), copper (Cu), and gold (Au) (FIG. 25A).

Although spin coating is used in doping of nickel in this embodiment, a catalytic element may be deposited by evaporation or sputtering to form a thin film (nickel film, in the case of this embodiment) on the amorphous semiconductor film.

Figure 25B:
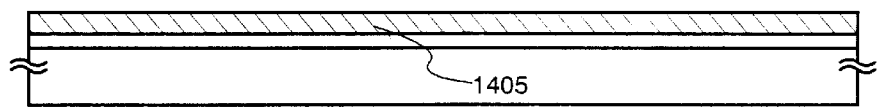

Prior to the crystallization step, heat treatment is conducted at 400 to 500° C. for about an hour to release hydrogen from the film. Then the film is subjected to heat treatment at 500 to 650° C. (preferably 550 to 570° C.) for four to twelve hours (preferably four to six hours). In this embodiment, the film is heated at 550° C. for four hours to form a crystalline semiconductor film (crystalline silicon film, in this embodiment) 1405 (FIG. 25B).

A laser light irradiation step may be inserted here to improve the crystallinity of the crystalline semiconductor film 1405.

Figure 25C:
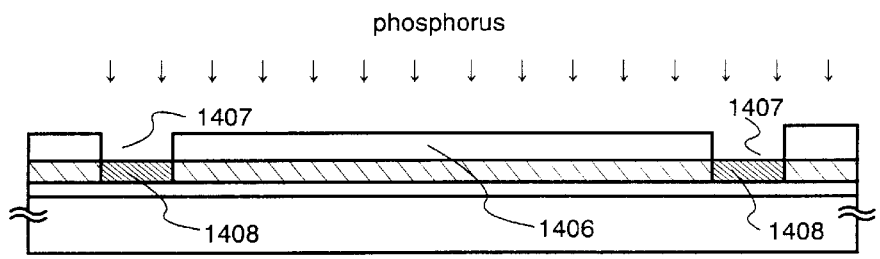

The next step is gettering for removing nickel used in the crystallization step from the crystalline silicon film. First, a mask insulating film 1406 with a thickness of 150 nm is formed on the surface of the crystalline semiconductor film 1405 and is patterned to form an opening 1407. Then the exposed portion of the crystalline semiconductor film is doped with an element belonging to Group 15 (phosphorus, in this embodiment). Through this step, a gettering region 1408 containing phosphorus in a concentration of $1 \times 10^{19}$ to $1 \times 10^{20}$ atoms/cm$^3$ is formed (FIG. 25C).

Figure 25D:
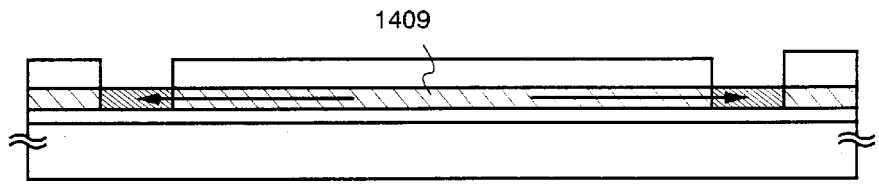

A heat treatment step is carried out next in a nitrogen atmosphere at 450 to 650° C. (preferably 500 to 550° C.) for four to twenty-four hours (preferably six to twelve hours). Through the heat treatment step, nickel in the crystalline semiconductor film moves in the direction indicated by the arrow and is trapped in the gettering region 1408 by the gettering action of phosphorus. Since nickel is removed from the crystalline semiconductor film, the concentration of nickel contained in the crystalline semiconductor film 1409 is reduced to $1 \times 10^{17}$ atoms/cm$^3$ or lower, preferably $1 \times 10^{16}$ atoms/cm$^3$ (FIG. 25D).

The crystalline semiconductor film 1409 formed as above has a very high crystallinity owing to the use of a catalytic element for promoting crystallization (nickel, in this embodiment).

An alternative method of gettering the catalytic element is to utilize phosphorus (P) as the n type impurity element for doping the source region or the drain region in the step of activating the impurity element used to dope the semiconductor film after the inorganic interlayer insulating film is formed in the manufacture process of Embodiment 1.

The structure of this embodiment can be combined freely with the structure shown in Embodiment Mode 1 and Embodiments 1 through 8.

Embodiment 16

This embodiment gives a description with reference to FIGS. 26A to 26D on a process of forming a semiconductor film to serve as an active layer of a TFT. Specifically, a technique described in Japanese Patent Application Laid-open No. Hei 10-247735 (corresponding to U.S. Pat. No. 6,165,824) is used.

First, a base insulating film 1502 with a thickness of 200 nm is formed on a substrate (glass substrate, in this embodiment) 1501 from a silicon oxynitride film. An amorphous semiconductor film (amorphous silicon film, in this embodiment) 1503 with a thickness of 200 nm is formed thereon. The base insulating film and the amorphous semiconductor film may be formed successively without exposing them to the air.

A mask insulating film 1504 is then formed from a silicon oxide film to a thickness of 200 nm. An opening 1505 is formed in the film.

Figure 26A:
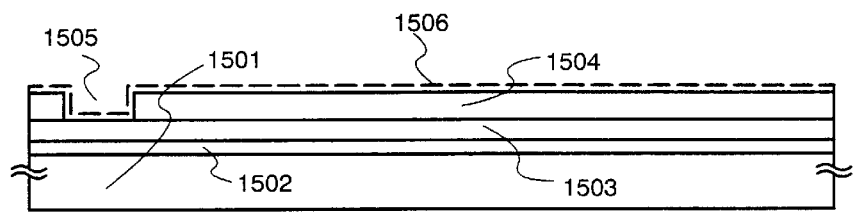
FIGS. 26A to 26D are diagrams showing an exemplary method of crystallizing a semiconductor film.

Next, an aqueous solution containing 100 ppm of catalytic element by weight (in this embodiment, the catalytic element is nickel and the aqueous solution is nickel acetate aqueous solution) is applied by spin coating to form a catalytic element containing layer 1506. At this point, the catalytic element containing layer 1506 selectively contacts the amorphous semiconductor film 1503 in the region where the opening 1505 has been formed. Examples of the catalytic element that can be used here other than nickel (Ni) include iron (Fe), palladium (Pd), tin (Sn), lead (Pb), cobalt (Co), platinum (Pt), copper (Cu), and gold (Au) (FIG. 26A).

Although spin coating is used in doping of nickel in this embodiment, a catalytic element may be deposited by evaporation or sputtering to form a thin film (nickel film, in the case of this embodiment) on the amorphous semiconductor film.

Figure 26B:
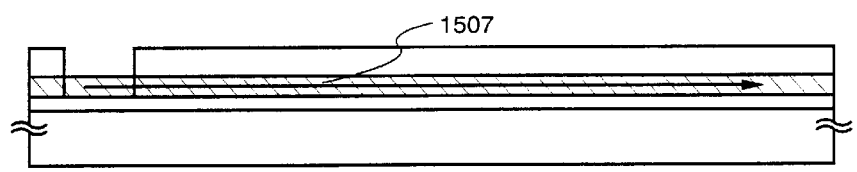

Prior to a crystallization step, heat treatment is conducted at 400 to 500° C. for about an hour to release hydrogen from the film. Then the film is subjected to heat treatment at 500 to 650° C. (preferably 550 to 600° C.) for six to sixteen hours (preferably eight to fourteen hours). In this embodiment, the film is heated at 570° C. for fourteen hours. As a result, crystallization starts from the opening 1505 and progresses in a direction substantially parallel to the substrate (the direction indicated by the arrow) to form a crystalline semiconductor film (crystalline silicon film, in this embodiment) 1507 (FIG. 26B). Macroscopically, the crystal growth direction of the crystalline semiconductor film 1507 is uniform.

The next step is gettering for removing nickel used in the crystallization step from the crystalline silicon film. In this embodiment, the mask insulating film 1504 previously formed is used as a mask without changing anything about the insulating film and the crystalline semiconductor film is doped with an element belonging to Group 15 (phosphorus, in this embodiment). A gettering region 1508 is formed as a result in the exposed part of the crystalline semiconductor film at the opening 1505.

Figure 26C:
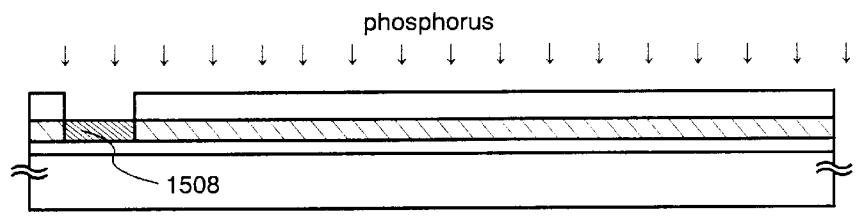

The gettering region 1508 contains phosphorus in a concentration of $1 \times 10^{19}$ to $1 \times 10^{20}$ atoms/cm$^3$ is formed (FIG. 26C).

Figure 26D:
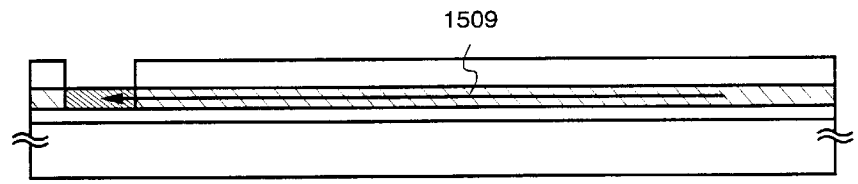

A heat treatment step is carried out next in a nitrogen atmosphere at 450 to 650° C. (preferably 500 to 550° C.) for four to twenty-four hours (preferably six to twelve hours). Through the heat treatment step, nickel in the crystalline semiconductor film moves in the direction indicated by the arrow and is trapped in the gettering region 1508 by the gettering action of phosphorus. Since nickel is removed from the crystalline semiconductor film, the concentration of nickel contained in the crystalline semiconductor film 1509 is reduced to $1 \times 10^{17}$ atoms/cm$^3$ or lower, preferably $1 \times 10^{16}$ atoms/cm$^3$ (FIG. 26D).

The crystalline semiconductor film 1509 formed as above has a very high crystallinity by being crystallized while selectively doped with a catalytic element for promoting crystallization (nickel, in this embodiment). Specifically, the film has a crystal structure in which rod-like or columnar crystals are arranged in a specific orientation.

An alternative method of gettering the catalytic element is to utilize phosphorus (P) as the n type impurity element for doping the source region or the drain region in the step of activating the impurity element used to dope the semiconductor film after the inorganic interlayer insulating film is formed in the manufacture process of Embodiment 1.

The structure of this embodiment can be combined freely with the structure shown in Embodiment Mode 1 and Embodiments 1 through 8.

Embodiment 17

Described below using FIG. 3A to FIG. 6 (each corresponding to FIG. 27A to FIG. 30) is a method of manufacturing a semiconductor device in which a TFT for a pixel portion and a TFT for a driver circuit provided in the periphery of the pixel portion are formed on the same substrate. The semiconductor device has a pixel electrode that is uneven because of an uneven region formed in the pixel portion by the same manufacture process as the TFTs.

A substrate 2100 in this embodiment is made of glass such as barium borosilicate glass or alumino borosilicate glass, typical example of which is Corning #7059 or #1737 glass (a product of Corning Incorporated). The substrate 2100 may be a quartz substrate, a silicon substrate, a metal substrate, or a stainless steel substrate if an insulating film is formed on the surface. A plastic substrate may also be used if it has a heat resistance against the process temperature of this embodiment.

On the surface of the substrate 2100, a base insulating film 2101 is formed from an insulating film such as a silicon oxide film, a silicon nitride film, and a silicon oxynitride film. In this embodiment, the first layer of the base insulating film 2101 is a silicon oxynitride film (composition ratio: Si=32%, O=27%, N=24%, H=17%) 2101a formed to a thickness of 10 to 200 nm (preferably 50 to 100 nm) by plasma CVD using as reaction gas SiH$_4$, NH$_3$, and N$_2$O. The second layer of the base insulating film is a silicon oxynitride film (composition ratio: Si=32%, O=59%, N=7%, H=2%) 2101b formed to a thickness of 10 to 200 nm (preferably 110 to 150 nm) by plasma CVD using as reaction gas SiH$_4$ and N$_2$O. The second layer is layered on the first layer.

An amorphous semiconductor film is next formed on the base insulating film by a known method (such as sputtering, LPCVD, or plasma CVD). The amorphous semiconductor film is then crystallized by a known crystallization treatment (laser crystallization, thermal crystallization, or thermal crystallization using Ni or other catalytic element) to form a crystalline semiconductor film. The obtained crystalline semiconductor film is patterned into a desired shape to form island-like semiconductor layers 2102 to 2105 and an island-like semiconductor layer 2301 for forming projections in the pixel portion (See FIG. 3A). Hereinafter, the projections in this embodiment are formed in accordance with the process of manufacturing a pixel TFT.

No limitation is put on the material of the crystalline semiconductor film, but the film is preferably formed of silicon or a silicon germanium (Si$_x$Ge$_{1-x}$; 0<x<1, typically x=0.001 to 0.05) alloy.

In this embodiment, an amorphous silicon film with a thickness of 55 nm is formed by plasma CVD and then irradiated with laser to form a crystalline silicon film.

When the semiconductor film is crystallized by laser treatment, the film is desirably subjected to heat treatment at 400 to 500° C. for about an hour in order to reduce the hydrogen content in the film to 5 atom % or less prior to the crystallization step.

Another employable crystallization method consists of applying a solution containing Ni to the amorphous silicon film, subjecting the film to thermal crystallization treatment (at 550° C., for four hours), and performing laser annealing treatment on the obtained crystalline silicon film to improve crystallinity of the film. Examples of the laser usable in the laser annealing treatment include pulse oscillation type or continuous wave KrF excimer laser, XeCl excimer laser, YAG laser, and YVO$_4$ laser. When one of these lasers is used, laser beams emitted from a laser emitter are collected by an optical system into a linear beam to irradiate the semiconductor film. Conditions for crystallization can be set by an operator suitably.

Other crystallization methods than the thermal crystallization involving doping of a catalytic element may be employed; the semiconductor film may be crystallized by heat without using a catalytic element, or by RTA (rapid thermal annealing) in which the film is crystallized around 500 to 700° C. After the semiconductor film is crystallized by RTA, the film may be subjected to laser annealing treatment to improve its crystallinity.

The semiconductor layers may be doped with a minute amount of impurity element (boron or phosphorus: in this embodiment, boron is used) in order to control threshold of the TFTs.

Next, a gate insulating film 2106 is formed so as to cover the semiconductor layers 2102 to 2105 and the island-like semiconductor layer 2301 for forming the projections. The gate insulating film 2106 is an insulating film containing silicon which is formed by plasma CVD or sputtering to a thickness of 40 to 150 nm. In this embodiment, a silicon oxynitride film (composition ratio: Si=32%, O=59%, N=7%, H=2%) is formed to a thickness of 110 nm by plasma CVD. Needless to say, the gate insulating film is not limited to a silicon oxynitride film but may be a single layer or a laminate of other insulating films containing silicon.

If a silicon oxide film is used, the film is formed by plasma CVD through electric discharge while using a mixture of TEOS (tetraethyl orthosilicate) and $O_2$, and setting the reaction pressure to 40 Pa, the substrate temperature to 300 to 400° C., and the power density to 0.5 to 0.8 W/cm² at a high frequency (13.56 MHz). The silicon oxide film formed in this way can provide excellent characteristics as the gate insulating film when subjected to thermal annealing at 400 to 500° C.

Formed next on the gate insulating film 2106 are a first conductive film 2107 with a thickness of 20 to 100 nm and a second conductive film 2108 with a thickness of 100 to 400 nm. In this embodiment, the film 2107 is a TaN film having a thickness of 30 nm and the film 2108 is a W film having a thickness of 370 nm. The TaN film is formed by sputtering in an atmosphere containing nitrogen using a Ta target. The W film is formed by sputtering using a W target. Alternatively, the W film may be formed by thermal CVD using tungsten hexafluoride ($WF_6$).

In either case, the W film has to be less resistive in order to use the film for a gate electrode. The resistivity of the W film is desirably 20 $\mu\Omega$cm or lower. The W film can have low resistivity when the grain size is large. However, if the W film contains many impurity elements such as oxygen, crystallization is hindered and the resistivity is raised. Therefore, the W film in this embodiment is formed by sputtering using a highly pure W target (purity: 99.9999%) and taking great care not to allow impurities from the air to mix in the film in the middle of formation. A resistivity of 9 to 20 $\mu\Omega$cm is thus attained.

Although the first conductive film 2107 is a TaN film whereas the second conductive film 2108 is a W film in this embodiment, they are not particularly limited. Each of the conductive films can be formed of an element selected from the group consisting of Ta, W, Ti, Mo, Al, and Cu, or may be formed of an alloy material or compound material containing any of the above elements as its main ingredient. Alternatively, a semiconductor film, typically a polycrystalline silicon film, doped with an impurity element such as phosphorus may be used. The first conductive film and the second conductive film can take various combinations, e.g., a combination of Ta film for the first conductive film 2107 and W film for the second conductive film 2108, a combination of TaN film for the first conductive film 2107 and Al film for the second conductive film 2108, and a combination of TaN film for the first conductive film 2107 and Cu film for the second conductive film 2108 (FIG. 27A).

Next, masks 2109 to 2113 and a mask 2302 for forming the projections are formed from a resist by photolithography to conduct a first etching treatment for forming electrodes and wiring lines. This embodiment employs ICP (inductively coupled plasma) etching in which $CF_4$, $Cl_2$, and $O_2$ are used as the etching gas, the gas flow rate ratio of them is set to 25/25/10 SCCM, and an RF (13.56 MHz) power of 500 W is applied to a coiled electrode at a pressure of 1.0 Pa to generate plasma for the etching. The substrate side (sample stage) receives an RF (13.56 MHz) power of 150 W to apply a substantially negative self-bias voltage.

Thereafter, etching is made under the second etching conditions without removing the resist masks 2109 to 2113. According to the second etching conditions, $CF_4$ and $Cl_2$ are used as the etching gas, the gas flow rate ratio of them is set to 30/30 SCCM, and an RF (13.56 MHz) power of 500 W is applied to a coiled electrode at a pressure of 1 Pa to generate plasma for 30 second etching. The substrate side (sample stage) also receives an RF (13.56 MHz) power of 20 W to apply a substantially negative self-bias voltage. The TaN film and the W film are etched to the same extent under the second etching conditions using a mixture of $CF_4$ and $Cl_2$. Up to this point, first shape conductive layers 2114 to 2118 and a conductive film 2303 for forming the projections are formed.

A first doping treatment is conducted next without removing the resist masks 2109 to 2113. In the first doping treatment, the semiconductor layers are doped with an impurity element imparting n-type conductivity (hereinafter referred to as n type impurity element) in a self-aligning manner while using the first shape conductive layers as masks. The doping treatment is achieved by ion doping or ion implantation. The n type impurity element to be used is an element belonging to Group 15 in the periodic table, typically, phosphorus (P) or arsenic (As). Through the doping, a first concentration impurity region 2120 having a concentration of $1\times10^{20}$ to $1\times10^{21}$ atoms/cm³ is formed (FIG. 3B, FIG. 27B).

Still keeping the resist masks 2109 to 2113 in place, a second etching treatment is conducted. $CF_4$, $Cl_2$, and $O_2$ are used as the etching gas, the gas flow rate ratio of them is set to 20/20/20/ SCCM, and an RF (13.56 MHz) power of 500 W is applied to a coiled electrode at a pressure of 1 Pa to generate plasma for the etching. The substrate side (sample stage) receives an RF (13.56 MHz) power of 20 W to apply a self-bias voltage lower than in the first etching treatment. The W film is etched under these second etching conditions. As a result, second shape conductive layers 2121 to 2125 and a conductive film 2304 for forming the projections are formed (FIG. 3C).

Then a second doping treatment is conducted. Using as a mask the second shape first conductive film formed in the first doping treatment, second concentration impurity regions 2126b to 2129b are formed on the inside of the n type impurity region 2126a to 2129a (on the channel formation region side). The second concentration impurity regions each contain an impurity element in a concentration of $1\times10^{18}$ to $1\times10^{19}$ atoms/cm³.

Figure 4A:
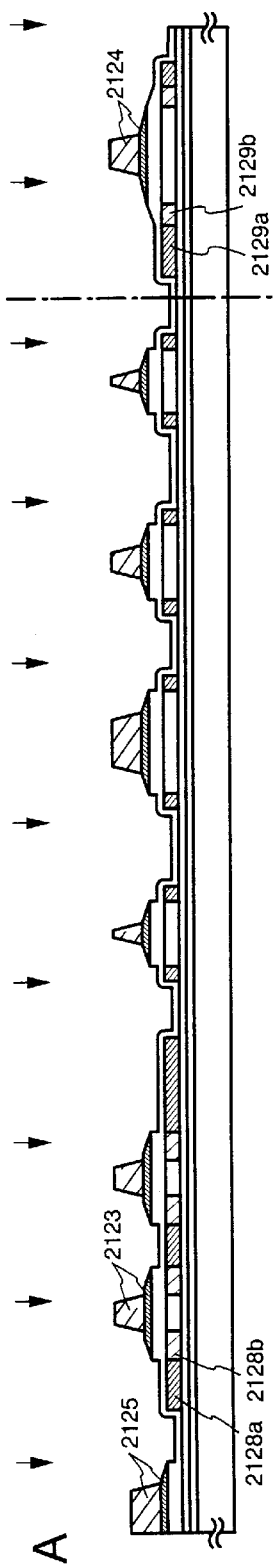
FIGS. 4A to 4C are diagrams showing a process of manufacturing a semiconductor device according to the present invention.
Figure 4B:
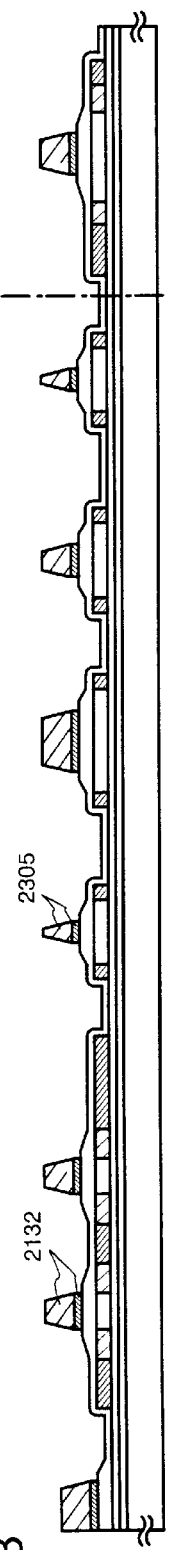
Figure 4C:
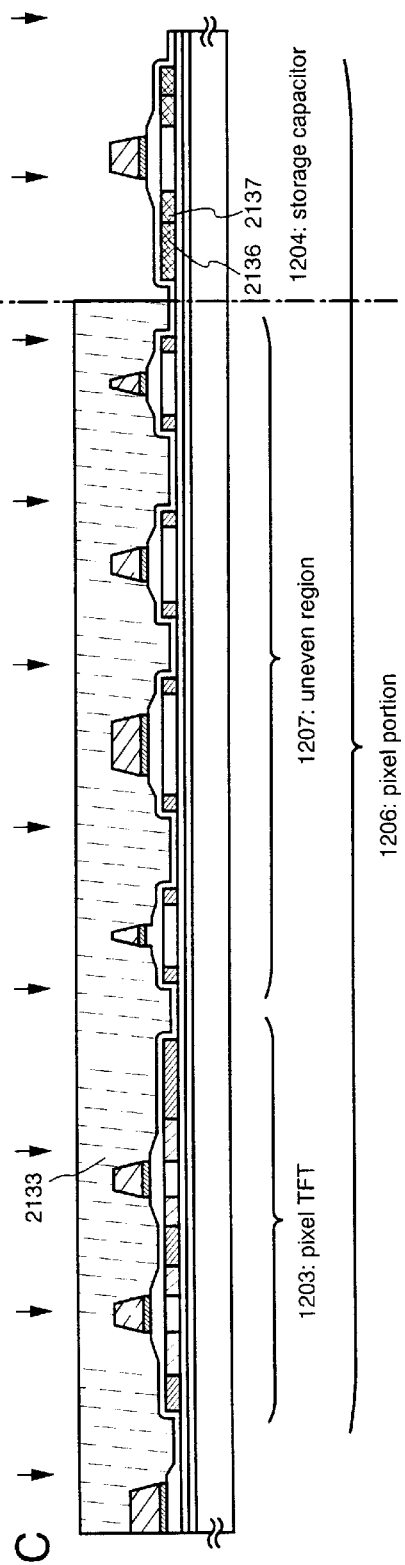
Figure 5A:
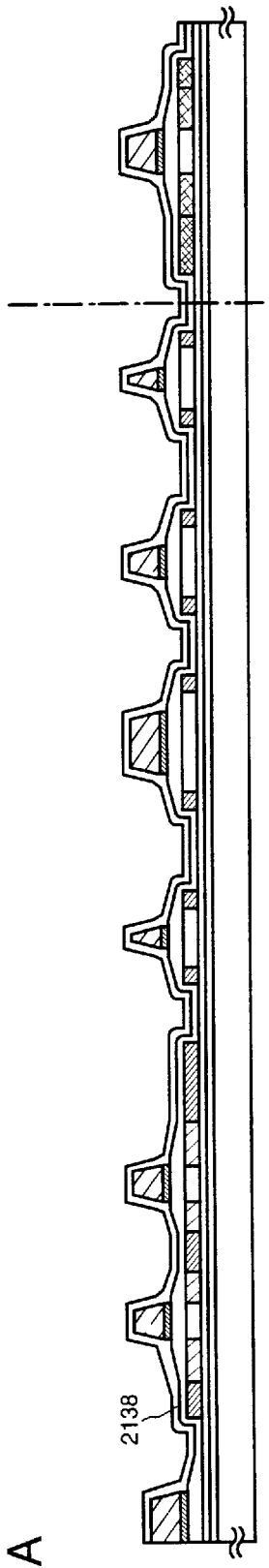
FIGS. 5A and 5B are diagrams showing a process of manufacturing a semiconductor device according to the present invention.
Figure 5B:
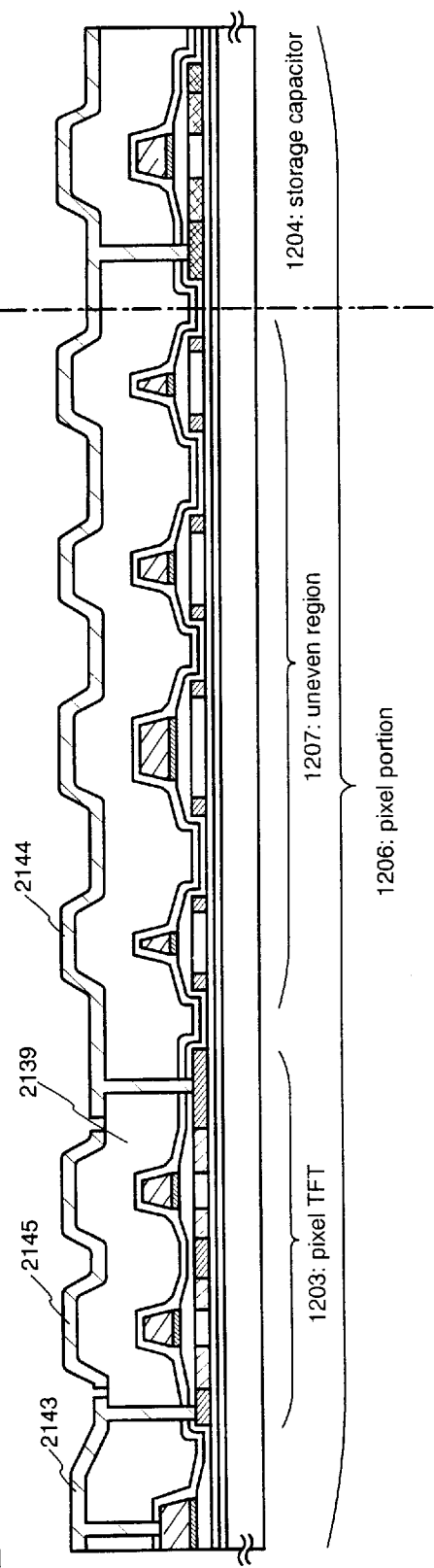

Next, the resist masks 2109 to 2113 are removed and a mask 2130 is newly formed from a resist to conduct a third etching treatment. $Cl_2$ is used as the etching gas, the gas flow rate thereof is set to 80 SCCM, and an RF (13.56 MHz) power of 350 W is applied to a coiled electrode at a pressure of 1.2 Pa to generate plasma for 40 second etching. The substrate side (sample stage) receives an RF (13.56 MHz) power of 50 W to apply a substantially negative self-bias voltage. Thus the second shape gate electrodes in the future p-channel TFT of the driver circuit and in the future pixel TFT are etched to form third shape gate electrodes 2131 and 2132 of the future p-channel TFT and the future pixel TFT, respectively, and to form a conductive film 2305 for forming the projections (FIG. 4B, FIG. 28B). In this specification, a 'future pixel TFT' refers to a pixel TFT in the middle of fabrication. Similarly, a 'future n-channel TFT' ('future p-channel TFT') refers to an unfinished TFT that is to function as an n-channel TFT (p-channel TFT) after its completion.

A resist mask 2133 is newly formed to cover the future pixel TFT and the uneven region. The future n-channel TFT of the driver circuit is covered with the mask 2130. Then a third doping treatment is conducted to dope the semiconductor layers in the p-channel TFT and in the storage capacitor with an impurity element imparting p-type conductivity (hereinafter referred to as p type impurity element). In this embodiment, the semiconductor layers are doped with a p type impurity element in a self-aligning manner while using the third shape conductive layers as masks to form fourth concentration impurity regions. This embodiment employs ion doping using diborane ($B_2H_6$) to form fourth concentration impurity regions 2134 to 2137.

The fourth concentration impurity regions are doped with an n type impurity element (phosphorus (P), in this embodiment) in different concentrations. However, all of them do not have a problem to function as source regions and drain regions of the p-channel TFTs because doping of impurity elements is performed making sure that those impurity regions contain the p type impurity element in a concentration higher than the concentration of the n type impurity element.

Through the above steps, the respective semiconductor layers are doped with the impurity elements for imparting the respective conductivity types and all of the impurity regions are formed in a self-aligning manner while using the gate electrodes as masks.

The plural projections formed in the pixel portions are obtained through steps identical with the steps of forming the pixel TFT.

The resist masks 2130, 2133, and 2134 are removed and a first interlayer insulating film 2138 is formed to cover the entire surface. In order to make the insulating film susceptive to an uneven region 1207 formed in the pixel portion, the first interlayer insulating film 2138 is formed from an insulating film containing silicon by plasma CVD or sputtering to a thickness of 200 to 400 nm. In this embodiment, a silicon oxynitride film with a thickness of 400 nm is formed by plasma CVD. The material of the insulating film is not limited to a silicon oxynitride film and a single layer or a laminate of other insulating films containing silicon may be used.

The next step is heat treatment for activating the impurity elements used to dope the semiconductor layers. This heat treatment step for activation is achieved by heat treatment that uses a furnace (furnace annealing). Conditions of the heat treatment includes preparing nitrogen atmosphere whose oxygen concentration is 1 ppm or less, preferably, 0.1 ppm or less, and setting the temperature to 300 to 500° C., typically 400 to 450° C. In this embodiment, activation is made by heat treatment at 450° C. for four hours. Other than furnace annealing, laser annealing, RTA, or thermal annealing may be adopted.

If a catalytic element is used in crystallization, the concentration of Ni used as a catalyst has to be lowered in the channel formation region. Then gettering and the heat treatment activation are simultaneously conducted, so that nickel is moved to an n type impurity region that contains a high concentration of phosphorus (P). In this case, the temperature of the heat treatment is set to 300 to 700° C., typically 500 to 550° C. Thus the nickel concentration can be lowered in the semiconductor layer most part of which is to serve as the channel formation region. If a TFT has a channel formation region formed as above, the OFF current value thereof is low and crystallinity is high to provide high field effect mobility, whereby the TFT can have excellent characteristics.

The heat treatment for activation in this embodiment is conducted after the first interlayer insulating film 2138 is formed. However, the first interlayer insulating film 2138 may be formed after the heat treatment. If the material used for the conductive films is weak against heat, it is preferred to form the interlayer insulating film for protecting the conductive films before the heat treatment step as in this embodiment.

The semiconductor layers are subjected to another heat treatment in an atmosphere containing 3 to 100% of hydrogen at 300 to 550° C. for one to twelve hours for hydrogenation. In this embodiment, heat treatment is conducted in an atmosphere containing about 3% of hydrogen at 410° C. for an hour. This step is to terminate dangling bonds in the semiconductor layers by hydrogen contained in the interlayer insulating film. Other hydrogenation measures include plasma hydrogenation (utilizing hydrogen excited by plasma).

In the case where the activation process is carried out by laser annealing, it is desirable to add laser irradiation by excimer laser, YAG laser, or the like after the hydrogenation described above.

An alternative is to form a silicon oxynitride film with a thickness of 50 to 100 nm as the first interlayer insulating film 2138, conduct heat treatment at 300 to 700° C. (typically 550° C.) for about four hours for activation of the impurity elements used to dope the semiconductor film, form a silicon nitride film to a thickness of 100 to 300 nm, and conduct another heat treatment at 300 to 550° C. for one to twelve hours in a nitrogen atmosphere containing hydrogen.

Next, a second interlayer insulating film 2139 is formed on the first interlayer insulating film 2138. In this embodiment, an acrylic resin film is formed to a thickness of 0.8 to 1.2 $\mu$m. Influenced by the uneven region formed in the pixel portion, the second interlayer insulating film 2139 has uneven surface. The interlayer insulating film may be formed without removing the resist mask used to form the protrusions in order to make the influence of the protrusions clearer.

Then contact holes reaching the source wiring lines and the semiconductor layers (impurity regions) of the TFTs are formed through the first interlayer insulating film 2138 and the second interlayer insulating film 2139.

Wiring lines 2140 to 2145 for electrically connecting the TFTs are formed next. The wiring lines 2140 to 2145 are formed by patterning a laminate of a Ti film with a thickness of 50 to 250 nm and an alloy film (an alloy film of Al and Ti) with a thickness of 300 to 500 nm.

A pixel electrode 2144 is formed in the pixel portion. The pixel electrode 2144 is desirably formed of a material having excellent reflectivity, such as a film mainly containing Al or Ag, and a laminate of a Al containing film and a Ag containing film. Influenced by the uneven region 1207 formed in a pixel portion 1206, the pixel electrode is uneven.

In this embodiment, an end of the pixel electrode 2144 overlaps a source line with the first interlayer insulating film 2138 and the second interlayer insulating film 2139 interposed therebetween. Therefore gaps between pixel electrodes can be shielded from light without using a black mask.

Figure 29A:
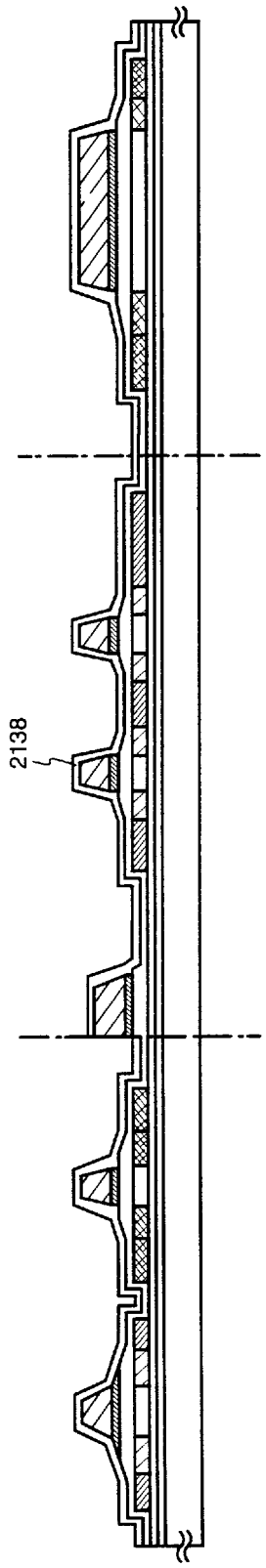
FIGS. 29A and 29B are diagrams showing a process of manufacturing a semiconductor device according to the present invention.
Figure 29B:
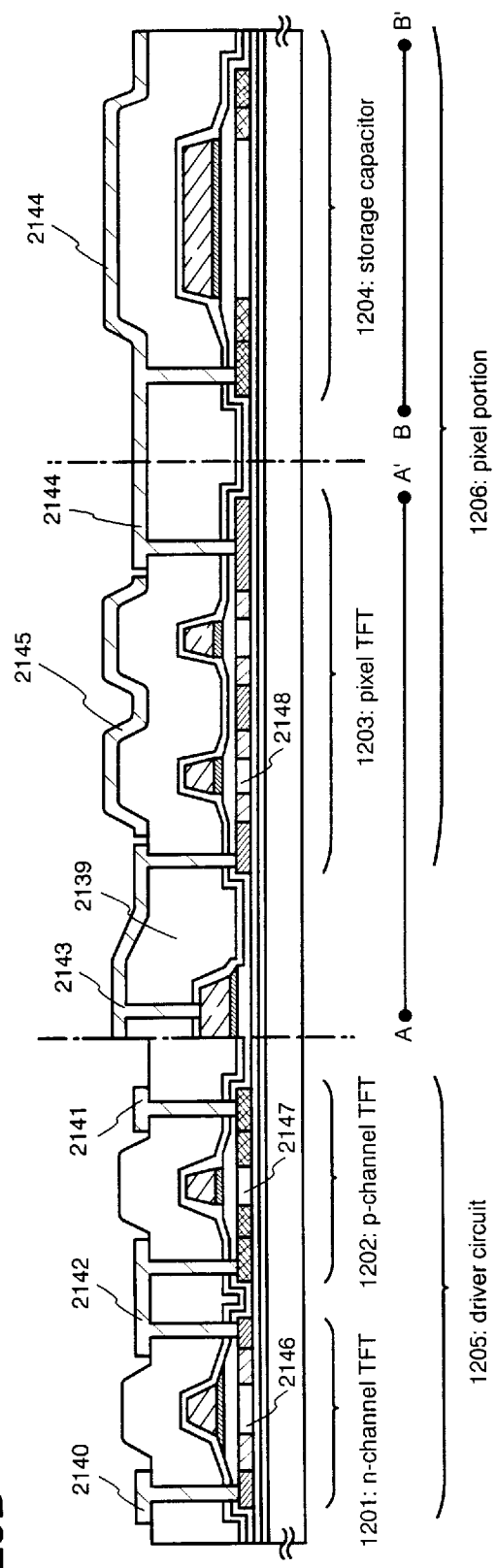

In this way, a driver circuit 1205 that has an n-channel TFT 1201 (channel formation region 2146) and a p-channel TFT 1202 (channel formation region 2147) is formed on the same substrate on which the pixel portion 1206 having a pixel TFT 1203 (channel formation region 2148), a storage capacitor 1204, and the uneven region 1207 is formed (FIG. 29B). A substrate as such is called an active matrix substrate in this specification.

Figure 30:
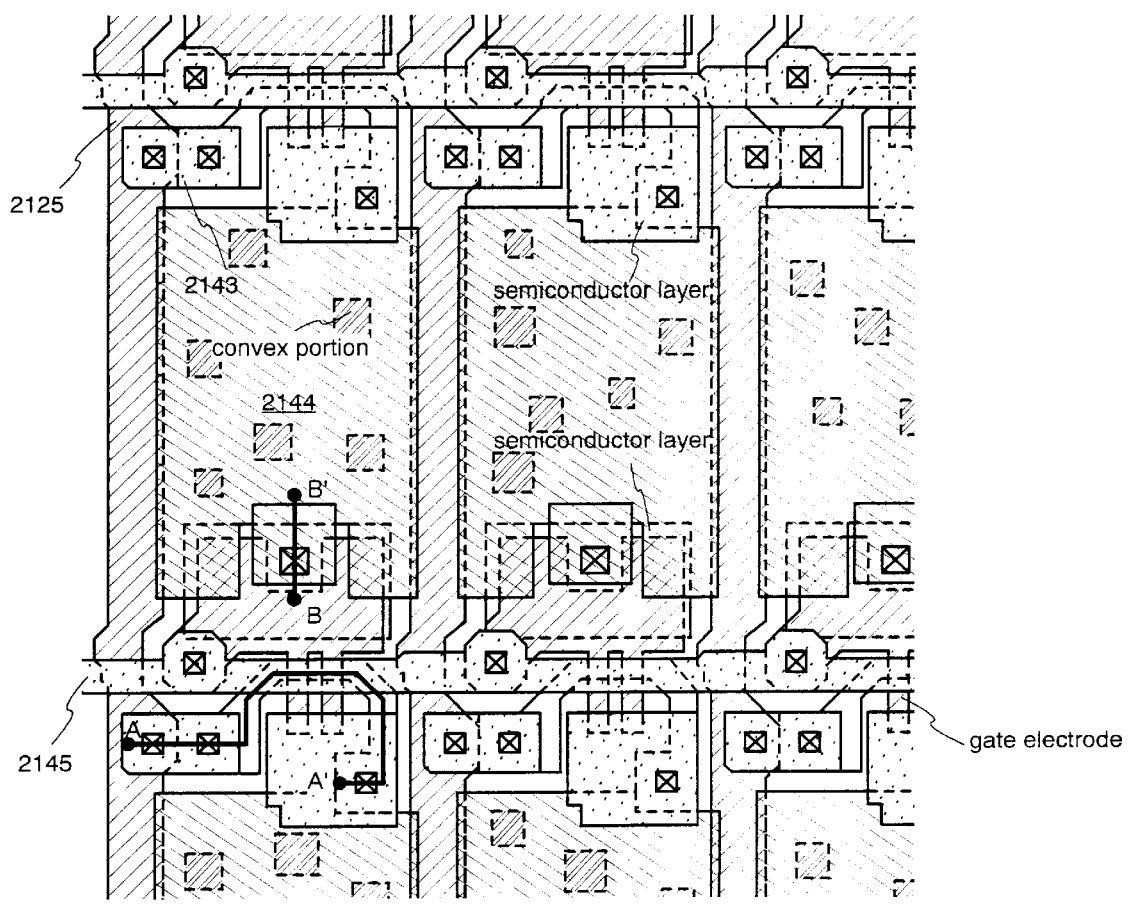
FIG. 30 is a top view of a semiconductor device according to the present invention.

FIG. 30 shows the top view of the active matrix substrate manufactured in accordance with this embodiment. In the case shown in this embodiment, a source line 2125 and a gate electrode are formed from the same conductive film in the same layer (the gate insulating film 2119). The pixel portion in this embodiment is provided with the uneven region 1207.

The manufacture process shown in this embodiment requires only six photo masks to fabricate an active matrix substrate (namely, a semiconductor layer pattern mask, a mask for forming a gate electrode, a mask for etching an unnecessary $L_{ov}$ region, a mask for forming for forming a source region and a drain region of a p-channel, a mask for forming contact holes, and a mask for forming a wiring line and a pixel electrode). Therefore a reflective active matrix substrate in which an uneven region having a plurality of protrusions is formed in a pixel portion to form an uneven pixel electrode can be manufactured without complicating the manufacture process. This embodiment is thus capable of contributing to cutting manufacture cost and improving the yield.

Embodiment 18

A reflective liquid crystal display device will be described in which an electro-optical device manufactured employing the present invention is combined with a light source, a reflector, and a light guide plate.

An LED or a cold-cathode tube is used for the light source. The light source is arranged along a side face of the light guide plate. The reflector is placed behind the light source. In this specification, the top face of the light guide plate refers to the face facing a user and the bottom face of the light guide plate refers to the face opposite to the top face.

Figure 46:
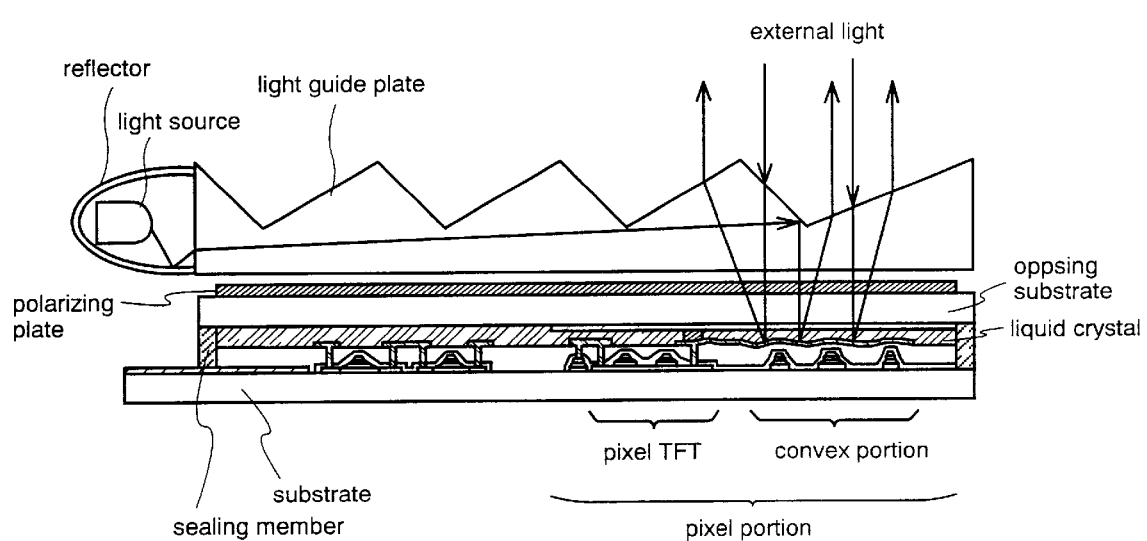
FIG. 46 is a diagram showing an embodiment of the present invention.

As shown in FIG. 46, light emitted from the light source efficiently enters the interior from the side face of the light guide plate owing to the reflector. The incident light is reflected at a part of the surface which is processed to form a prism and enters and travels through the semiconductor device. The light is then reflected at a reflective film provided on the bottom face of the semiconductor device, and goes back through the electro-optical device and the light guide plate to reach eyes of the user.

The material of the light guide plate may be quarts, inorganic glass (refractive index: 1.42 to 1.7, transmissivity: 80 to 91%) such as borosilicate glass, or a plastic material (resin material). The usable plastic material is a mixture of resins such as a methacrylic resin, typically polymethylmethacrylate known as acryl (refractive index: 1.49, transmissivity: 92 to 93%), polycarbonate (refractive index: 1.59, transmissivity: 88 to 90%), polyarylate (refractive index: 1.61, transmissivity: 85%), poly-4-methylpentene-1 (refractive index: 1.46, transmissivity: 90%), an AS resin [acrylonitrile-styrene polymer] (refractive index: 1.57, transmissivity: 90%), and an MS resin [methylmethacrylate-styrene copolymer] (refractive index: 1.56, transmissivity: 90%).

A semiconductor device manufactured in accordance with any one of Embodiments 1 through 11 can be applied to this embodiment.

Embodiment 19

Figure 47A:
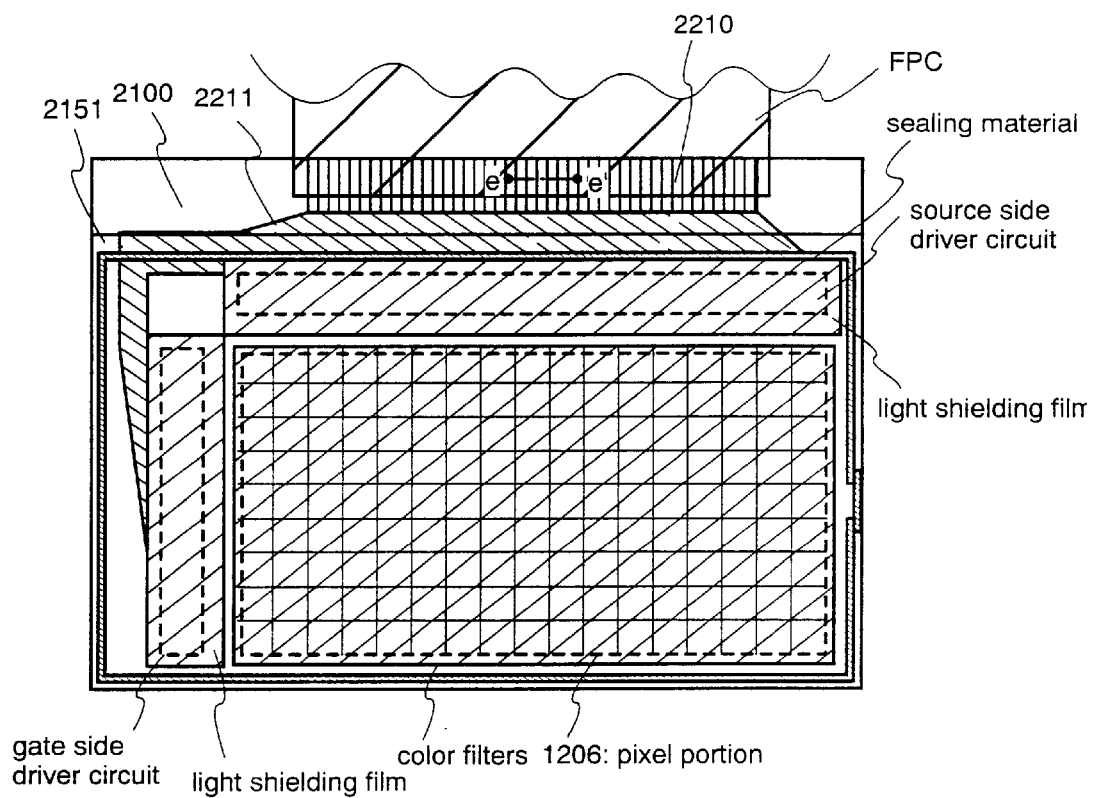
FIGS. 47A and 47B are respectively a top view and a sectional view of an embodiment of the present invention.

In the top view of FIG. 47A, an opposing substrate 2151 provided with a color filter and other components is bonded to an active matrix substrate through a sealing member. The active matrix substrate is provided with a pixel portion, a driver circuit, an external input terminal 2210 for bonding an FPC (flexible printed circuit), and a connection wiring line 2211 for connecting the external input terminal to input portions of circuits.

The FPC is composed of a base film 2213 and a wiring line 2214, and is bonded to the external input terminal by anisotropic conductive resin 2215. The mechanical strength of the bonding is enhanced by a reinforcing plate.

Figure 47B:
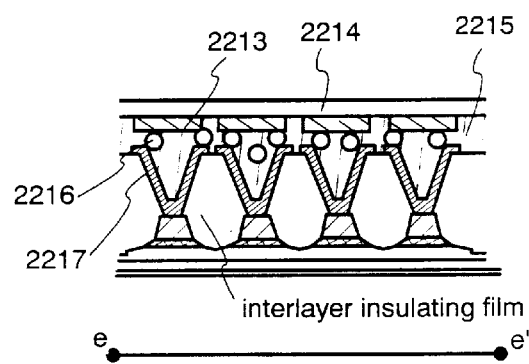

FIG. 47B shows a sectional view of the external input terminal 2210 taken along the line e–e' in FIG. 47A. Denoted by 2217 is a wiring line formed of a conductive film to form a pixel electrode 2144. The outer diameter of a conductive particle 2216 is smaller than the pitch of the wiring line 2217. Therefore, when dispersed throughout the adhesive 2215 in an appropriate amount, the conductive particle can establish an electric connection with the corresponding wiring line on the FPC side without causing short-circuit with adjacent wiring lines.

The liquid crystal display panel manufactured as above can be used for a display unit of various electric appliances.

Embodiment 20

This embodiment describes a case in which pixel TFTs for a pixel portion of a semiconductor device and TFTs for driver circuit of the semiconductor device all have the same conductivity type (all of them are p-channel TFTs, or all of them are n-channel TFTs). The description is given with reference to FIGS. 31A and 31B.

A general driver circuit is designed based on a CMOS circuit in which an n-channel TFT and a p-channel TFT are combined complementarily. On the other hand, the driver circuit of this embodiment is composed solely of TFTs having the same conductivity type (p-channel TFTs). Accordingly, the mask used in doping an impurity element for controlling the conductivity type is unnecessary, and one less masks can be accomplished in the manufacturing process of the TFTs. As a result, cutting the manufacture process and manufacture cost is made possible.

In a PMOS circuit, there are an EEMOS circuit composed of enhancement type TFTs and an EDMOS circuit composed of a combination of an enhancement type TFT and a depletion type TFT.

Figure 31A:
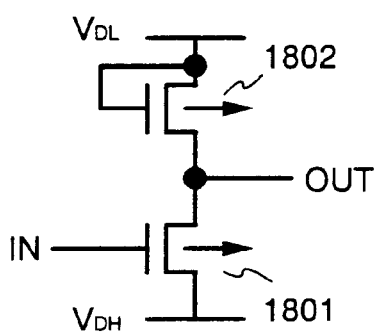
FIGS. 31A and 31B are diagrams showing the circuit structure of an EEMOS circuit and an EDMOS circuit, respectively.
Figure 31B:
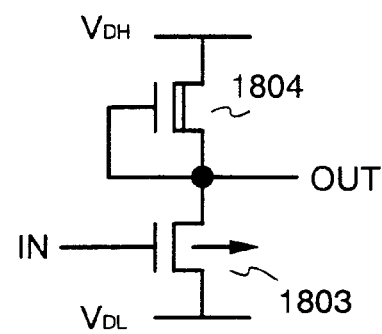

An example of the EEMOS circuit is shown in FIG. 31A whereas an example of the EDMOS circuit is shown in FIG. 31B. In FIG. 31A, denoted by 1801 and 1802 are both enhancement type p-channel TFTs (hereinafter referred to as E type PTFT). In FIG. 31B, 1803 denotes an E type PTFT while 1804 denotes a depletion type p-channel TFT (hereinafter referred to as D type PTFT).

In FIGS. 31A and 31B, $V_{DH}$ denotes a power supply line to which a positive voltage is applied (positive power supply line) and $V_{DL}$ denotes a power supply line to which a negative voltage is applied (negative power supply line). The negative power supply line may be a power supply line of a ground electric potential (ground power supply line).

As described above, the steps of forming an n-channel TFT are eliminated when all the TFTs are p-channel TFTs, thereby simplifying the manufacture process of an active matrix liquid crystal display device. Accompanying the simplification, the yield in the manufacture process is improved and manufacture cost of the active matrix liquid crystal display device can be reduced.

The characteristic required for a TFT varies depending on which circuit the TFT constitutes. By combining Embodiments 1 through 8, TFTs having different structures can be formed for different circuits without increasing the number of manufacture steps.

Embodiment 21

A semiconductor device manufactured in accordance with Embodiments 1 through 8 employs the GOLD structure that is known to be effective in preventing degradation of the ON current value due to hot carriers in order to secure reliability of a TFT of a driver circuit.

The present inventors have conducted tests on reliability in which the optimum value is obtained for the length of a region where a gate electrode and a low concentration impurity region overlap in the channel length direction in the GOLD structure (the length is hereinafter called the length of the $L_{ov}$ region) by setting three kinds of $L_{ov}$ length conditions.

The characteristic shift of an n-channel TFT due to transient stress is checked. The ON characteristic shift is observed after twenty hours (at room temperature) when Vd is +20 V and Vg is 2 to 6 V. The transient stress is a stress applied when the drain voltage is set to a certain value and the gate voltage is set to a certain value. The present inventors use the transient stress to estimate the reliability of a TFT.

Figure 32:
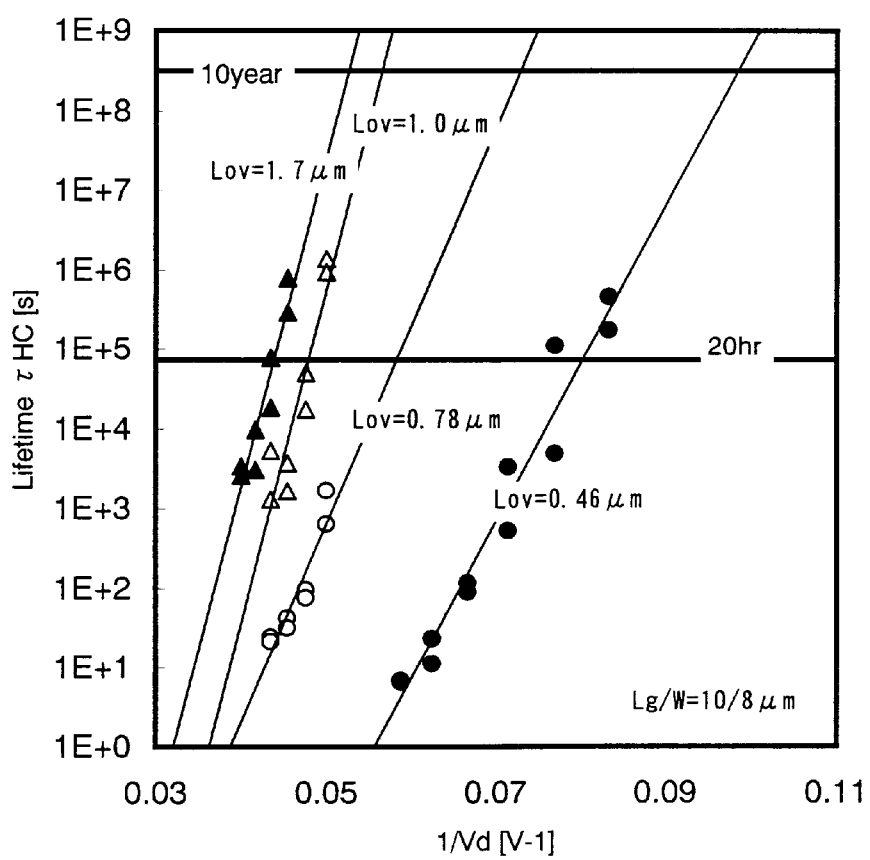
FIG. 32 is a graph showing results of measuring the reliability of a TFT manufactured in accordance with the present invention.

FIG. 32 shows results of measuring the transient stress of samples having different $L_{ov}$ lengths. The results in FIG. 32 confirm that the change in maximum value of the field effect mobility in twenty hours is limited to 10% or less when the $L_{ov}$ length is 1 μm or longer.

Subsequently, the time the current degradation rate takes to reach 10% is plotted against the reciprocal of the drain voltage. The ten-year guarantee voltage is obtained by inferring a stress voltage having a lifetime of ten years from a linear relation provided by plotting the reciprocal of a stress voltage into a semi-logarithmic graph. The lifetime here is defined as a time a TFT takes to change its maximum mobility value ($\mu FE_{(max)}$) by 10%. The present inventors use the ten-year guarantee voltage to estimate the reliability of a TFT.

Figure 33:
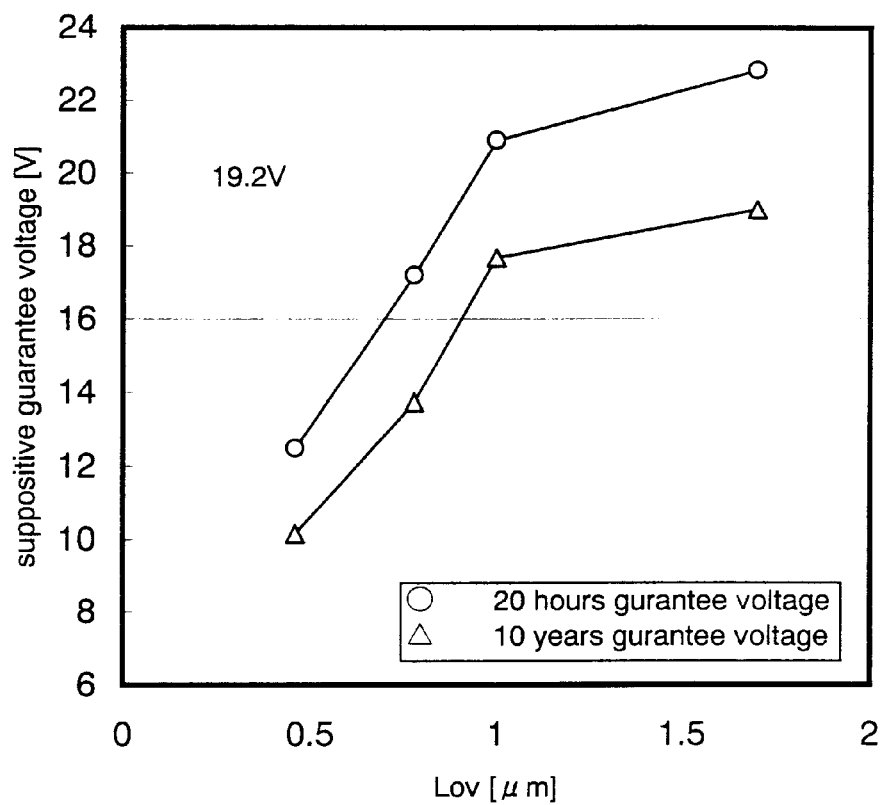
FIG. 33 is a graph showing results of measuring the reliability of a TFT manufactured in accordance with the present invention.

FIG. 33 shows results of obtaining the ten-year guarantee voltage for varying $L_{ov}$ lengths. The results in FIG. 33 show that a highly reliable semiconductor device can be obtained when the length of the $L_{ov}$ region is 1 μm or longer, preferably, 1.5 μm or longer.

Embodiment 22

The CMOS circuit and the pixel portion formed by implementing the present invention can be used in an active matrix liquid crystal display device. Namely, the present invention can be implemented for all electronic equipment that incorporates the semiconductor device (liquid crystal display device) in its display portion.

The following can be given as such electronic equipment: a video camera, a digital camera, a projector (rear type or front type), a head mounted display (goggle type display), a personal computer, and a portable information terminal (such as a mobile computer, a portable telephone, or an electronic book). Some examples of these are shown in FIGS. 34A to 36C.

Figure 34A:
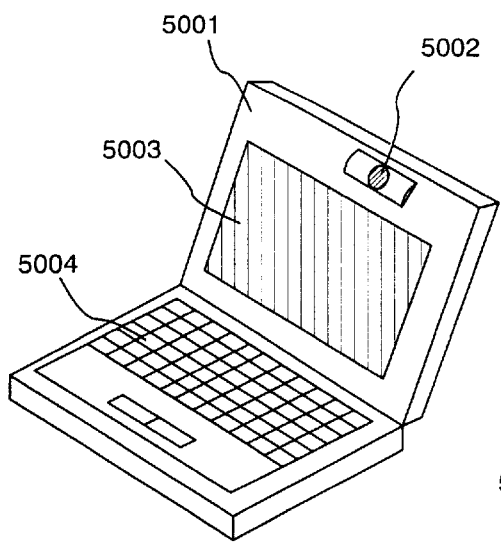
FIGS. 34A to 34F are diagrams showing examples of an electronic appliance.

FIG. 34A shows a personal computer, which contains components such as a main body 5001, an image input portion 5002, a display portion 5003, and a keyboard 5004. The present invention can be applied to the image input portion 5002, the display portion 5003, and other signal control circuits.

Figure 34B:
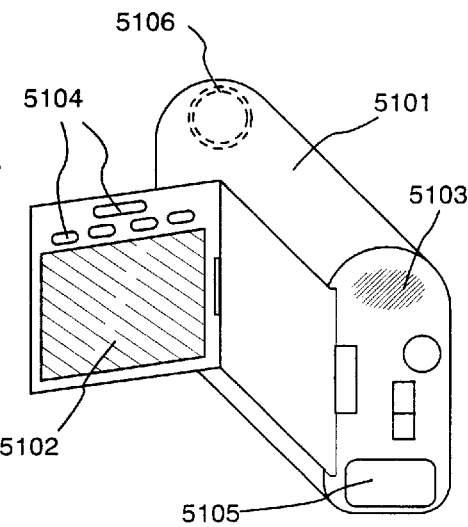

FIG. 34B shows a video camera, which contains components such as a main body 5101, a display portion 5102, an audio input portion 5103, operation switches 5104, a battery 5105, and an image receiving portion 5106. The present invention can be applied to the display portion 5102, and other signal control circuits.

Figure 34C:
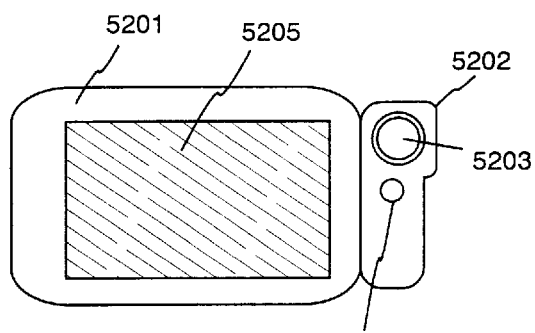

FIG. 34C shows a mobile computer, which contains components such as a main body 5201, a camera portion 5202, an image receiving portion 5203, operation switches 5204, and a display portion 5205. The present invention can be applied to the display portion 5205 and other signal control circuits.

Figure 34D:
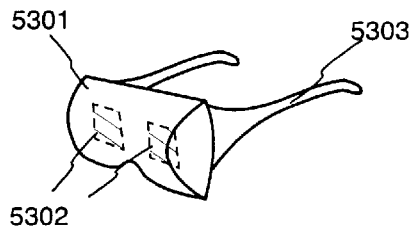

FIG. 34D shows a goggle type display, which contains components such as a main body 5301, a display portion 5302, and arm portions 5303. The present invention can be applied to the display portion 5302 and other signal control circuits.

Figure 34E:
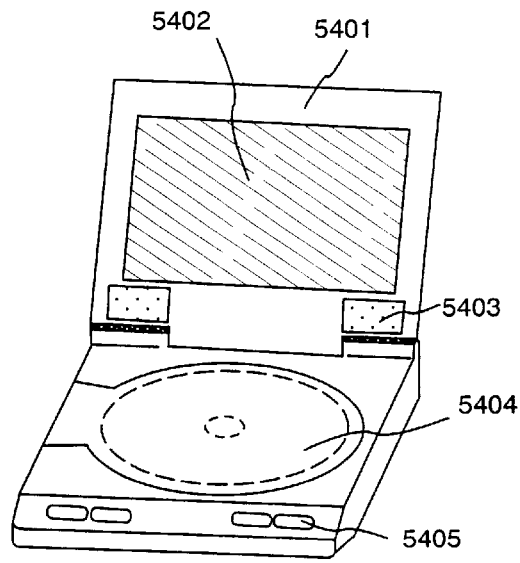

FIG. 34E shows a player which uses a recording medium with a program recorded therein (hereinafter referred to as a recording medium), which contains components such as a main body 5401, a display portion 5402, a speaker portion 5403, a recording medium 5404, and operation switches 5405. Note that a DVD (digital versatile disk) or CD (compact disk) is used as the recording medium for this player, and that appreciation of music or a movie or performing games or the Internet can be done. The present invention can be applied to the display portion 5402 and other signal control circuits.

Figure 34F:
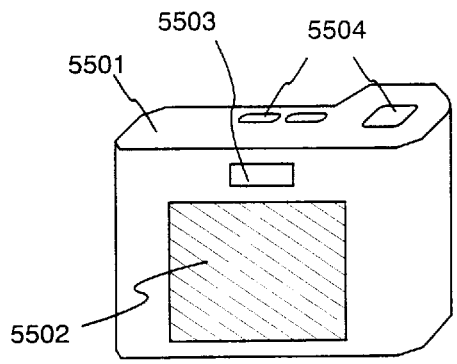

FIG. 34F shows a digital camera, which contains components such as a main body 5501, a display portion 5502, an eye piece portion 5503, operation switches 5504, and an image receiving portion (not shown in the figure). The present invention can be applied to the display portion 5502 and other signal control circuits.

Figure 35A:
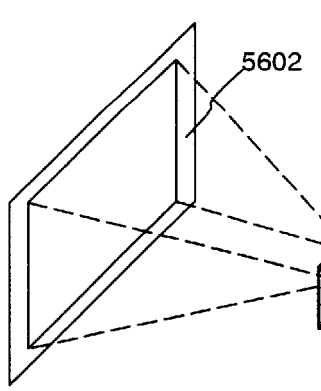
FIGS. 35A to 35D are diagrams showing examples of an electronic appliance.

FIG. 35A shows a front type projector, which contains components such as a projecting apparatus 5601 and a screen 5602. The present invention can be applied to a liquid crystal display device 5808 which structures a portion of the projecting apparatus 5601, and to other signal control circuits.

Figure 35B:
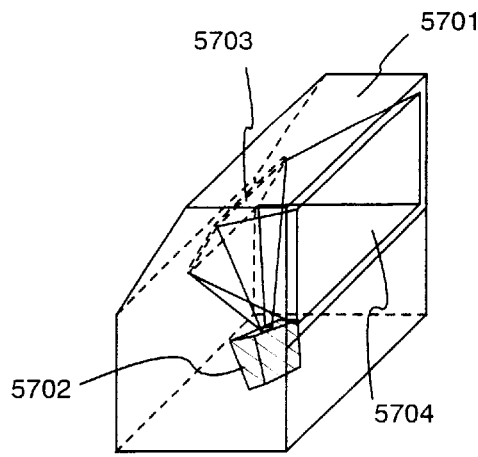

FIG. 35B shows a rear type projector, which contains components such as a main body 5701, a projecting apparatus 5702, a mirror 5703, and a screen 5704. The present invention can be applied to the liquid crystal display device 5808 which structures a portion of the projecting apparatus 5702, and to other signal control circuits.

Figure 35C:
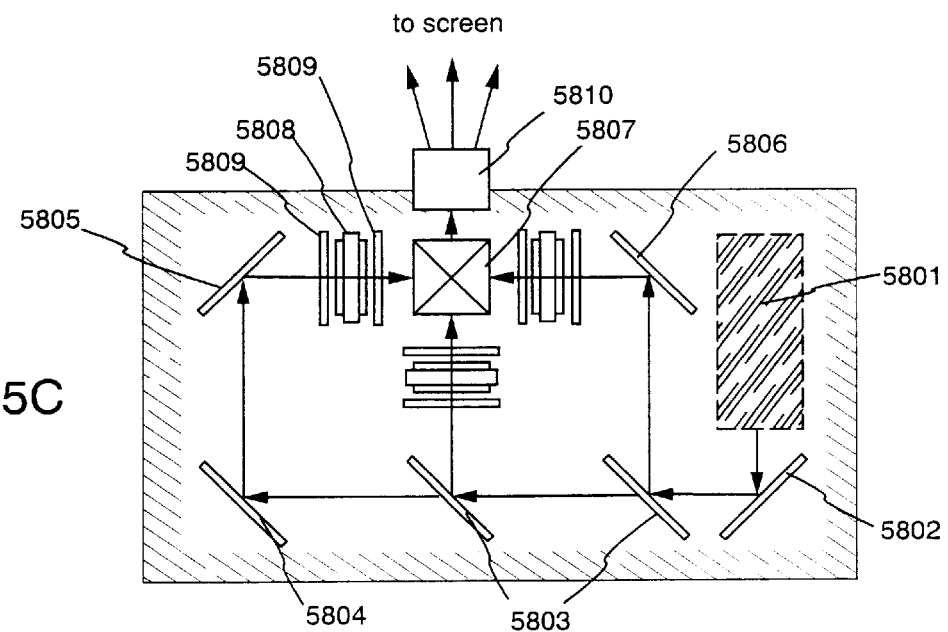

Note that an example of the structure of the projecting apparatuses 5601 and 5702 of FIG. 35A and FIG. 35B is shown in FIG. 35C. The projecting apparatuses 5601 and 5702 are each composed of a light source optical system 5801, mirrors 5802 and 5804 to 5806, a dichroic mirror 5803, a prism 5807, the liquid crystal display device 5808, a phase difference plate 5809, and a projecting optical system 5810. The projecting optical system 5810 is composed of an optical system including a projection lens. A three-plate type example is shown in Embodiment 10, but there are no particular limitations, and a single-plate type may also be used, for example. Further, optical systems such as an optical lens, a film having a light polarizing function, a film for regulating the phase difference, and an IR film may be suitably placed in the optical path shown by the arrow in FIG. 35C by the operator.

Figure 35D:
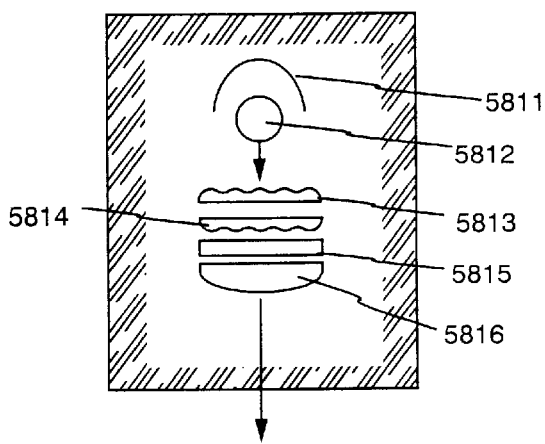

Furthermore, FIG. 35D is a diagram showing one example of the light source optical system 5801 in FIG. 35C. In Embodiment 22, the light source optical system 5801 is composed of a reflector 5811, a light source 5812, lens arrays 5813 and 5814, a polarizing conversion element 5815, and a condenser lens 5816. Note that the light source optical system shown in FIG. 35D is one example, and the light source optical system is not limited to the structure shown in the figure. For example, optical systems such as an optical lens, a film having a light polarizing function, a film for regulating the phase difference, and an IR film may be suitably added to the light source optical system by the operator.

Note that a case using a transmitting type electro-optical device in the projectors shown in FIG. 35A is shown here, and examples of applying a reflecting type electro-optical device and EL display device are not shown in the figures.

Figure 36A:
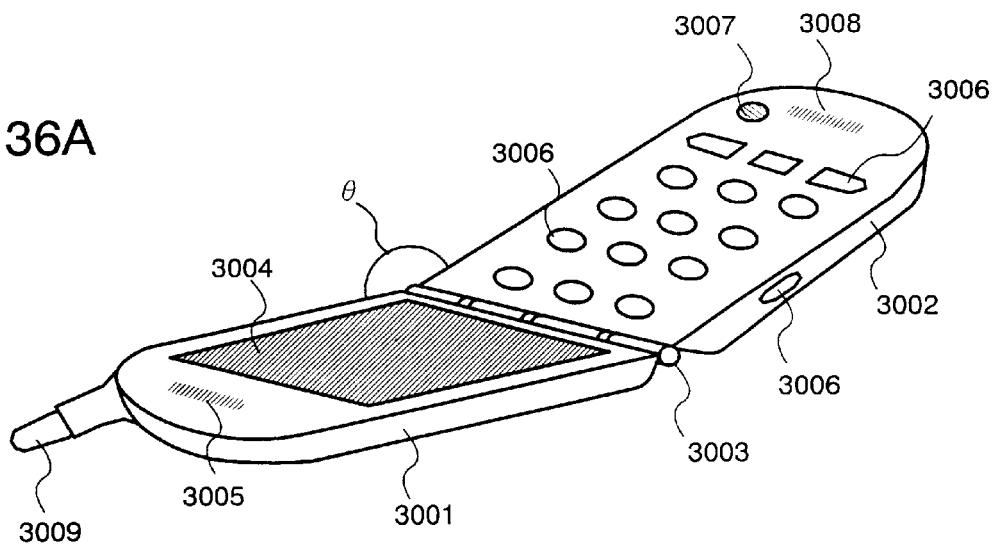
FIGS. 36A to 36C are diagrams showing examples of an electronic appliance.

FIG. 36A shows a portable telephone, and reference numerals 3001 and 3002 denote a display panel and an operation panel, respectively. The display panel 3001 and the operation panel 3002 are connected through a connecting portion 3003. In the connecting portion 3003, an angle θ formed by the surface on which a display portion 3004 of the display panel 3001 is provided and the surface on which operation keys 3006 of the operation panel 3002 are provided can be arbitrarily changed. Further, the portable telephone includes an audio output portion 3005, the operation keys 3006, a power source switch 3007, and an audio input portion 3008. The present invention can be applied to the display portion 3004.

Figure 36B:
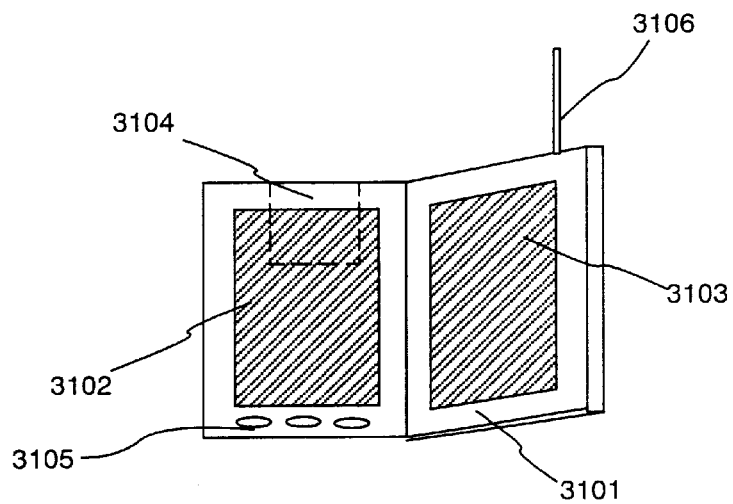

FIG. 36B shows a portable book (electronic book), which contains components such as a main body 3101, display portions 3102 and 3103, a recording medium 3104, operation switches 3105, and an antenna 3106. The present invention can be applied to the display portions 3102 and 3103, and to other signal control circuits.

Figure 36C:
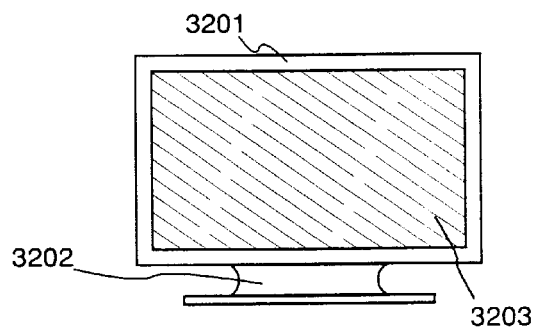

FIG. 36C shows a display, which contains components such as a main body 3201, a support stand 3202, and a display portion 3203. The present invention can be applied to the display portion 3103. The display of the present invention is advantageous for cases of large size screens in particular, and is advantageous for displays having a diagonal equal to or greater than 10 inches (in particular, equal to or greater than 30 inches).

The applicable range of the present invention is thus extremely wide, and the present invention can be applied to electronic equipment of all fields. Furthermore, the electronic equipment in this embodiment can be realized by using a semiconductor device formed in accordance with any combination of Embodiments 1 to 14.

By employing the present invention, TFTs whose required characteristics are different from one another can be formed on the same substrate without increasing the number of manufacture steps. Since the manufacture steps do not increase, manufacture cost is lowered and the yield is not reduced. The present invention also can provide a highly reliable semiconductor device.

Moreover, the semiconductor device can have excellent visibility by giving its pixel electrode an uneven surface.

What is claimed is:

1. A semiconductor device having a TFT that is formed in a pixel portion and an n-channel TFT and a p-channel TFT that constitute a driver circuit provided in the periphery of the pixel portion, all of the TFTs being formed over a same substrate, wherein:
   the n-channel TFT has a gate electrode and a second concentration impurity region that partially overlaps the gate electrode, wherein the gate electrode of the n-channel TFT has a taper shaped cross section, and the p-channel TFT and the TFT formed in the pixel portion respectively have gate electrodes and second concentration impurity regions that do not overlap the gate electrodes, wherein the gate electrodes of the p-channel TFT and the TFT formed in the pixel portion do not have a taper shaped cross section.

2. A semiconductor device having a TFT that is formed in a pixel portion and an n-channel TFT and a p-channel TFT that constitute a driver circuit provided in the periphery of the pixel portion, all of the TFTs being formed over a same substrate, wherein:
   the n-channel TFT has a gate electrode comprising a first conductive film and a second conductive film, with the first conductive film contacting the top face of a gate insulating film, the second conductive film contacting the top face of the first conductive film, the first conductive film being longer than the second conductive film in the channel length direction, and the first conductive film partially overlapping a second concentration impurity region, and
   the p-channel TFT and the TFT formed in the pixel portion respectively have gate electrodes that do not overlap second concentration impurity regions, the gate electrodes comprising the first conductive film that contacts the top face of the gate insulating film and the second conductive film that contacts the top face of the first conductive film, with the first conductive film and the second conductive film having the same length in the channel length direction.

3. A semiconductor device having a driver circuit comprising an n-channel TFT, a first p-channel TFT, and a second p-channel TFT, each formed over a same substrate, wherein:
   the n-channel TFT has a semiconductor layer, a gate insulating film formed on the semiconductor layer, and a gate electrode formed on the gate insulating film, with the semiconductor layer including a channel formation region, a source region, a drain region, and a second concentration impurity region;
   the gate electrode comprises a first conductive film and a second conductive film, with the first conductive film contacting the top face of the gate insulating film, and the second conductive film contacting the top face of the first conductive film;
   the second concentration impurity region overlaps the first conductive film with the gate insulating film interposed therebetween;
   the first p-channel TFT has a semiconductor layer, a gate insulating film formed on the semiconductor layer, and a gate electrode formed on the gate insulating film, with the semiconductor layer including a channel formation region, a source region, a drain region, and a fifth concentration impurity region;
   the channel formation region and the gate electrode of the first p-channel TFT have substantially a same length in the channel length direction;
   the second p-channel TFT has a semiconductor layer, a gate insulating film formed on the semiconductor layer, and a gate electrode formed on the gate insulating film, with the semiconductor layer including a channel formation region, a source region, a drain region, and a fifth concentration impurity region;
   the gate electrode of the second p-channel TFT comprises a first conductive film and a second conductive film, with the first conductive film contacting the top face of the gate insulating film, and the second conductive film contacting the top face of the first conductive film; and
   the fifth concentration impurity region of the second p-channel TFT overlaps the first conductive film with the gate insulating film interposed therebetween.

4. A semiconductor device having a driver circuit comprising an n-channel TFT, a first p-channel TFT, and a second p-channel TFT, each formed over a same substrate, wherein:
- the n-channel TFT has a semiconductor layer, a gate insulating film formed on the semiconductor layer, and a gate electrode formed on the gate insulating film, with the semiconductor layer including a channel formation region, a source region, a drain region, and a second concentration impurity region;
- the gate electrode comprises a first conductive film and a second conductive film, with the first conductive film contacting the top face of the gate insulating film, and the second conductive film contacting the top face of the first conductive film;
- the second concentration impurity region overlaps the first conductive film with the gate insulating film interposed therebetween;
- the first p-channel TFT has a semiconductor layer, a gate insulating film formed on the semiconductor layer, and a gate electrode formed on the gate insulating film, with the semiconductor layer including a channel formation region, a source region, a drain region, a fifth concentration impurity region and an offset region;
- the second p-channel TFT has a semiconductor layer, a gate insulating film formed on the semiconductor layer, and a gate electrode formed on the gate insulating film, with the semiconductor layer including a channel formation region, a source region, a drain region, and a fifth concentration impurity region;
- the gate electrode of the second p-channel TFT comprises a first conductive film and a second conductive film, with the first conductive film contacting the top face of the gate insulating film, and the second conductive film contacting the top face of the first conductive film; and
- the fifth concentration impurity region of the second p-channel TFT overlaps the first conductive film with the gate insulating film interposed therebetween.

5. A semiconductor device having a driver circuit and a pixel portion, with the driver circuit comprising an n-channel TFT, a first p-channel TFT, and a second p-channel TFT, and the pixel portion including a TFT and a storage capacitor, each formed over a same substrate, wherein:
- the n-channel TFT has a semiconductor layer, a gate insulating film formed on the semiconductor layer, and a gate electrode formed on the gate insulating film, with the semiconductor layer including a channel formation region, a source region, a drain region, and a second concentration impurity region;
- the gate electrode comprises a first conductive film and a second conductive film, with the first conductive film contacting the top face of the gate insulating film, and the second conductive film contacting the top face of the first conductive film;
- the second concentration impurity region overlaps the first conductive film with the gate insulating film interposed therebetween;
- the first p-channel TFT has a semiconductor layer, a gate insulating film formed on the semiconductor layer, and a gate electrode formed on the gate insulating film, with the semiconductor layer including a channel formation region, a source region, a drain region, a fifth concentration impurity region, and an offset region;
- the second p-channel TFT has a semiconductor layer, a gate insulating film formed on the semiconductor layer, and a gate electrode formed on the gate insulating film, with the semiconductor layer including a channel formation region, a source region, a drain region, and a fifth concentration impurity region;
- the gate electrode of the second p-channel TFT comprises a first conductive film and a second conductive film, with the first conductive film contacting the top face of the gate insulating film, and the second conductive film contacting the top face of the first conductive film;
- the fifth concentration impurity region of the second p-channel TFT overlaps the first conductive film with the gate insulating film interposed therebetween; and
- the TFT formed in the pixel portion has a semiconductor layer that includes a channel formation region, a source region, a drain region, a second impurity region, and an offset region.

6. A semiconductor device having a driver circuit comprising an n-channel TFT, a first p-channel TFT, and a second p-channel TFT, each formed over a same substrate, wherein:
- the n-channel TFT has a semiconductor layer, a gate insulating film formed on the semiconductor layer, and a gate electrode formed on the gate insulating film, with the semiconductor layer including a channel formation region, a source region, a drain region, and a second concentration impurity region;
- the gate electrode comprises a first conductive film and a second conductive film, with the first conductive film contacting the top face of the gate insulating film, and the second conductive film contacting the top face of the first conductive film;
- the second concentration impurity region has an Lov region and an Loff region with the Lov region overlapping the first conductive film with the gate insulating film interposed therebetween, and the Loff region not overlapping the first conductive film; and
- the first p-channel TFT and the second p-channel TFT respectively have gate electrodes, semiconductor layers, with each of the semiconductor layers including a channel formation region, a source region, a drain region, and a fifth concentration impurity region, wherein the fifth concentration impurity region of the first p-channel TFT does not overlap the gate electrode, and the fifth concentration impurity region of the second p-channel TFT overlaps the gate electrode.

7. A semiconductor device according to claim 1, wherein the gate electrodes of each TFT comprises an element selected from the group consisting of Ta, W, Ti, Mo, Al, and Cu, or formed of an alloy material or a compound material containing any element in the group above as its main ingredient.

8. A semiconductor device according to claim 1, wherein:
- a plurality of protrusions are formed in the pixel portion;
- the TFT formed in the pixel portion is electrically connected to an uneven pixel electrode; and
- the uneven portion of the pixel electrode has a radius of curvature of 0.1 to 0.4 $\mu$m, and the uneven portion of the pixel electrode is 0.3 to 3 $\mu$m tall.

9. A semiconductor device according to claim 1, wherein:
- a plurality of protrusions are formed in the pixel portion;
- an interlayer insulating film covering the TFT formed in the pixel portion and the protrusions is formed of an organic resin with a viscosity of 10 to 1000 cp;
- the TFT formed in the pixel portion is electrically connected to an uneven pixel electrode; and the uneven portion of the pixel electrode has a radius of curvature of 0.1 to 0.4 µm, and the uneven portion of the pixel electrode is 0.3 to 3 µm tall.

10. A semiconductor device according to claim 1, wherein said semiconductor device is a liquid crystal display device.

11. A semiconductor device according to claim 1, wherein said semiconductor device is one selected from the group consisting of a personal computer, a video camera, a mobile computer, a goggle type display, a digital camera, a projector, a mobile telephone, and a portable electronic book.

12. A method of manufacturing a semiconductor device comprising the steps of:

forming a semiconductor layer on an insulating surface;

forming an insulating film on the semiconductor layer;

forming, on the insulating film, a first shape conductive layer that is a laminate of a first shape first conductive film and a first shape second conductive film;

forming a first concentration impurity region by doping the semiconductor layer with an n type impurity element using the first shape conductive layer as a mask;

etching the first shape conductive layer electrode to form a second shape conductive layer that is a laminate of a second shape first conductive film and a second shape second conductive film;

forming a second concentration impurity region or a third concentration impurity region by doping the semiconductor layer with an n type impurity element transmitted through the second shape first conductive film using the second shape second conductive film as a mask;

forming a third shape conductive layer by etching the second shape first conductive film using the second shape second conductive film as a mask, the third shape conductive layer consisting of a laminate of a third shape first conductive film and a third shape second conductive film; and etching a gate insulating film using the third shape conductive layer electrode as a mask.

13. A method of manufacturing a semiconductor device comprising the steps of:

forming a semiconductor layer on an insulating surface;

forming an insulating film on the semiconductor layer;

forming, on the insulating film, a first shape conductive layer that is a laminate of a first shape conductive film and a second shape conductive film;

forming a first concentration impurity region by doping the semiconductor layer with an n type impurity element using the first shape conductive layer as a mask;

etching the first shape conductive layer to form a second shape conductive layer that is a laminate of a second shape first conductive film and a second shape second conductive film;

forming a second concentration impurity region or a third concentration impurity region by doping the semiconductor layer with an n type impurity element transmitted through the second shape first conductive film using the second shape second conductive film as a mask;

forming a resist mask in a region for forming an n-channel TFT of a driver circuit portion;

forming, in a region where the resist mask is not formed, a third shape conductive layer by etching the second shape first conductive film using the second shape second conductive film as a mask, the third shape conductive layer consisting of a laminate of a third shape first conductive film and a third shape second conductive film;

peeling the resist mask formed; and etching a gate insulating film using the third shape conductive layer as a mask.

14. A method according to claim 12, wherein the second shape conductive layer is shorter than the first shape conductive layer in the channel length direction.

15. A method according to claim 12, wherein the third shape conductive layer is shorter than the first shape conductive layer in the channel length direction, and is shorter than the second shape conductive layer in the channel length direction.

16. A method according to claim 12, wherein said semiconductor device is a liquid crystal display device.

17. A method according to claim 12, wherein said semiconductor device is one selected from the group consisting of a personal computer, a video camera, a mobile computer, a goggle type display, a digital camera, a projector, a mobile telephone, and a portable electronic book.

18. A method of manufacturing a semiconductor device comprising the steps of:

forming an amorphous semiconductor film on an insulating surface;

irradiating the amorphous semiconductor film with laser light to form a crystalline semiconductor film, thereby completing a semiconductor layer;

forming a gate insulating film covering the semiconductor layer;

forming a first conductive film and a second conductive film on the gate insulating film;

etching the first conductive film and the second conductive film to form a first shape conductive layer;

forming a first concentration impurity region by doping the semiconductor layer with an n type impurity element;

etching the first shape conductive layer to form a second shape conductive layer;

doping the semiconductor layer with an n type impurity element to form a second concentration impurity region;

forming a fourth concentration impurity region and a fifth concentration impurity region by covering an n-channel TFT and a TFT formed in a pixel portion with a resist mask and then doping the semiconductor layer with a p type impurity element; and forming a third shape conductive layer by covering the n-channel TFT and a p-channel TFT with a resist mask and then etching the second shape conductive layer.

19. A method of manufacturing a semiconductor device comprising the steps of:

forming an amorphous semiconductor film on an insulating surface;

irradiating the amorphous semiconductor film with laser light to form a crystalline semiconductor film, thereby completing a semiconductor layer;

forming a gate insulating film covering the semiconductor layer;

forming a first conductive film and a second conductive film on the gate insulating film;

etching the first conductive film and the second conductive film to form a first shape conductive layer;

forming a first concentration impurity region by doping the semiconductor layer with an n type impurity element;

etching the first shape conductive layer to form a second shape conductive layer;

doping the semiconductor layer with an n type impurity element to form a second concentration impurity region;

forming a fourth concentration impurity region and a fifth concentration impurity region by covering an n-channel TFT and a TFT formed in a pixel portion with a resist mask and then doping the semiconductor layer with a p type impurity element; and forming offset regions respectively in the semiconductor layer of the TFT formed in the pixel portion and in the semiconductor layer of a first p-channel TFT by covering the n-channel TFT and a second p-channel TFT with a resist mask and then etching the second shape conductive layer to form a third shape conductive layer.

20. A method of manufacturing a semiconductor device comprising the steps of:

forming an amorphous semiconductor film on an insulating surface;

irradiating the amorphous semiconductor film with laser light to form a crystalline semiconductor film, thereby completing a semiconductor layer;

forming a gate insulating film covering the semiconductor layer;

forming a first conductive film and a second conductive film on the gate insulating film;

etching the first conductive film and the second conductive film to form a first shape conductive layer;

forming a first concentration impurity region by doping the semiconductor layer with an n type impurity element;

etching the first shape conductive layer to form a second shape conductive layer;

forming a fourth concentration impurity region and a fifth concentration impurity region by covering an n-channel TFT and a TFT formed in a pixel portion with a resist mask and then doping the semiconductor layer with a p type impurity element;

forming a third shape conductive layer by covering the n-channel TFT and a second p-channel TFT with a resist mask and then etching the second shape conductive layer in a first p-channel TFT and in the TFT formed in the pixel portion; and forming a second concentration impurity region by doping the semiconductor layer with an n type impurity element.

21. A method of manufacturing a semiconductor device comprising the steps of:

forming an amorphous semiconductor film on an insulating surface;

irradiating the amorphous semiconductor film with laser light to form a crystalline semiconductor film, thereby completing a semiconductor layer;

forming a gate insulating film covering the semiconductor layer;

forming a first conductive film and a second conductive film on the gate insulating film;

etching the first conductive film and the second conductive film to form a first shape conductive layer;

forming a first concentration impurity region by doping the semiconductor layer with an n type impurity element;

etching the first shape conductive layer to form a second shape conductive layer;

doping the semiconductor layer with an n type impurity element to form a second concentration impurity region;

forming a third shape conductive layer by covering the n-channel TFT with a resist mask and then etching the second shape conductive layer in a first p-channel TFT, in a second p-channel TFT, and in a TFT formed in a pixel portion;

etching the gate insulating film; and forming a fourth concentration impurity region and a fifth concentration impurity region by covering the n-channel TFT and the TFT formed in the pixel portion with a resist mask and then doping the semiconductor layer with a p type impurity element.

22. A method of manufacturing a semiconductor device comprising the steps of:

forming an amorphous semiconductor film on an insulating surface;

irradiating the amorphous semiconductor film with laser light to form a crystalline semiconductor film, thereby completing a semiconductor layer;

forming a gate insulating film covering the semiconductor layer;

forming a first conductive film and a second conductive film on the gate insulating film;

etching the first conductive film and the second conductive film to form a first shape conductive layer;

forming a first concentration impurity region by doping the semiconductor layer with an n type impurity element;

etching the first shape conductive layer to form a second shape conductive layer;

doping the semiconductor layer with an n type impurity element to form a second concentration impurity region;

etching the second shape conductive layer after covering an n-channel TFT with a resist mask; and forming a fourth concentration impurity region and a fifth concentration impurity region by covering the n-channel TFT and a TFT formed in a pixel portion with a resist mask and then doping the semiconductor layer with a p type impurity element.

23. A method of manufacturing a semiconductor device comprising the steps of:

forming an amorphous semiconductor film on an insulating surface;

irradiating the amorphous semiconductor film with laser light to form a crystalline semiconductor film, thereby completing a semiconductor layer;

forming a gate insulating film covering the semiconductor layer;

forming a first conductive film and a second conductive film on the gate insulating film;

etching the first conductive film and the second conductive film to form a first shape conductive layer;

forming a first concentration impurity region by doping the semiconductor layer with an n type impurity element;

etching the first shape conductive layer to form a second shape conductive layer;

doping the semiconductor layer with an n type impurity element to form a second concentration impurity region having a region that overlaps a gate electrode with the gate insulating film interposed therebetween and a region that does not overlap the gate electrode;

forming a third shape conductive layer by covering the n-channel TFT with a resist mask and then etching the second shape conductive layer in a first p-channel TFT, in a second p-channel TFT, and in a TFT formed in a pixel portion; and forming a fourth concentration impurity region and a fifth concentration impurity region by covering the n-channel TFT and the TFT formed in the pixel portion with a resist mask and then doping the semiconductor layer with a p type impurity element.

24. A method of manufacturing a semiconductor device comprising the steps of:

forming an amorphous semiconductor film on an insulating surface;

irradiating the amorphous semiconductor film with laser light to form a crystalline semiconductor film, thereby completing a semiconductor layer;

forming a gate insulating film covering the semiconductor layer;

forming a first conductive film and a second conductive film on the gate insulating film;

etching the first conductive film and the second conductive film to form a first shape gate electrode and a wiring line;

forming a first concentration impurity region by doping the semiconductor layer with an n type impurity element;

etching the first shape conductive layer to form a second shape conductive layer;

doping the semiconductor layer with an n type impurity element to form a second concentration impurity region;

forming a third shape conductive layer by covering an n-channel TFT and a p-channel TFT with a resist mask and then etching the second shape conductive layer;

forming a fourth concentration impurity region and a fifth concentration impurity region by covering the n-channel TIT and a TFT formed in a pixel portion with a resist mask and then doping the semiconductor layer with a p type impurity element; and forming an inorganic interlayer insulating film over an entire surface.

25. A method according to claim 18, wherein the step of crystallizing the amorphous semiconductor film includes: introducing the amorphous semiconductor film with an element selected from the group consisting of nickel (Ni), iron (Fe), palladium (Pd), tin (Sn), lead (Pb), cobalt (Co), platinum (Pt), copper (Cu), and gold (Au) as a catalytic element for promoting crystallization; heating the amorphous semiconductor film; and irradiating the crystallized semiconductor film with laser light.

26. A method according to claim 18, wherein said semiconductor device is a liquid crystal display device.

27. A method according to claim 18, wherein said semiconductor device is one selected from the group consisting of a personal computer, a video camera, a mobile computer, a goggle type display, a digital camera, a projector, a mobile telephone, and a portable electronic book.

28. A semiconductor device according to claim 2, wherein the gate electrodes of each TFT comprises an element selected from the group consisting of Ta, W, Ti, Mo, Al, and Cu, or formed of an alloy material or a compound material containing any element in the group above as its main ingredient.

29. A semiconductor device according to claim 3, wherein the gate electrodes of each TFT comprises an element selected from the group consisting of Ta, W, Ti, Mo, Al, and Cu, or formed of an alloy material or a compound material containing any element in the group above as its main ingredient.

30. A semiconductor device according to claim 4, wherein the gate electrodes of each TFT comprises an element selected from the group consisting of Ta, W, Ti, Mo, Al, and Cu, or formed of an alloy material or a compound material containing any element in the group above as its main ingredient.

31. A semiconductor device according to claim 5, wherein the gate electrodes of each TFT comprises an element selected from the group consisting of Ta, W, Ti, Mo, Al, and Cu, or formed of an alloy material or a compound material containing any element in the group above as its main ingredient.

32. A semiconductor device according to claim 6, wherein the gate electrodes of each TFT comprises an element selected from the group consisting of Ta, W, Ti, Mo, Al, and Cu, or formed of an alloy material or a compound material containing any element in the group above as its main ingredient.

33. A semiconductor device according to claim 2, wherein:
a plurality of protrusions are formed in the pixel portion;
the TFT formed in the pixel portion is electrically connected to an uneven pixel electrode; and
the uneven portion of the pixel electrode has a radius of curvature of 0.1 to 0.4 $\mu$m, and the uneven portion of the pixel electrode is 0.3 to 3 $\mu$m tall.

34. A semiconductor device according to claim 5, wherein:
a plurality of protrusions are formed in the pixel portion;
the TFT formed in the pixel portion is electrically connected to an uneven pixel electrode; and
the uneven portion of the pixel electrode has a radius of curvature of 0.1 to 0.4 $\mu$m, and the uneven portion of the pixel electrode is 0.3 to 3 $\mu$m tall.

35. A semiconductor device according to claim 2, wherein:
a plurality of protrusions are formed in the pixel portion;
an interlayer insulating film covering the TFT formed in the pixel portion and the protrusions is formed of an organic resin with a viscosity of 10 to 1000 cp;
the TFT formed in the pixel portion is electrically connected to an uneven pixel electrode; and
the uneven portion of the pixel electrode has a radius of curvature of 0.1 to 0.4 $\mu$m, and the uneven portion of the pixel electrode is 0.3 to 3 $\mu$m tall.

36. A semiconductor device according to claim 5, wherein:
a plurality of protrusions are formed in the pixel portion;
an interlayer insulating film covering the TFT formed in the pixel portion and the protrusions is formed of an organic resin with a viscosity of 10 to 1000 cp;
the TFT formed in the pixel portion is electrically connected to an uneven pixel electrode; and
the uneven portion of the pixel electrode has a radius of curvature of 0.1 to 0.4 $\mu$m, and the uneven portion of the pixel electrode is 0.3 to 3 $\mu$m tall.

37. A semiconductor device according to claim 2, wherein said semiconductor device is a liquid crystal display device.

38. A semiconductor device according to claim 3, wherein said semiconductor device is a liquid crystal display device.

39. A semiconductor device according to claim 4, wherein said semiconductor device is a liquid crystal display device.

40. A semiconductor device according to claim 5, wherein said semiconductor device is a liquid crystal display device.

41. A semiconductor device according to claim 6, wherein said semiconductor device is a liquid crystal display device.

42. A semiconductor device according to claim 2, wherein said semiconductor device is one selected from the group consisting of a personal computer, a video camera, a mobile computer, a goggle type display, a digital camera, a projector, a mobile telephone, and a portable electronic book.

43. A semiconductor device according to claim 3, wherein said semiconductor device is one selected from the group consisting of a personal computer, a video camera, a mobile computer, a goggle type display, a digital camera, a projector, a mobile telephone, and a portable electronic book.

44. A semiconductor device according to claim 4, wherein said semiconductor device is one selected from the group consisting of a personal computer, a video camera, a mobile computer, a goggle type display, a digital camera, a projector, a mobile telephone, and a portable electronic book.

45. A semiconductor device according to claim 5, wherein said semiconductor device is one selected from the group consisting of a personal computer, a video camera, a mobile computer, a goggle type display, a digital camera, a projector, a mobile telephone, and a portable electronic book.

46. A semiconductor device according to claim 6, wherein said semiconductor device is one selected from the group consisting of a personal computer, a video camera, a mobile computer, a goggle type display, a digital camera, a projector, a mobile telephone, and a portable electronic book.

47. A method according to claim 13, wherein the second shape conductive layer is shorter than the first shape conductive layer in the channel length direction.

48. A method according to claim 13, wherein the third shape conductive layer is shorter than the first shape conductive layer in the channel length direction, and is shorter than the second shape conductive layer in the channel length direction.

49. A method according to claim 13, wherein said semiconductor device is a liquid crystal display device.

50. A method according to claim 13, wherein said semiconductor device is one selected from the group consisting of a personal computer, a video camera, a mobile computer, a goggle type display, a digital camera, a projector, a mobile telephone, and a portable electronic book.

51. A method according to claim 19, wherein the step of crystallizing the amorphous semiconductor film includes: introducing the amorphous semiconductor film with an element selected from the group consisting of nickel (Ni), iron (Fe), palladium (Pd), tin (Sn), lead (Pb), cobalt (Co), platinum (Pt), copper (Cu), and gold (Au) as a catalytic element for promoting crystallization; heating the amorphous semiconductor film; and irradiating the crystallized semiconductor film with laser light.

52. A method according to claim 20, wherein the step of crystallizing the amorphous semiconductor film includes: introducing the amorphous semiconductor film with an element selected from the group consisting of nickel (Ni), iron (Fe), palladium (Pd), tin (Sn), lead (Pb), cobalt (Co), platinum (Pt), copper (Cu), and gold (Au) as a catalytic element for promoting crystallization; heating the amorphous semiconductor film; and irradiating the crystallized semiconductor film with laser light.

53. A method according to claim 21, wherein the step of crystallizing the amorphous semiconductor film includes: introducing the amorphous semiconductor film with an element selected from the group consisting of nickel (Ni), iron (Fe), palladium (Pd), tin (Sn), lead (Pb), cobalt (Co), platinum (Pt), copper (Cu), and gold (Au) as a catalytic element for promoting crystallization; heating the amorphous semiconductor film; and irradiating the crystallized semiconductor film with laser light.

54. A method according to claim 22, wherein the step of crystallizing the amorphous semiconductor film includes: introducing the amorphous semiconductor film with an element selected from the group consisting of nickel (Ni), iron (Fe), palladium (Pd), tin (Sn), lead (Pb), cobalt (Co), platinum (Pt), copper (Cu), and gold (Au) as a catalytic element for promoting crystallization; heating the amorphous semiconductor film; and irradiating the crystallized semiconductor film with laser light.

55. A method according to claim 23, wherein the step of crystallizing the amorphous semiconductor film includes: introducing the amorphous semiconductor film with an element selected from the group consisting of nickel (Ni), iron (Fe), palladium (Pd), tin (Sn), lead (Pb), cobalt (Co), platinum (Pt), copper (Cu), and gold (Au) as a catalytic element for promoting crystallization; heating the amorphous semiconductor film; and irradiating the crystallized semiconductor film with laser light.

56. A method according to claim 24, wherein the step of crystallizing the amorphous semiconductor film includes: introducing the amorphous semiconductor film with an element selected from the group consisting of nickel (Ni), iron (Fe), palladium (Pd), tin (Sn), lead (Pb), cobalt (Co), platinum (Pt), copper (Cu), and gold (Au) as a catalytic element for promoting crystallization; heating the amorphous semiconductor film; and irradiating the crystallized semiconductor film with laser light.

57. A method according to claim 19, wherein said semiconductor device is a liquid crystal display device.

58. A method according to claim 20, wherein said semiconductor device is a liquid crystal display device.

59. A method according to claim 21, wherein said semiconductor device is a liquid crystal display device.

60. A method according to claim 22, wherein said semiconductor device is a liquid crystal display device.

61. A method according to claim 23, wherein said semiconductor device is a liquid crystal display device.

62. A method according to claim 24, wherein said semiconductor device is a liquid crystal display device.

63. A method according to claim 19, wherein said semiconductor device is one selected from the group consisting of a personal computer, a video camera, a mobile computer, a goggle type display, a digital camera, a projector, a mobile telephone, and a portable electronic book.

64. A method according to claim 20, wherein said semiconductor device is one selected from the group consisting of a personal computer, a video camera, a mobile computer, a goggle type display, a digital camera, a projector, a mobile telephone, and a portable electronic book.

65. A method according to claim 21, wherein said semiconductor device is one selected from the group consisting of a personal computer, a video camera, a mobile computer, a goggle type display, a digital camera, a projector, a mobile telephone, and a portable electronic book.

66. A method according to claim 22, wherein said semiconductor device is one selected from the group consisting of a personal computer, a video camera, a mobile computer, a goggle type display, a digital camera, a projector, a mobile telephone, and a portable electronic book.

67. A method according to claim 23, wherein said semiconductor device is one selected from the group consisting of a personal computer, a video camera, a mobile computer, a goggle type display, a digital camera, a projector, a mobile telephone, and a portable electronic book.

68. A method according to claim 24, wherein said semiconductor device is one selected from the group consisting of a personal computer, a video camera, a mobile computer, a goggle type display, a digital camera, a projector, a mobile telephone, and a portable electronic book.

* * * * *